(12) United States Patent
Miyamoto et al.

(10) Patent No.: US 6,720,591 B2
(45) Date of Patent: Apr. 13, 2004

(54) SEMICONDUCTOR INTEGRATED CIRCUIT DEVICE

(75) Inventors: Toshio Miyamoto, Kokubunji (JP); Ichiro Anjo, Koganei (JP); Asao Nishimura, Koganei (JP); Yoshihide Yamaguchi, Fujisawa (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/127,583

(22) Filed: Apr. 23, 2002

(65) Prior Publication Data

US 2002/0153539 A1 Oct. 24, 2002

(30) Foreign Application Priority Data

Apr. 23, 2001 (JP) ........................................ 2001-124475

(51) Int. Cl.[7] .......................... H01L 27/10; H01L 29/73; H01L 27/108; H01L 29/76; H01L 29/94; H01L 31/119; H01L 23/48; H01L 23/52; H01L 29/40

(52) U.S. Cl. ........................ 257/209; 257/296; 257/529; 257/665; 257/700; 257/701; 257/702; 257/737; 257/758; 257/759; 257/760; 257/765; 257/762

(58) Field of Search ................................. 257/202, 203, 257/209, 208, 206, 288, 296, 528, 529, 530, 532, 665, 690, 693, 700, 701, 702, 737, 738, 758, 759, 760, 765, 762

(56) References Cited

U.S. PATENT DOCUMENTS 6,372,554 B1 * 4/2002 Kawakita et al. ............ 438/132
6,542,414 B2 * 4/2003 Hiraki et al. .............. 365/189.05
6,548,847 B2 * 4/2003 Sugiura et al. .............. 257/296
2002/0060933 A1 * 5/2002 Matsuzaki et al. ........... 365/200

FOREIGN PATENT DOCUMENTS

| JP | 2000-091339 | 3/2000 |
|---|---|---|
| JP | 2000-138245 | 5/2000 |
| JP | 2000-216253 | 8/2000 |
| WO | WO99/23696 | 5/1999 |

OTHER PUBLICATIONS

Electronics Packaging Technology 2000 Special Number issued by Gijyutsu–chosakai Corporation, issued on May 28, 2000, pp.81–113 (cited in the specification), English translation.

* cited by examiner

Primary Examiner—Nathan J. Flynn
Assistant Examiner—Victor A. Mandala, Jr.
(74) Attorney, Agent, or Firm—Antonelli, Terry, Stout & Kraus, LLP

(57) ABSTRACT

Disclosed is a technique capable of enhancing the degree of freedom in the layout of a rerouting layer in a wafer level CSP in which defect repairing is performed by cutting a fuse. More specifically, after the defect repairing is performed by irradiating a laser beam to a fuse, an organic passivation layer (photo-sensitive polyimide layer) is filled in a fuse opening. Thereafter, a rerouting layer, a bump land, an uppermost wiring layer, and a solder bump are formed on the organic passivation layer. In the following steps of the defect repairing, the baking process to cure an elastomer layer and the uppermost protection layer is conducted at a temperature below 260° C. in order to prevent the variance of the refresh times of memory cells.

19 Claims, 56 Drawing Sheets

FIG.10
MEMORY ARRAY      FUSE AREA
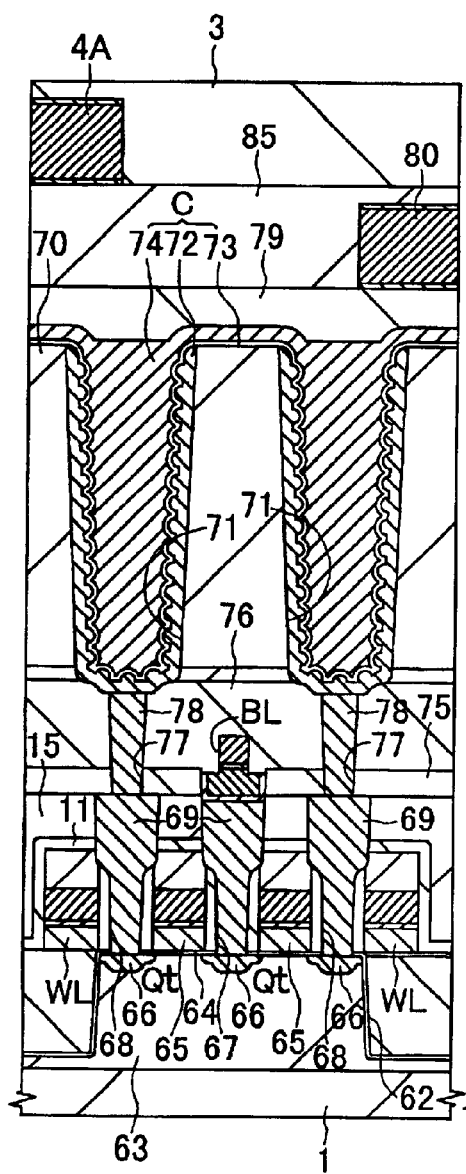
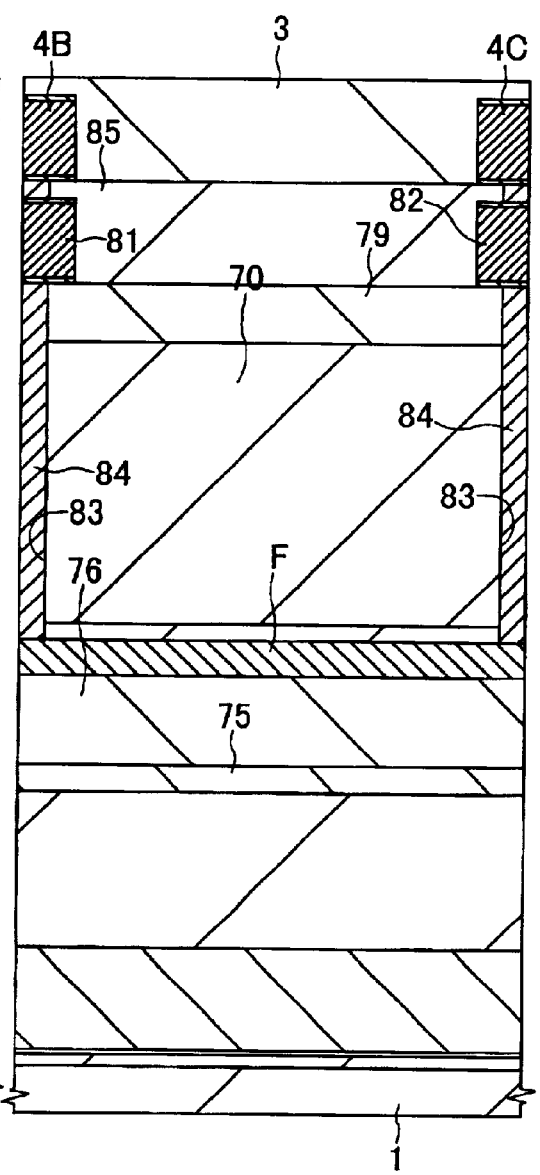

FIG.17
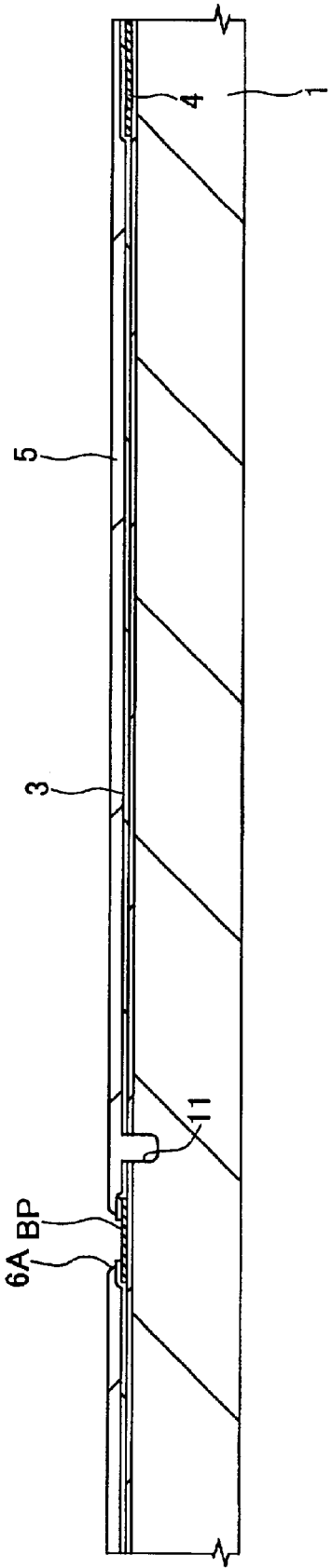
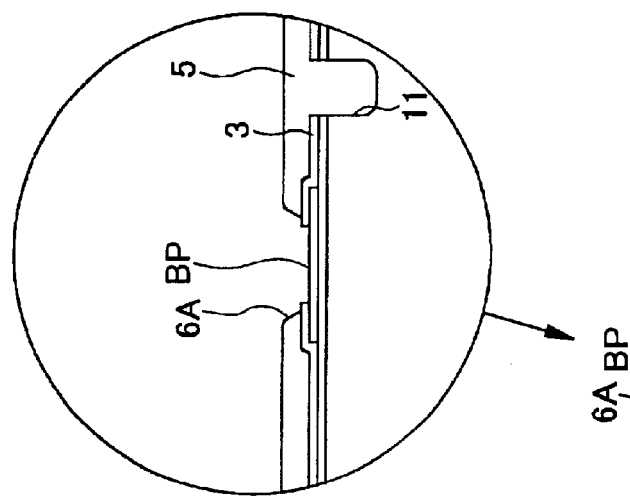

FIG.39
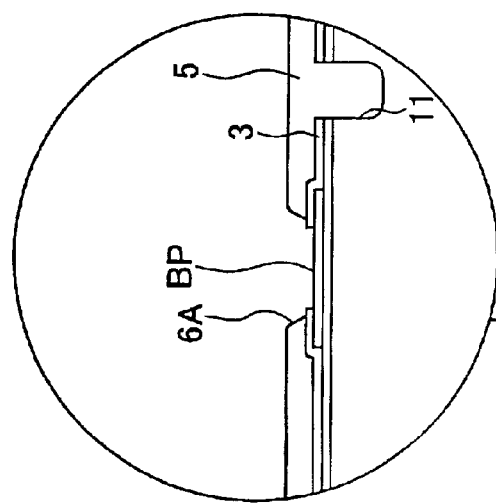
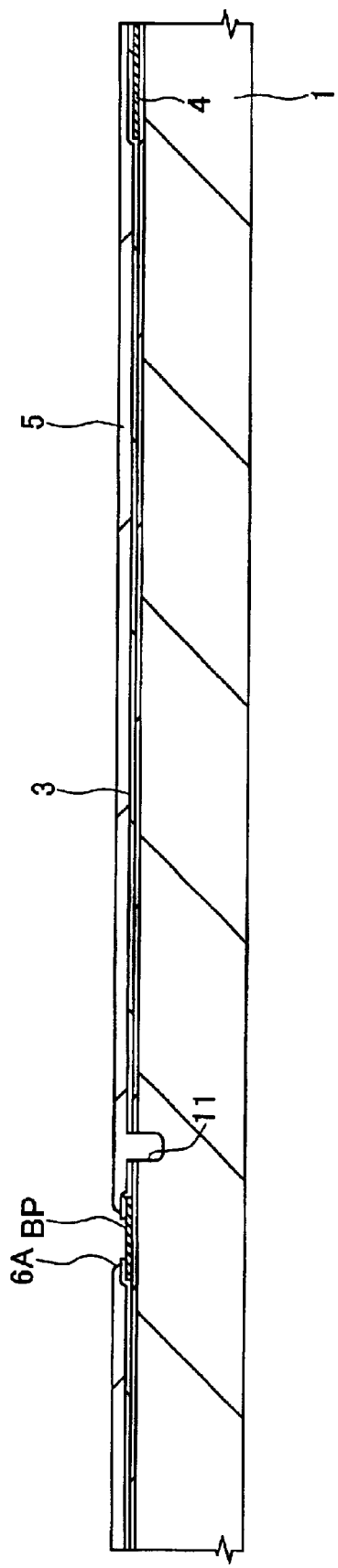

FUSE AREA

FUSE AREA

SEMICONDUCTOR INTEGRATED CIRCUIT DEVICE

TECHNICAL FIELD OF THE INVENTION

The present invention relates to a semiconductor integrated circuit device and a method of manufacturing the same. More specifically, the present invention relates to a technique effectively applied to a CSP (chip size package) formed by applying a wafer process, i.e., a so-called wafer level CSP (WL-CSP) or a wafer process package, which is a scheme in which a packaging step is completed in a wafer state.

BACKGROUND OF THE INVENTION

A scheme in which a packaging process (post-process) and a wafer process (pre-process) are integrated to each other to complete a packaging step in a wafer state, i.e., a technique so-called a wafer level CSP, has the following advantage. That is, since a packaging process is performed by applying a wafer process, the number of steps can be made considerably smaller than that of a conventional method in which a packaging process (post-process) is performed to each chip cut from a wafer. The wafer level CSP is also called a wafer process package (WPP).

In the wafer level CSP, a wiring layer in the CSP called an interposer for converting the pitch of bonding pads into the pitch of solder bumps can be replaced with rerouting layers formed on a wafer. For this reason, the wafer level CSP is expected to achieve the reduction in number of steps and the reduction in manufacturing cost of a CSP.

The wafer level CSP is described in, e.g., "Electronic Packaging Technology 2000 Special Number" issued by Gijyutsu-chyosa-kai Corporation (issued on May 28, 2000) pp. 81 to 113, International Patent Publication No. WO99/23696, Japanese Patent Laid-Open Publication No. 2000-91339, Japanese Patent Laid-Open Publication No. 2000-138245, Japanese Patent Laid-Open Publication No. 2000-216253, and the like.

SUMMARY OF THE INVENTION

In the conventional method in which the packaging process (post-process) is performed to each chip cut from a wafer, a memory LSI such as DRAM (Dynamic Random Access Memory) has a redundancy function for repairing the defect area created in the wafer manufacturing process, which makes it possible to improve the production yield.

This is a defect repairing function to prevent the defect from spreading over the entire chip even if a defect occurs in a part of a circuit. Such defect repairing is performed in such a manner that rows and columns of spares (redundant circuit) are prepared in advance in a part of a circuit, and when an address signal enters the defective cell (defect bit) in the memory array, the rows and columns of spares are selected.

The replacement of the defect parts with the spare parts is made by cutting a fuse connected to an address switching circuit. In the cutting of the fuse, a current fusion cutting or a laser fusion cutting is generally used. Of the two, the laser fusion cutting is mainly employed because of the high degree of freedom in replacement program and advantages in area efficiency.

The fuse for repairing the defect is constituted of electrode wiring materials such as metal and polycrystalline silicon and is formed simultaneously in a step of forming a semiconductor element or a wiring (wafer process) on a wafer main surface. When the probe test performed in the final step of the wafer process detects the defect cell, the above-mentioned fuse is cut by means of laser to allocate the address corresponding to the defect cell to the redundant cell.

In ordinary cases, on the wafer surface, a surface protection layer termed as a passivation layer is formed on a metal wiring of the uppermost layer, and a resin layer such as polyimide is formed thereon. The passivation layer serves as a protection layer to prevent moisture from penetrating into a circuit from the wafer surface and is constituted of a fine inorganic dielectric layer such as a silicon oxide layer and a silicon nitride layer deposited by, for example, the plasma CVD method. In addition, the resin layer is formed with an aim to prevent the soft error due to the α-ray, to prevent the damages to the chip surface due to the silicon filler in a resin (molding resin) for sealing the chip, and to relax the stress applied to the interface between the passivation layer and the molding resin.

The above-mentioned passivation layer and the resin layer are thickly formed with a thickness of micrometer ($\mu$m) order. Therefore, for the defect repairing by cutting the fuse, the removal of the passivation layer and the resin layer on the fuse is required in advance of the probe test. Also, in the case where the fuse is formed of the relatively lower conductive layer, the interlayer dielectric layer lower than the passivation layer must be etched to reduce the thickness thereof.

For example, the process for removing the dielectric layer on the fuse proceeds as follows. First, a semiconductor element is formed on a main surface of a wafer, and subsequently, multiple layers of metal wirings are formed thereon. In this process, the fuse is formed in any one of a series of steps from forming the semiconductor element to forming the uppermost metal wiring.

Next, for the control of the thickness of the dielectric layer on the fuse to about 1 $\mu$m, an opening is formed in the dielectric layer on the fuse by the dry etching with using a photo-resist layer as a mask, and thereafter, a passivation layer is formed on the uppermost metal wiring and in the bottom of the opening, and then, a polyimide layer is formed on the passivation layer. The passivation layer is formed by depositing a silicon nitride layer and a silicon oxide layer by the plasma CVD method at a temperature of 400° C. to 500° C. The polyimide layer is formed by the spin coating method. Thereafter, the baking process at a temperature of about 350° C. is performed to cure the layer.

Subsequently, a photo-resist layer is formed on the polyimide layer, and the resin layer on the fuse is removed by the wet etching with using the photo-resist layer as a mask, thereby exposing the passivation layer. And simultaneously, a polyimide layer in the area used to form a bonding pad serving as an external connection terminal of a chip is removed to expose the passivation layer.

Next, after removing the photo-resist layer, the passivation layer on the fuse (the area in which the opening is formed in the dielectric layer) is removed by the dry etching with using the polyimide layer as a mask. And simultaneously, the passivation layer in the area used to form the bonding pad is removed to form the bonding pad.

Then, when the probe test performed in the final step of the wafer process detects the defect cell, the defect repairing is performed in such a manner that laser is irradiated to a predetermined fuse through the opening formed in the upper dielectric layer on the fuse in order to cut the fuse.

However, the inventors of the present invention have found out that when the defect repairing process as described above is applied to the conventional manufacturing process of the wafer level CSP, the following problems inevitably occur.

More specifically, in the case of the wafer level CSP, a rerouting layer is formed on the polyimide layer covering the wafer surface and a bump electrode serving as an external connection terminal is connected to one end of the rerouting layer after performing the probe test and the defect repairing. Therefore, the metal layer gets into the opening on the fuse during a step of forming the metal layer for the rerouting layer on the polyimide layer. Accordingly, a step of removing the metal layer in the opening by the use of etching solution is required in order to prevent the short circuit of the fuse cut by the laser via the metal layer. However, the corrosion of the fuse is caused if the etching solution is left in the opening.

Furthermore, in the manufacturing process of the wafer level CSP including the defect repairing process, openings for laser irradiation is left in the polyimide layer on the fuse. Therefore, when forming the rerouting layer on the polyimide layer, the rerouting layer must be arranged so as to avoid the openings. Consequently, the degree of freedom in the layout of the rerouting layer is reduced.

Also, in the conventional manufacturing process of the wafer level CSP, after the probe test and the defect repairing, steps of forming a rerouting layer on the polyimide layer and forming an uppermost protection layer made of polyimide layer on the rerouting layer are additionally performed. Therefore, if a heat treatment at a high temperature is performed during these steps, the characteristic of the memory cell is changed and the problem as that refresh times in each of the memory cells vary from each other occurs. As a result, even the chip determined to be good in the probe test may become defective.

An object of the present invention is to provide a technique capable of enhancing the degree of freedom in the layout of the rerouting layer in the wafer level CSP in which the defect repairing is performed by cutting a fuse.

Another object of the present invention is to provide a technique effectively preventing the corrosion of the fuse in the wafer level CSP in which the defect repairing is performed by cutting a fuse.

Another object of the present invention is to provide a technique capable of increasing the reliability of the wafer level CSP in which the defect repairing is performed by cutting a fuse.

The above and other objects and novel characteristic of the present invention will be apparent from the descriptions and accompanying drawings of this specification.

The typical aspects of the inventions disclosed in this application will be briefly described as follows.

The wafer level CSP in this invention includes: a plurality of memory cells formed on a main surface of a semiconductor chip; a plurality of fuses formed on the main surface of the semiconductor chip; a plurality of multi-layered first wirings formed in an upper layer of the plurality of memory cells; a plurality of internal connection terminals formed of the wiring in the same layer as the uppermost wiring of the plurality of first wirings; a passivation layer formed so as to cover the plurality of first wirings and the plurality of fuses and selectively exposing the plurality of internal connection terminals; a plurality of second wirings formed over the passivation layer, each having one end electrically connected to the internal connection terminal; an uppermost protection layer formed so as to cover the plurality of second wirings and selectively exposing the other ends of the plurality of second wirings; and a plurality of external connection terminals formed on the other ends of the plurality of second wirings, wherein at least a part of the plurality of second wirings are arranged over at least a part of the plurality of fuses.

A method of manufacturing the wafer level CSP in the present invention includes the steps of:

(a) forming a plurality of memory cells in a plurality of chip areas on a main surface of a wafer, forming a plurality of multi-layered first wirings in an upper layer of the plurality of memory cells, and forming a plurality of fuses in the plurality of chip areas during the step of forming the plurality of memory cells or the step of forming the plurality of first wirings;

(b) forming a passivation layer over the plurality of first wirings and the plurality of fuses, then removing parts of the passivation layers to expose the wiring in the same layer as the uppermost wiring of the plurality of first wirings, thereby forming a plurality of internal connection terminals;

(c) removing other parts of the passivation layers, thereby forming fuse openings over each of the plurality of fuses;

(d) after the step (b), conducting a probe test to detect the presence of defect cells, and irradiating laser to the fuse through a predetermined fuse opening of the plurality of fuse openings, thereby cutting the fuses by fusion when the probe test detects defect cells;

(e) after the step (d), forming an elastomer layer on the passivation layer, said passivation layer being formed also in the plurality of fuse openings;

(f) performing a heat treatment to the elastomer layer, thereby curing the elastomer layer;

(g) forming a plurality of second wirings having one ends electrically connected to the internal connection terminals over the elastomer layer, then forming an uppermost protection layer on the plurality of second wirings, and removing a part of the uppermost protection layer, thereby selectively exposing the other ends of the plurality of second wirings;

(h) performing a heat treatment to the uppermost protection layer, thereby curing the uppermost protection layer; and (i) forming a plurality of external connection terminals at the other ends of the plurality of second wirings, then cutting the semiconductor wafer into chip areas, thereby obtaining semiconductor chips, wherein the temperature of each of the heat treatments in the steps (f) and (h) is set so as not to change the predetermined characteristics of the plurality of memory cells.

A method of manufacturing the wafer level CSP in the present invention includes the steps of:

(a) forming a plurality of memory cells in a plurality of chip areas on a main surface of a wafer, forming a plurality of multi-layered first wirings in an upper layer of the plurality of memory cells, and forming a plurality of fuses in the plurality of chip areas during the step of forming the plurality of memory cells or the step of forming the plurality of first wirings;

(b) forming a passivation layer over the plurality of first wirings and the plurality of fuses, then removing parts of the passivation layers to expose the wiring in the same layer as the uppermost wiring of the plurality of first wirings, thereby forming a plurality of internal connection terminals;

(c) removing other parts of the passivation layers, thereby forming fuse openings over each of the plurality of fuses;

(d) after the step (b), conducting a probe test to detect the presence of defect cells, and irradiating laser to the fuse through a predetermined fuse opening of the plurality of fuse openings, thereby cutting the fuses by fusion when the probe test detects defect cells;

(e) forming a plurality of second wirings having one ends electrically connected to the internal connection terminals over the passivation layer, then forming an uppermost protection layer on the plurality of second wirings, and removing a part of the uppermost protection layer, thereby selectively exposing the other ends of the plurality of second wirings;

(f) performing a heat treatment to the uppermost protection layer, thereby curing the uppermost protection layer; and (g) forming a plurality of external connection terminals at the other ends of the plurality of second wirings, then cutting the semiconductor wafer into chip areas, thereby obtaining semiconductor chips, wherein the temperature of the heat treatment in the step (f) is set so as not to change the predetermined characteristics of the plurality of memory cells.

BRIEF DESCRIPTIONS OF THE DRAWINGS

FIG. 10 is a cross-sectional view showing the principal part of a semiconductor wafer in a manufacturing method of a semiconductor integrated circuit device according to an embodiment of the present invention;

FIG. 17 is a cross-sectional view showing the principal part of a semiconductor wafer in a manufacturing method of a semiconductor integrated circuit device according to an embodiment of the present invention;

FIG. 39 is a cross-sectional view showing the principal part of a semiconductor wafer in a manufacturing method of a semiconductor integrated circuit device according to another embodiment of the present invention;

Figure 55:
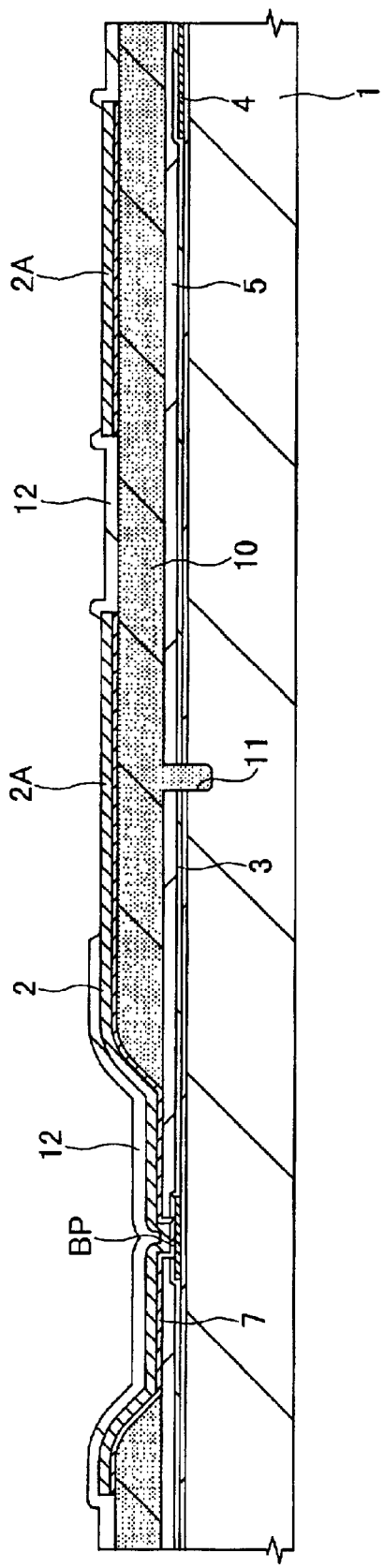
Figure 56:
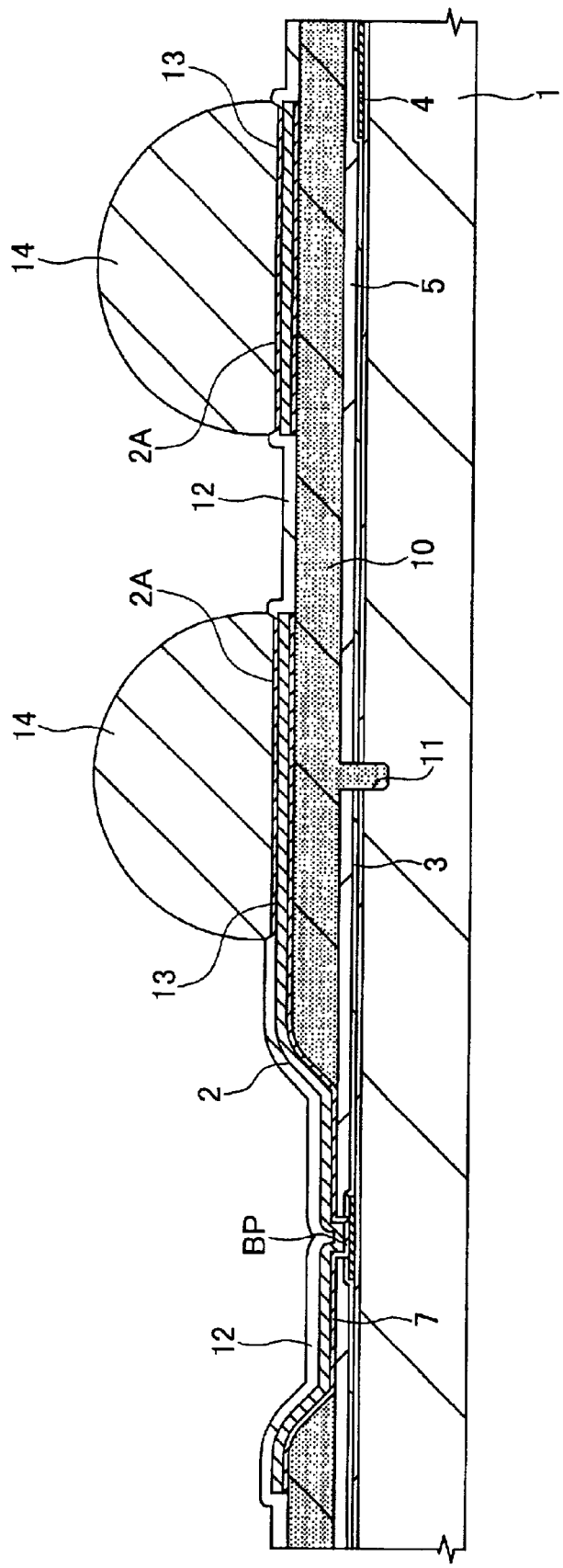

FIG. 55 is a cross-sectional view showing the principal part of a semiconductor wafer in a manufacturing method of a semiconductor integrated circuit device according to another embodiment of the present invention; and FIG. 56 is a cross-sectional view showing the principal part of a semiconductor wafer in a manufacturing method of a semiconductor integrated circuit device according to another embodiment of the present invention.

DESCRIPTIONS OF THE PREFFERRED EMBODIMENTS

Embodiments of the present invention will be described below with reference to the accompanying drawings. The same reference numerals as in all the drawings denote components having the same functions in the drawings, and a description thereof will be omitted in principle.

A bonding pad in the following embodiments is to indicate an internal connection terminal in the claims.

Also, a rerouting layer in the following embodiments is to indicate a second wiring formed on an organic passivation layer or on an elastomer layer in the claims.

Also, a solder bump in the following embodiments is to indicate an external connection terminal in the claims.

(First Embodiment)

Figure 1:
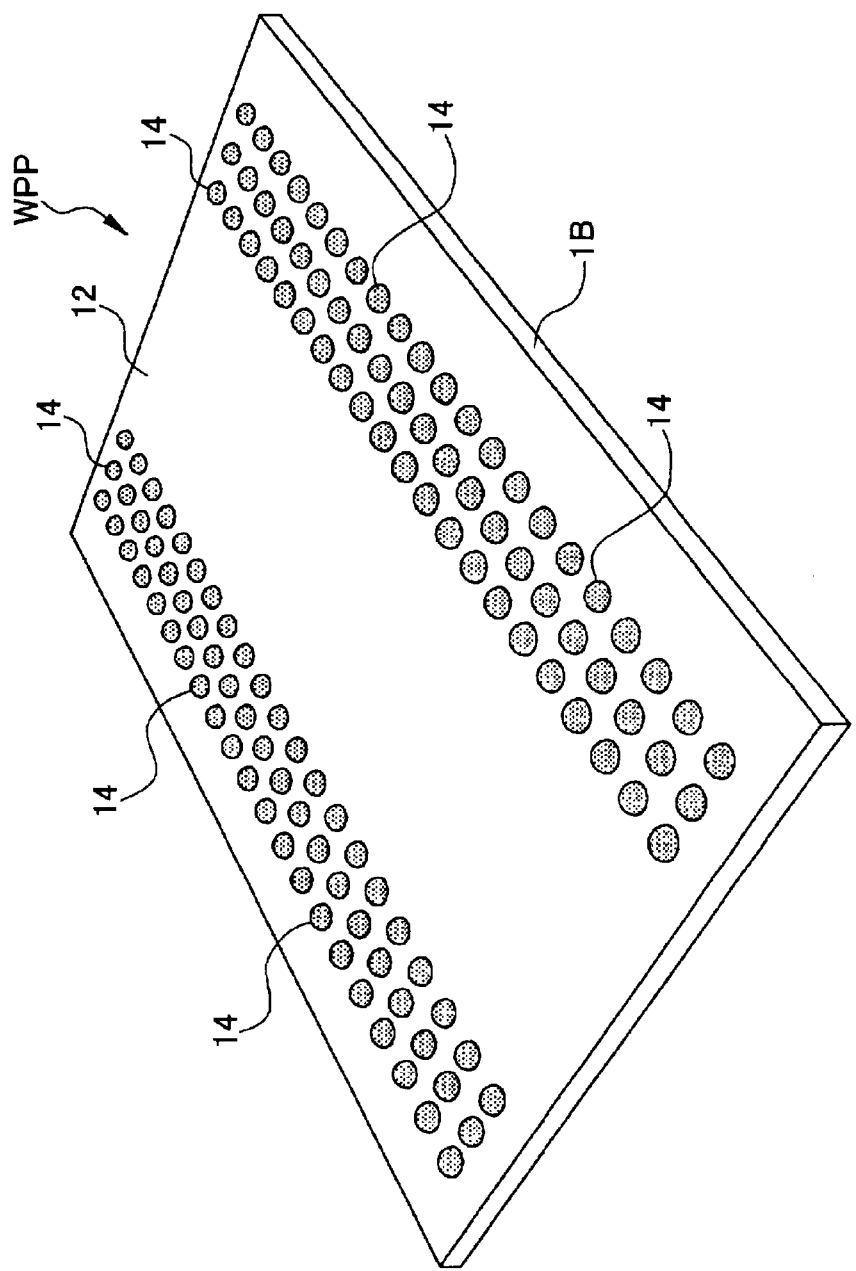
FIG. 1 is a perspective view showing an outer appearance of a semiconductor integrated circuit device according to an embodiment of the present invention.
Figure 2:
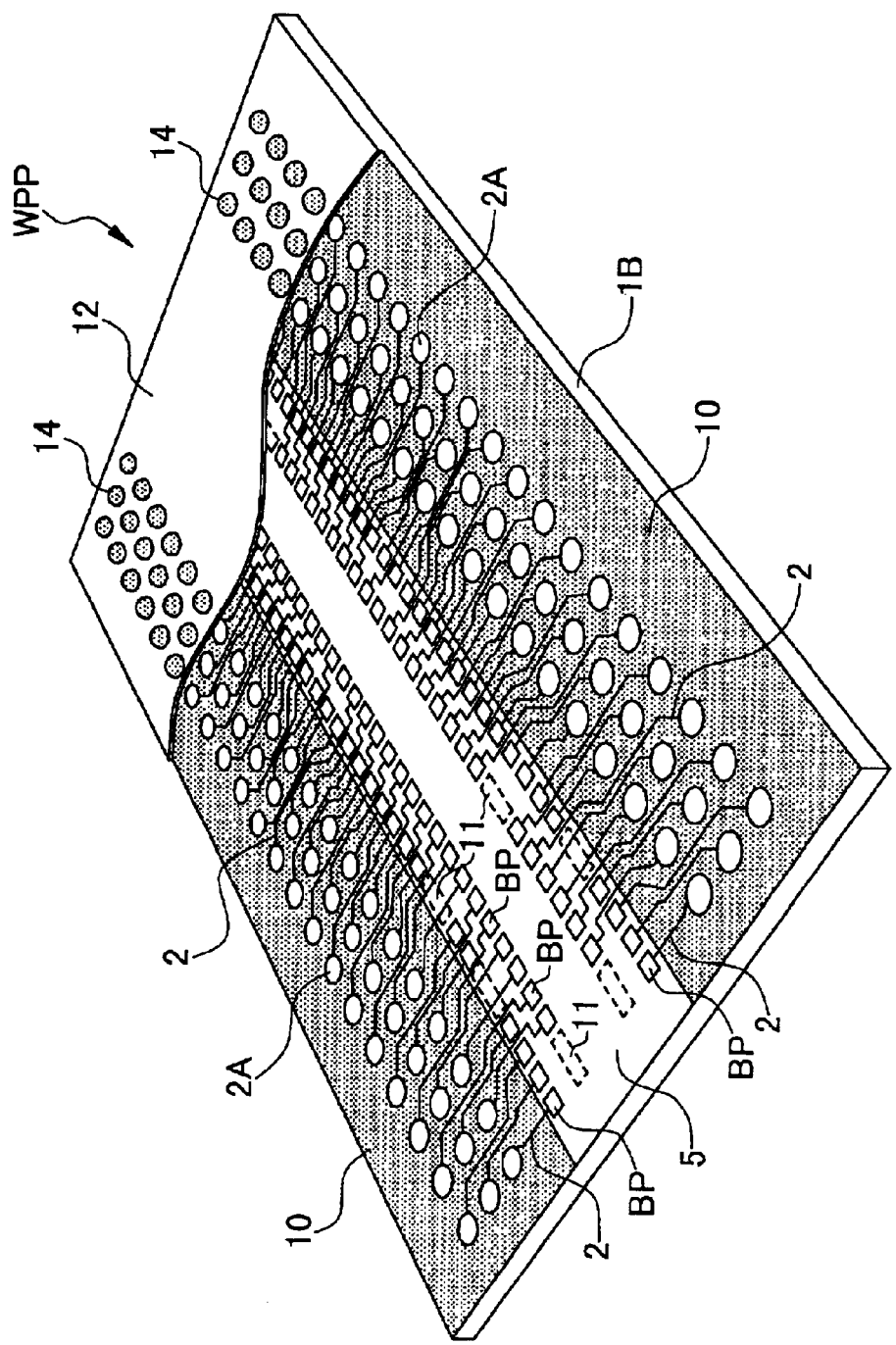
FIG. 2 is a perspective view showing layout of rerouting layers and bonding pads of a semiconductor integrated circuit device according to an embodiment of the present invention.
Figure 3:
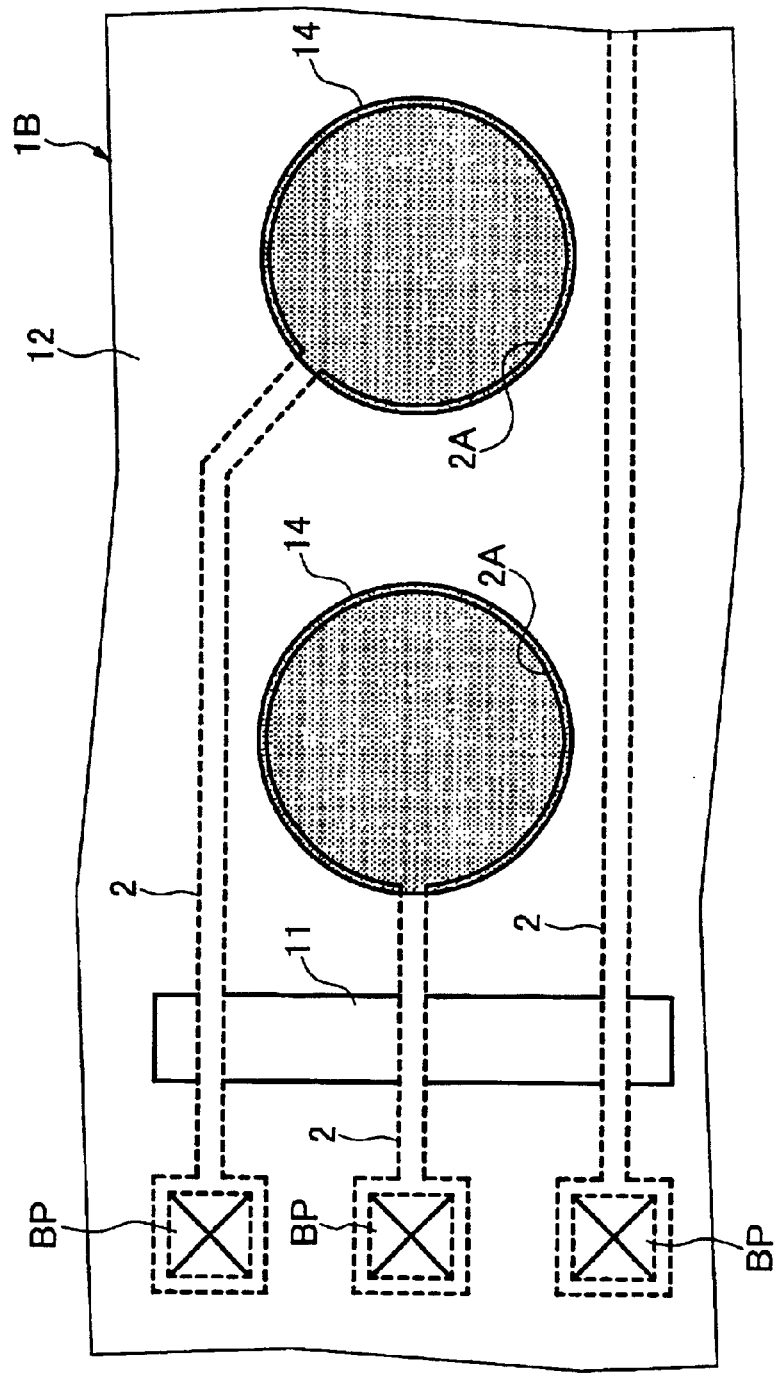
FIG. 3 is an enlarged plan view showing the principal part of FIG. 1.
Figure 4:
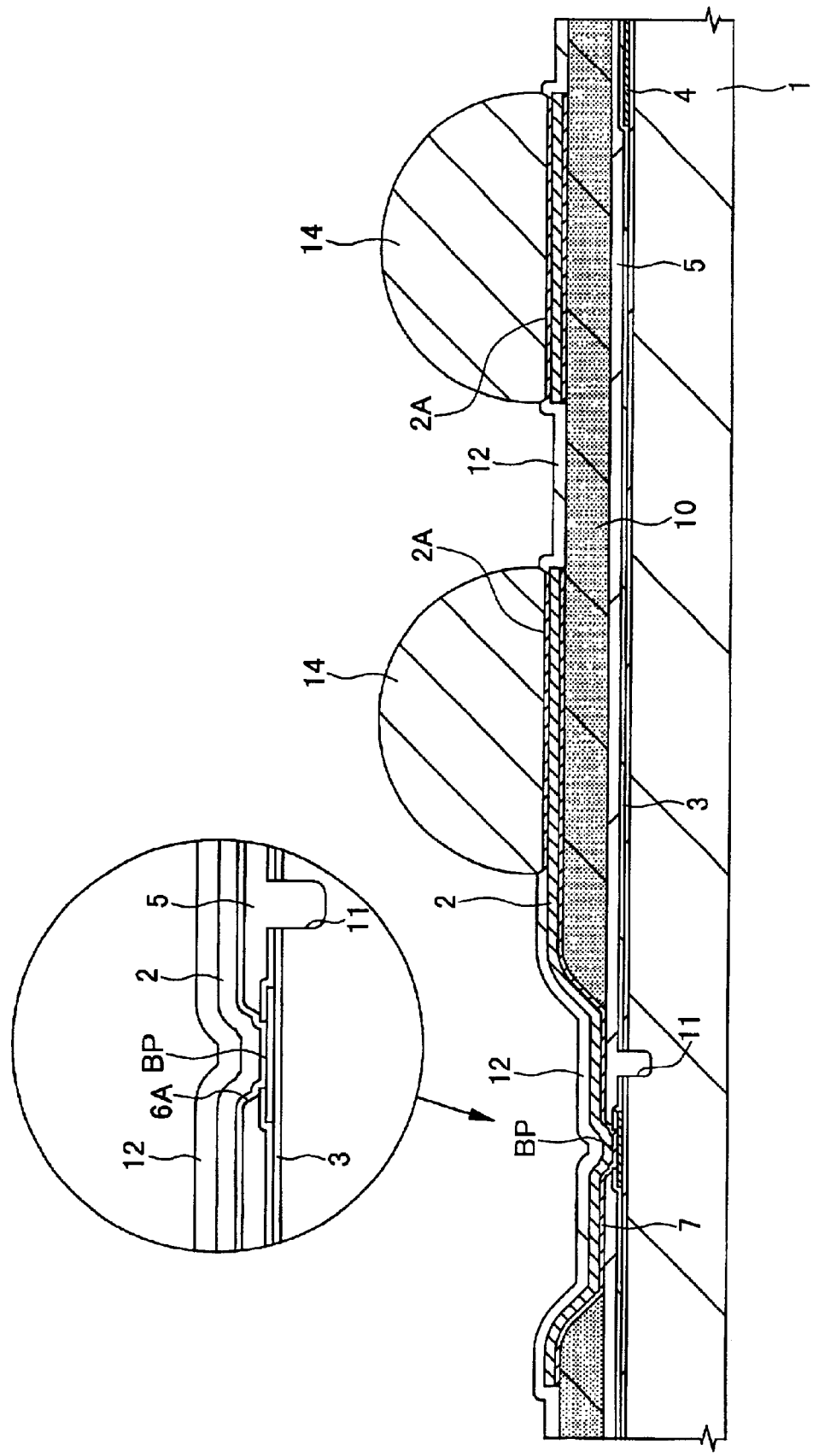
FIG. 4 is a cross-sectional view showing the principal part of FIG. 1.

FIG. 1 is a perspective view of a CSP formed by applying a wafer process, which serves as a semiconductor integrated circuit device according to the first embodiment. More specifically, FIG. 1 shows a finished state of a so-called wafer level CSP (hereinafter, referred to as WL-CSP), which is a scheme in which a packaging step is completed in a wafer state. FIG. 2 is a perspective view of rerouting wires (rerouting layers) and bonding pads of the WL-CSP. FIG. 3 is an enlarged plan view showing the principal part of the WL-CSP. FIG. 4 is an enlarged cross-sectional view showing the principal part of the WL-CSP.

The WL-CSP according to the first embodiment shown in FIGS. 1 to 4 has a plurality of solder bumps 14 formed on a main surface of a semiconductor chip (hereinafter, referred to as chip) 1B made of single crystal silicon having dimensions of a long side of 8.7 mm, a short side of 5.7 mm, and a thickness of 725 µm. A DRAM (Dynamic Random Access Memory) mentioned below is formed on the main surface of the chip 1B.

Four rows of a plurality of bonding pads BP constituted of a part of an uppermost wiring 4 are arranged along the longitudinal direction of the chip 1B in the central portion of the main surface of the chip 1B. The upper side of the uppermost wiring 4 is covered with a surface protection layer (inorganic passivation layer) 3 except for the upper sides of the bonding pads BP. On the upper side of the surface protection layer 3, rerouting layers 2 are formed via a photo-sensitive polyimide layer (organic passivation) 5 and an elastomer layer 10 formed thereon. The upper side of the rerouting layers 2 is covered with an uppermost protection layer 12 except for bump lands 2A serving as one ends of the rerouting layers 2. Solder bumps 14 constituting external connection terminals of the WL-CSP are formed on the bump land 2A. As shown in FIG. 4, the other ends of the rerouting layers 2 are electrically connected to the bonding pads BP through openings 6A formed in the photo-sensitive polyimide layer 5.

The reference numerals 11 in FIGS. 2 to 4 denote fuse openings. A fuse F (not shown) is formed in a layer below the fuse openings 11. As described later, when defect cells are found by the probe test conducted in the final step of the wafer process, laser is irradiated to the fuse F through the fuse opening 11 to cut the fuse F by fusion, whereby the defect repairing is performed in which the address corresponding to the defect cell is allocated to a redundant cell. The plurality of fuse openings 11 are arranged on the main surface of the chip 1B and a part of them are arranged below the rerouting layers 2 or the bump lands 2A.

Figure 5:
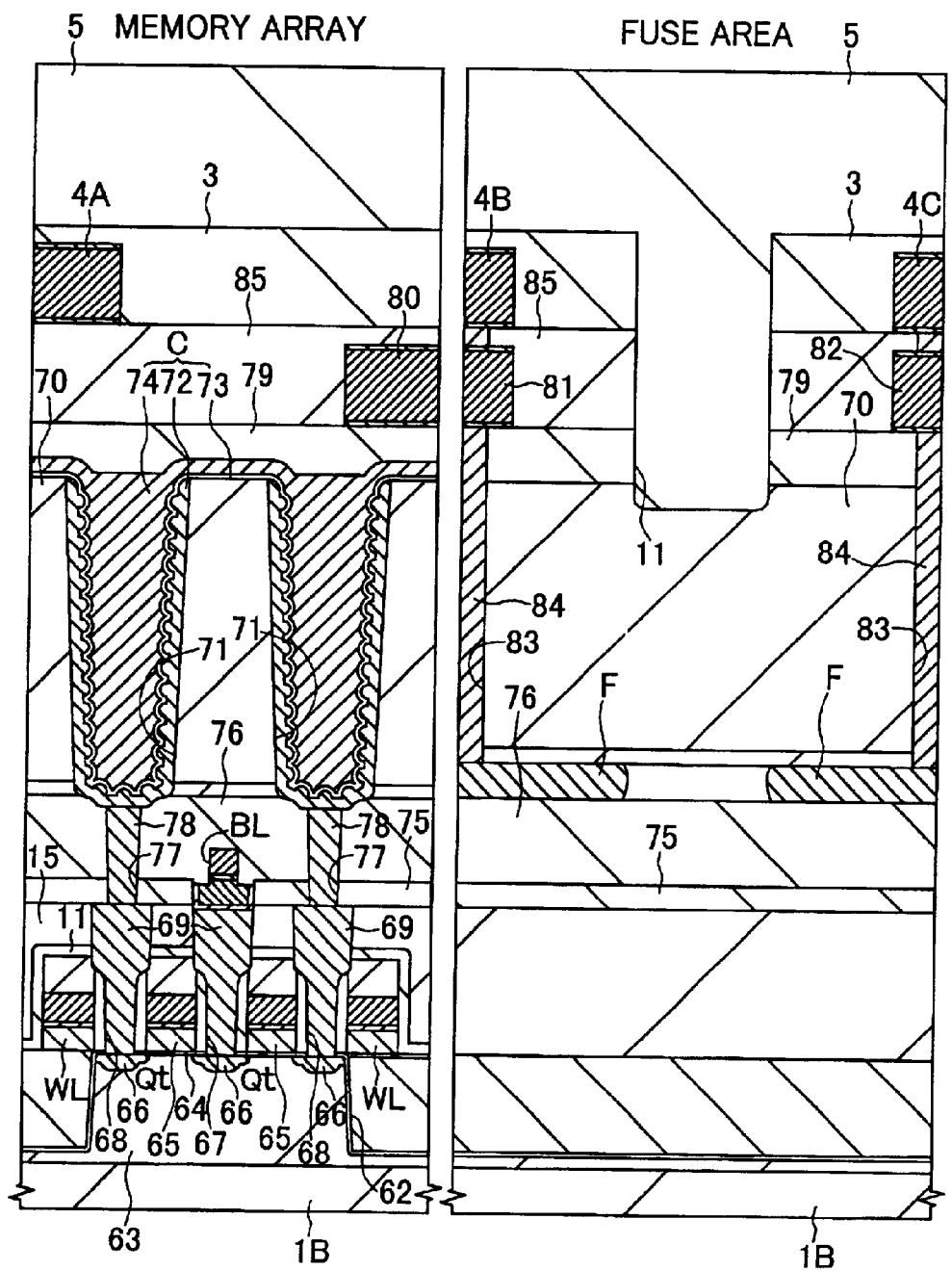
FIG. 5 is a cross-sectional view showing the principal part of a semiconductor integrated circuit device according to an embodiment of the present invention.

FIG. 5 is a cross-sectional view showing the principal part of the chip 1B. The left side thereof shows an area in which a memory cell is formed (memory array) and the right side thereof shows an area in which a fuse is formed (fuse area). Note that upper portions (elastomer layer 10, rerouting layer 2, bump land 2A, uppermost protection layer 12, and the like) of the photo-sensitive polyimide layer 5 are omitted in FIG. 5.

An element isolation trench 62 and a p well 63 are formed on the main surface of the chip 1B. A plurality of memory cells composed of an n type MISFET (Metal Insulator Semiconductor Field Effect Transistor) Qt for selecting memory cell and capacitor element C for data storage formed thereon are formed on the p well 63 in the memory array.

The MISFET Qt for selecting memory cell mainly comprises a gate dielectric layer 64, a gate electrode 65 (word line WL), and a pair of n type semiconductor areas (source and drain) 66 and 66. The gate electrode 65 (word line WL) is constituted of, for example, a conductive layer having a so-called polymetal structure in which $WN_x$ (tungsten nitride) layer and W layer are laminated on an n type polycrystalline silicon layer doped with P (phosphorus). Contact holes 67 and 68 are formed on the pair of n type semiconductor areas 66 and 66 constituting the source and drain of the MISFET Qt for selecting memory cell. In these contact holes 67 and 68, plugs 69 made of an n type polycrystalline silicon layer doped with, for example, P (phosphorus) are buried.

The bit line BL for reading out data of the memory cell is formed on the MISFET Qt for selecting memory cell. The bit line BL is electrically connected to one of the source and drain (n type semiconductor area 66) of the MISFET Qt for selecting memory cell via the plug 69 below the bit line BL. The bit line BL is constituted of, for example, a conductive layer made by laminating the W layer on the $WN_x$ layer.

The capacitor element C for data storage is formed on the bit line BL. The capacitor element C for data storage is formed in a trench 71 being formed in a thick silicon oxide layer 70 on the bit line BL and is constituted of, for example, a lower electrode 72 made of n type polycrystalline silicon layer doped with P (phosphorus), a high dielectricity layer 73 made of a $Ta_2O_5$ (tantalum oxide) layer, and an upper electrode 74 made of TiN (titanium nitride) layer. The lower electrode 72 of the capacitor element C for data storage is electrically connected to the other of the source and drain (n type semiconductor area 66) of the MISFET Qt for selecting memory cell via a plug 78 in a through hole 77 formed in silicon oxide layers 75 and 76 below the lower electrode 72 and via the plug 69 below the plug 78.

The fuse F is formed on the silicon oxide 76 in the fuse area. The fuse F is constituted of, for example, an n type polycrystalline silicon layer doped with P (phosphorus). Note that the fuse F shown in FIG. 5 is in a state of being cut by laser.

A silicon oxide layer 79 is formed on the capacitor element C for data storage, and first aluminum wirings 80 to 82 are formed thereon. The first aluminum wirings 81 and 82 in the fuse area are electrically connected to the fuse F via a plug 84 buried in a through hole 83 below them.

A silicon oxide layer 85 is formed on the first aluminum wirings 80 to 82, and uppermost wirings 4 (4A to 4C) are formed thereon. Similarly to the first aluminum wirings 80 to 82, the uppermost wirings 4A to 4C are constituted of Al alloy. The surface protection layer 3 is formed on the uppermost wiring 4. The surface protection layer 3 is made of, for example, a silicon nitride layer deposited by the plasma CVD (Chemical Vapor Deposition) method. The photo-sensitive polyimide layer 5 is formed on the surface protection layer 3. The fuse opening 11 is formed in each of the surface protection layer 3, silicon oxide layers 85, 79, and 70 in the fuse area.

As shown in FIG. 4, the elastomer layer 10 is formed on the photo-sensitive polyimide layer 5. Also, the rerouting layer 2 and the bump land 2A are formed on the elastomer layer 10. Further, the uppermost protection layer 12 is formed on the rerouting layer 2, and the solder bump 14 is connected to the bump land 2A.

Figure 6:
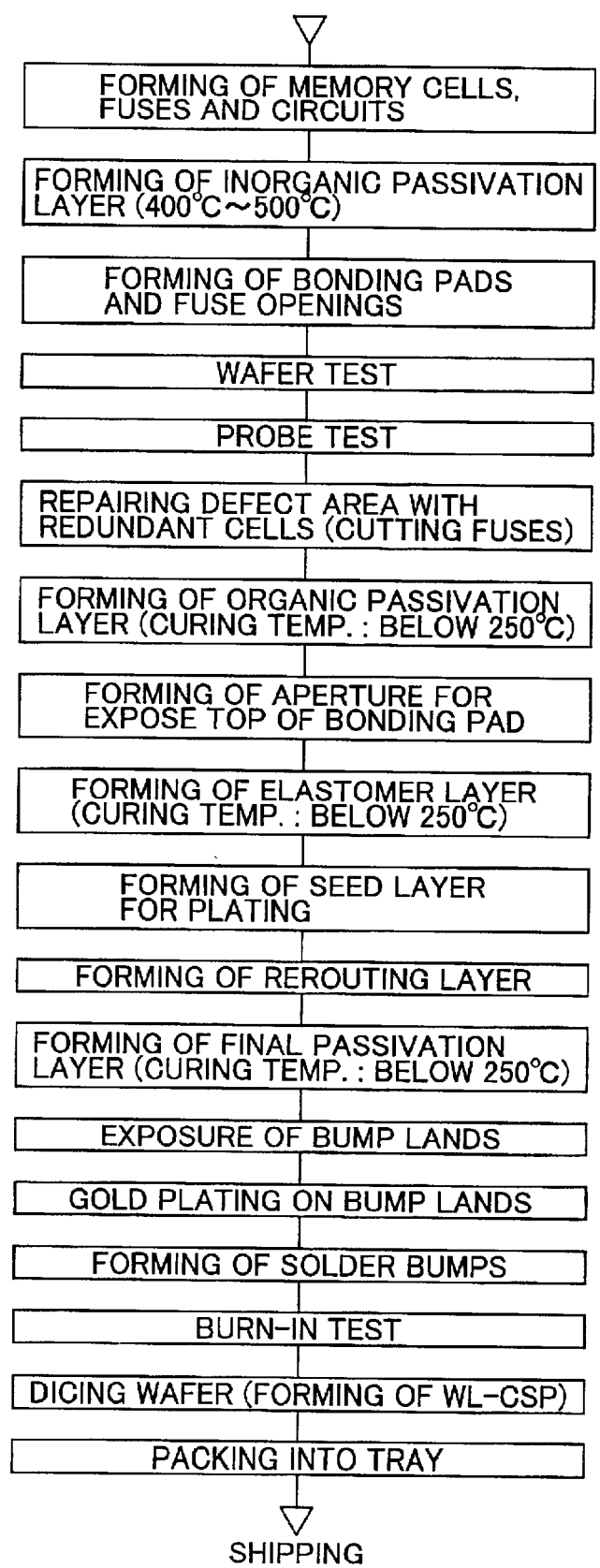
FIG. 6 is a flow chart showing the process flow of manufacturing a semiconductor integrated circuit device according to an embodiment of the present invention.

Next, the manufacturing method of the WL-CSP having the constitution as described above will be described along the process flow referring to FIGS. 6 to 32. FIG. 6 is a flow chart of this manufacturing method.

Figure 7:
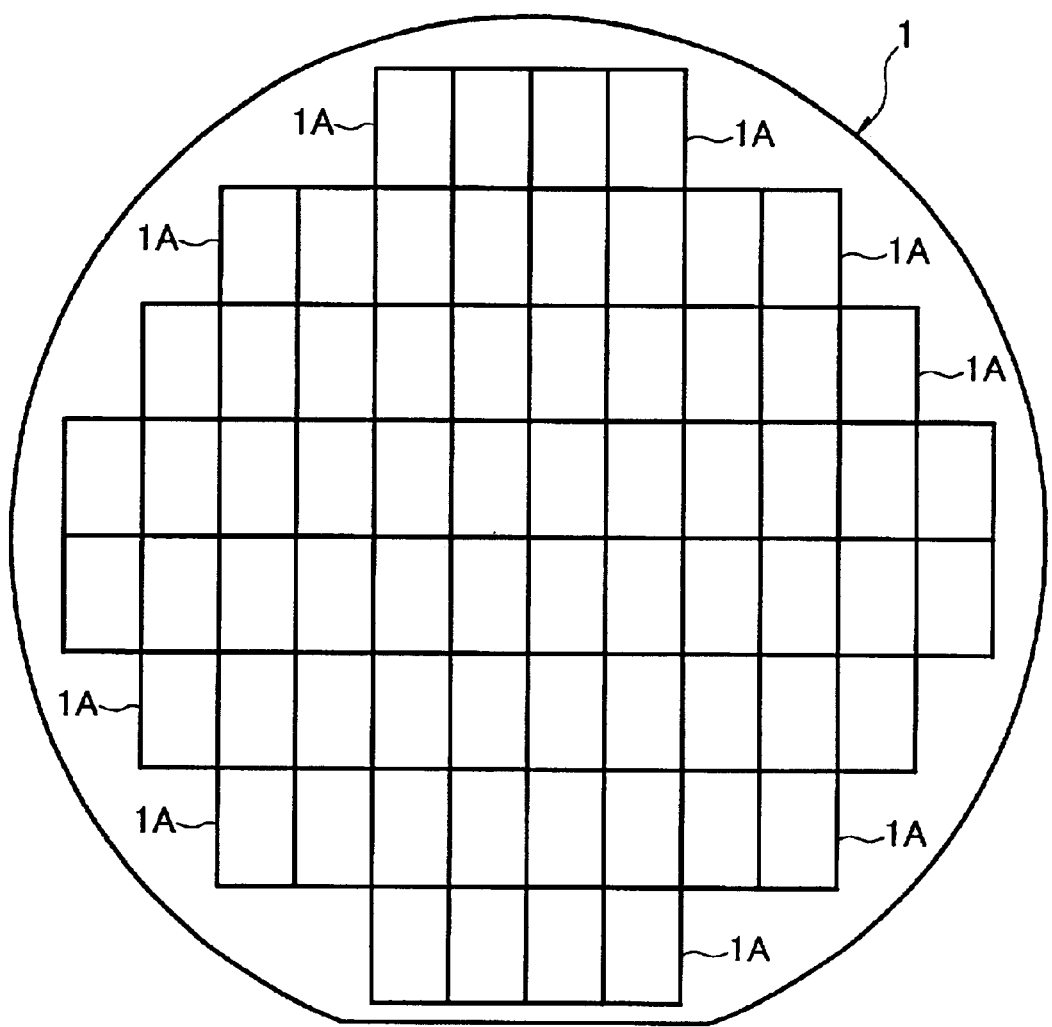
FIG. 7 is a plan view of a wafer showing a manufacturing method of a semiconductor integrated circuit device according to an embodiment of the present invention.
Figure 8:
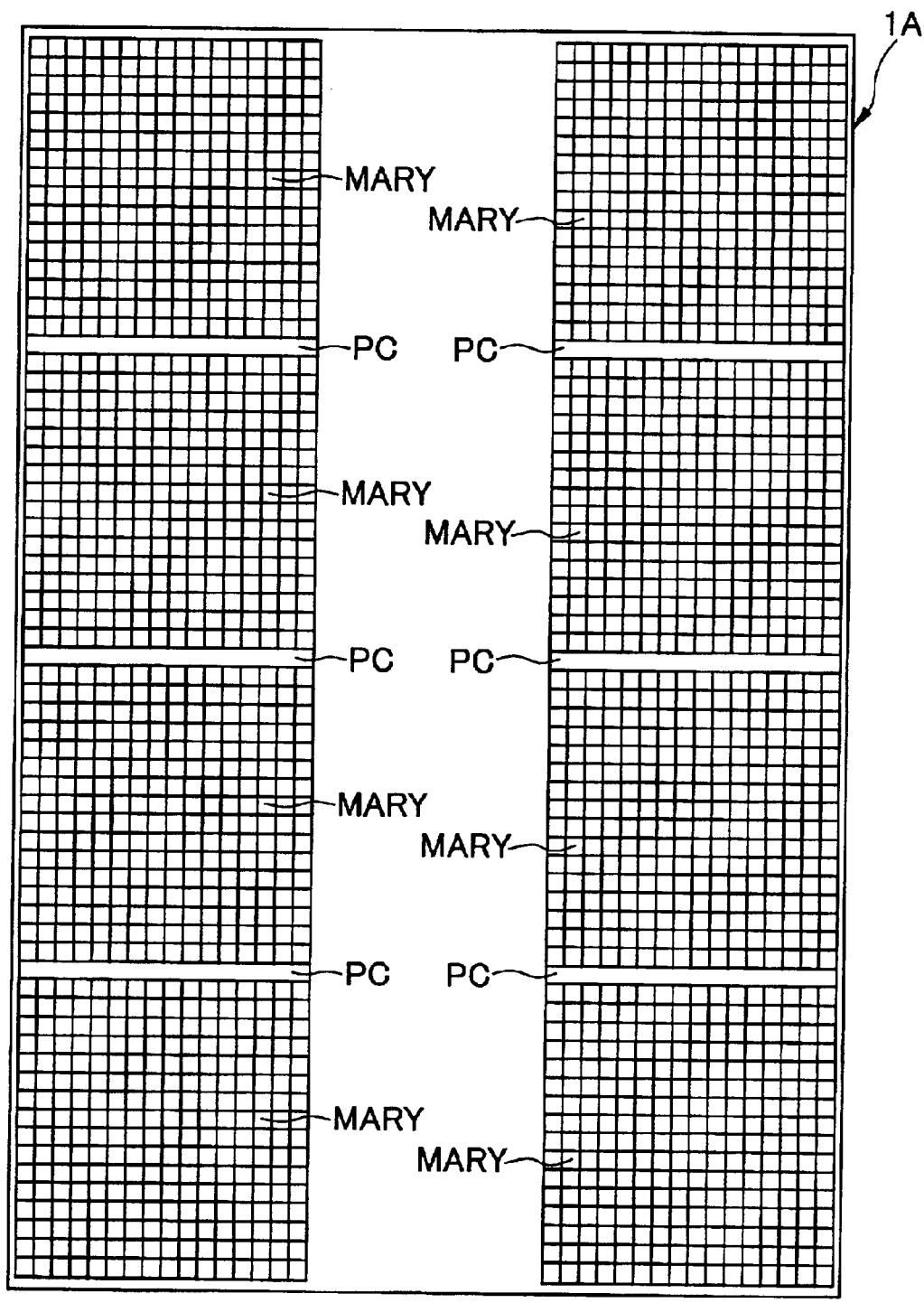
FIG. 8 is a plan view showing the principal part of a semiconductor wafer in a manufacturing method of a semiconductor integrated circuit device according to an embodiment of the present invention.

FIG. 7 is a plan view of a semiconductor wafer (hereinafter, referred to as wafer) 1 in the course of the wafer process. As shown in FIG. 7, the main surface of the wafer 1 is sectioned into a plurality of chip areas 1A. As shown in FIG. 8, each of the chip areas 1A is constituted of the plurality of memory arrays (MARY) and peripheral circuits PC arranged between the memory arrays.

Figure 9:
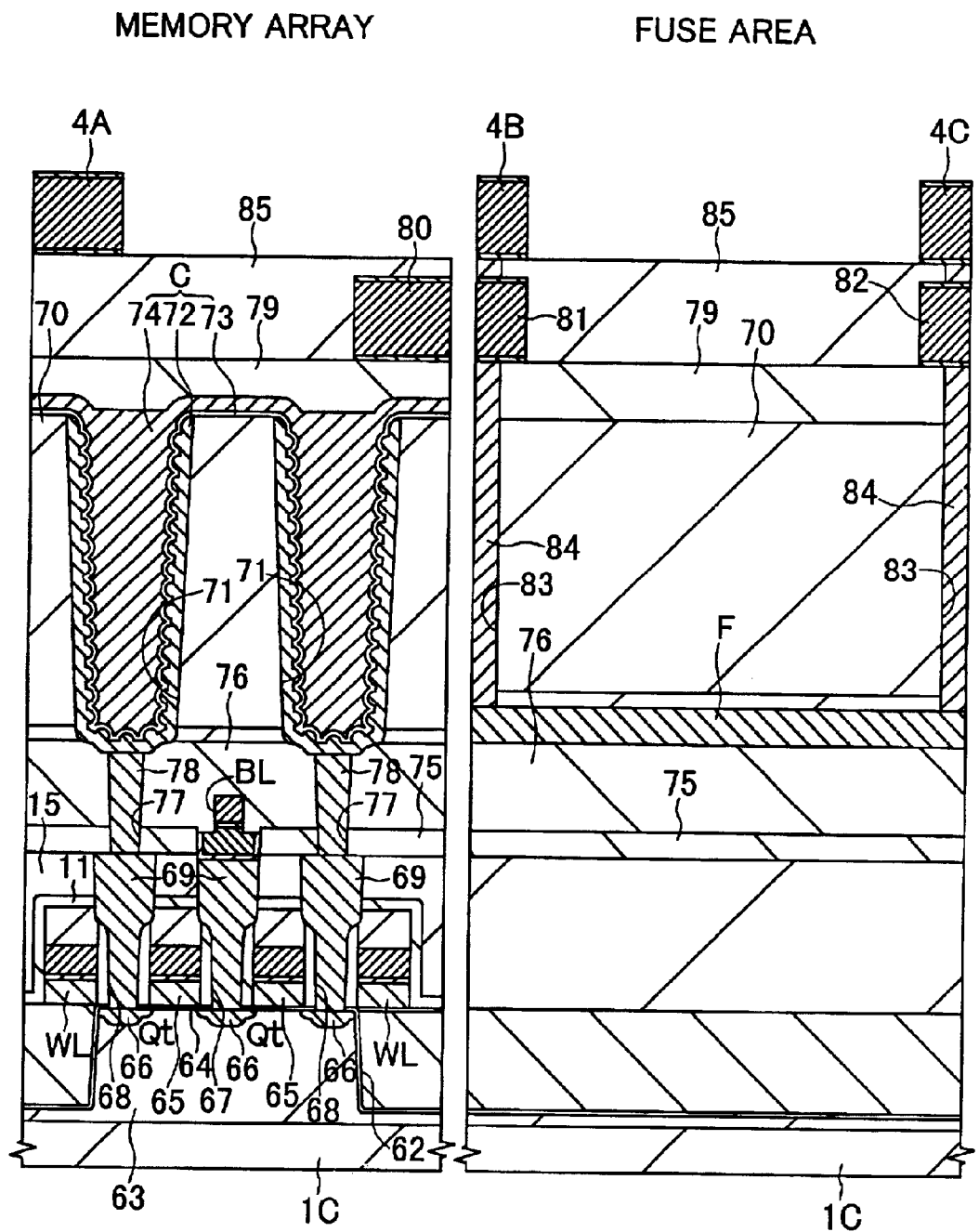
FIG. 9 is a cross-sectional view showing the principal part of a semiconductor wafer in a manufacturing method of a semiconductor integrated circuit device according to an embodiment of the present invention.

FIG. 9 is a cross-sectional view showing the principal part (memory array and fuse area) of the chip area 1A. The plurality of memory cells constituted of the MISFET Qt for selecting memory cell and the capacitor element C for data storage are formed in the memory array of the chip area 1A. The first aluminum wiring 80 is formed on the capacitor element C for data storage and the uppermost wiring 4A serving as a second aluminum wiring is formed thereon.

Meanwhile, the fuse F is formed in the fuse area. This fuse F is constituted of a polycrystalline silicon layer in the same layer as the plug 78 buried in the through hole 77 of the memory array. It is also possible to form the fuse F by using, for example, a metal layer in the same layer as the bit line BL and the polymetal layer in the same layer as the gate electrode 65. More specifically, the fuse F is formed in any one of a series of steps for forming the memory cell and wirings on the wafer 1. The first aluminum wirings 81 and 82 and the uppermost wirings 4B and 4C are formed on the fuse F.

Next, as shown in FIG. 10, the surface protection layer (inorganic passivation layer) 3 made of a silicon nitride layer is deposited on the uppermost wirings 4A to 4C by the plasma CVD method. The thickness of the silicon nitride layer constituting the surface protection layer 3 is set to, for example, 1.3 $\mu$m to 1.6 $\mu$m and the deposition temperature is set to, for example, 400° C. to 500° C. The surface protection layer 3 can be constituted of double-layered inorganic dielectric layer formed of a silicon oxide layer having a thickness of about 0.3 $\mu$m deposited by the plasma CVD method and a silicon nitride layer having a thickness of about 1.3 $\mu$m deposited by the plasma CVD method.

Figure 11:
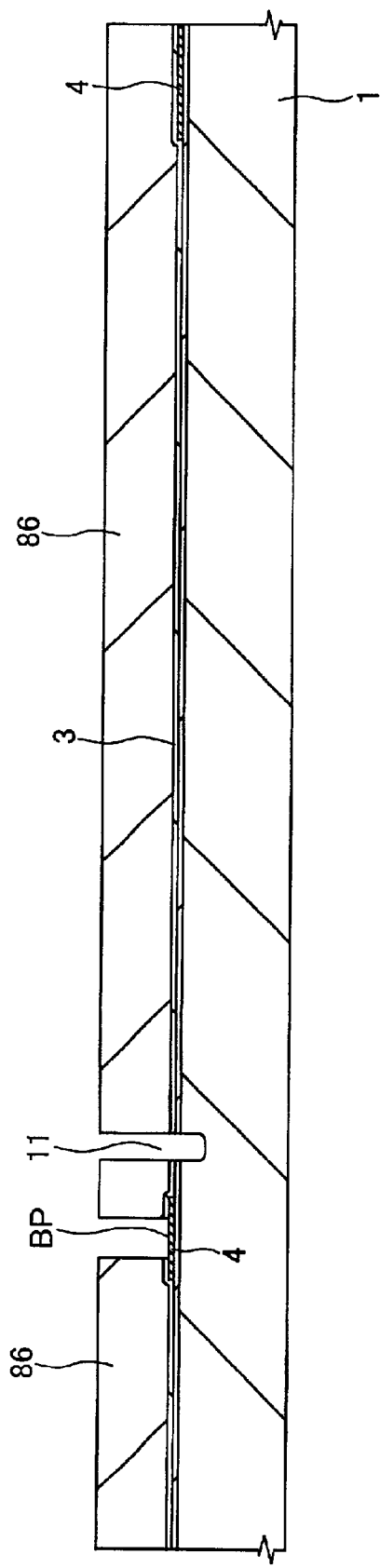
FIG. 11 is a cross-sectional view showing the principal part of a semiconductor wafer in a manufacturing method of a semiconductor integrated circuit device according to an embodiment of the present invention.
Figure 12:
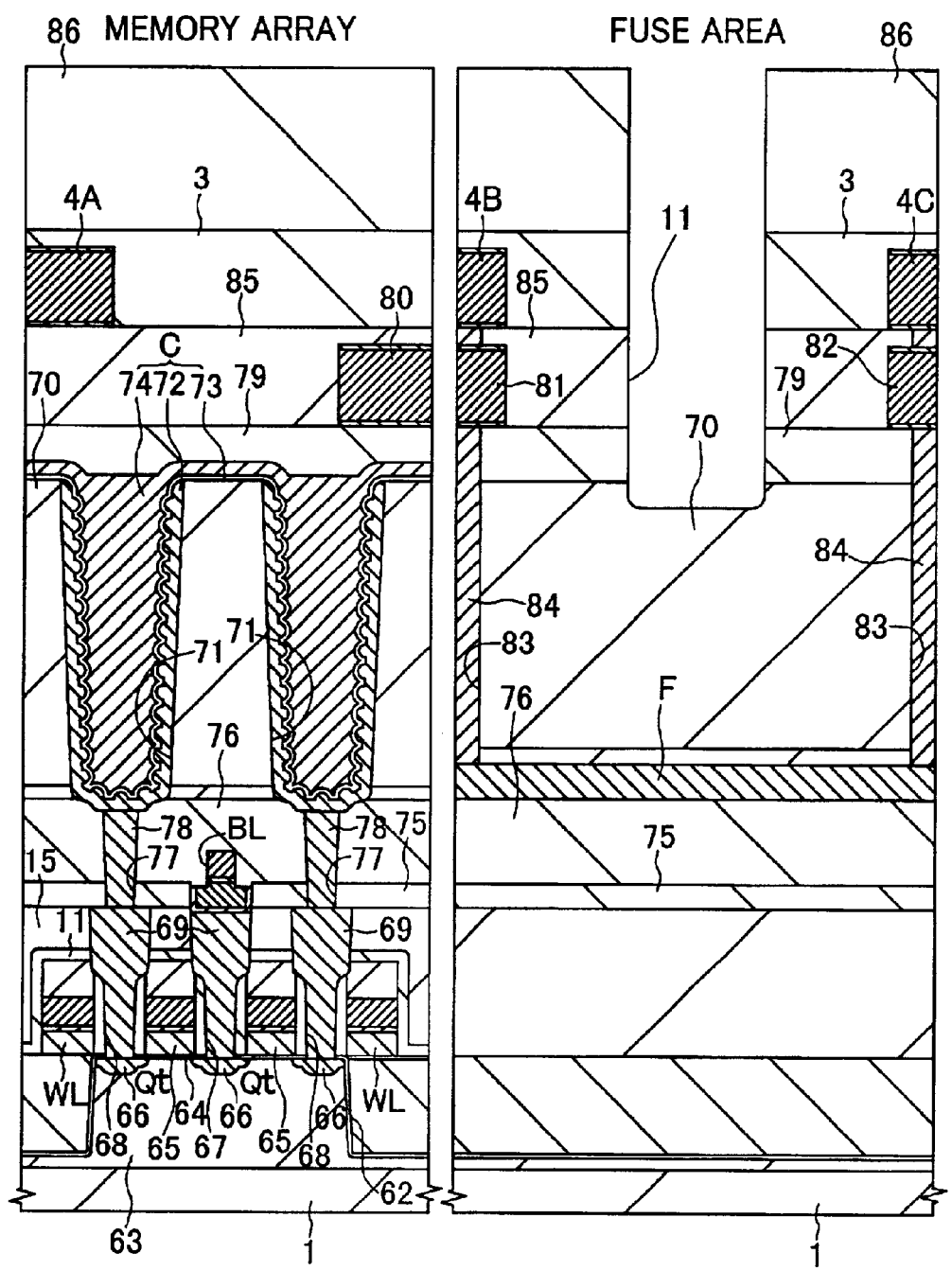
FIG. 12 is a cross-sectional view showing the principal part of a semiconductor wafer in a manufacturing method of a semiconductor integrated circuit device according to an embodiment of the present invention.
Figure 13:
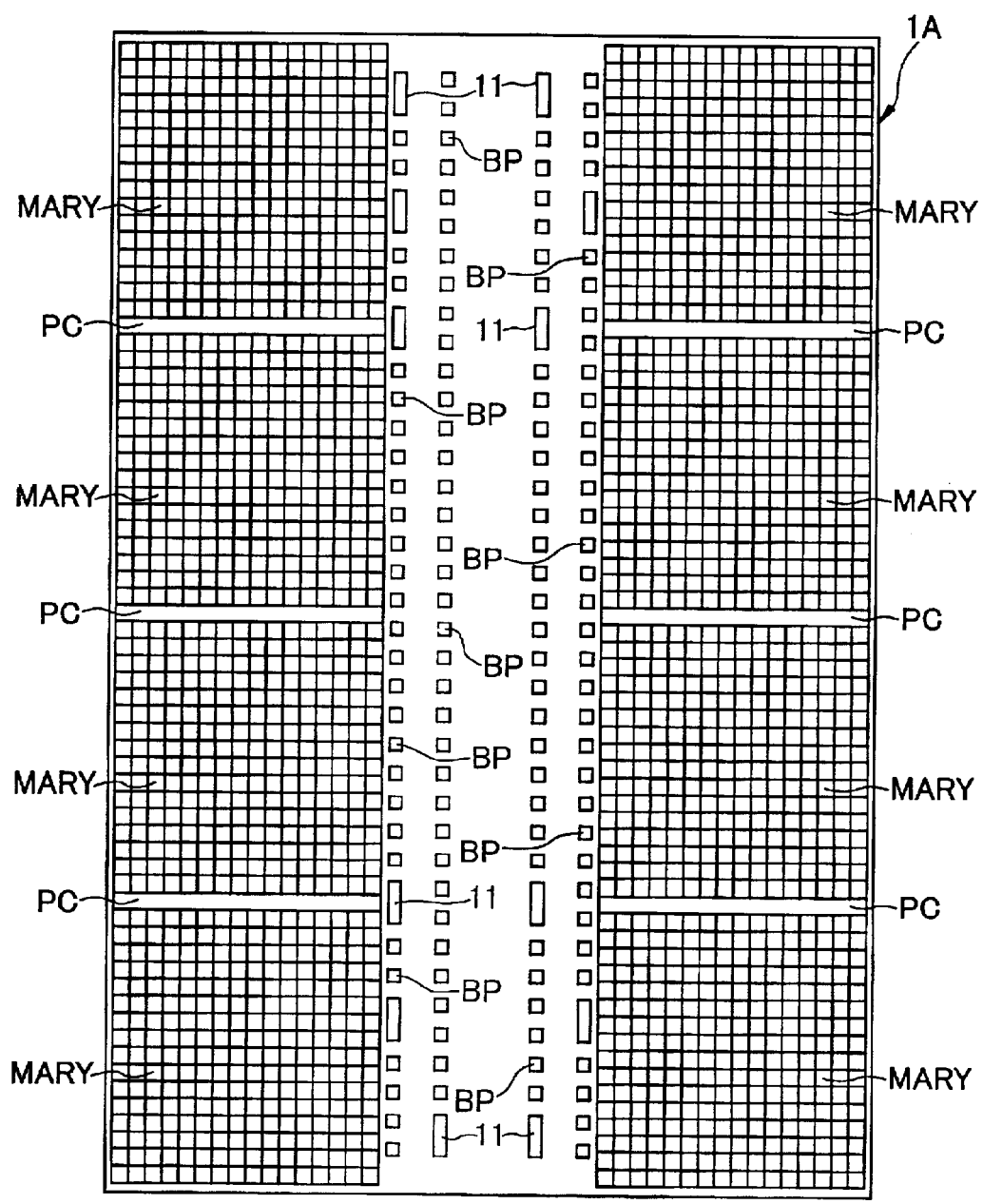
FIG. 13 is a plan view showing the principal part of a semiconductor wafer in a manufacturing method of a semiconductor integrated circuit device according to an embodiment of the present invention.

Next, as shown in FIGS. 11 and 12, the surface protection layer 3 is dry-etched with using a photo-resist layer 86 as a mask to expose a part of the uppermost wiring 4, thereby forming a bonding pad BP. At the same time, the surface protection layer 3 and the silicon oxide layers 85, 79, and 70 are dry-etched to form the fuse opening 11 over the fuse F. The fuse opening 11 is formed so as to reduce the thickness of the dielectric layer covering the fuse F to about 1 $\mu$m. As shown in FIG. 13, the bonding pads BP and the fuse openings 11 are arranged in four rows in the central portion of each chip area 1A along the longitudinal direction.

Figure 14:
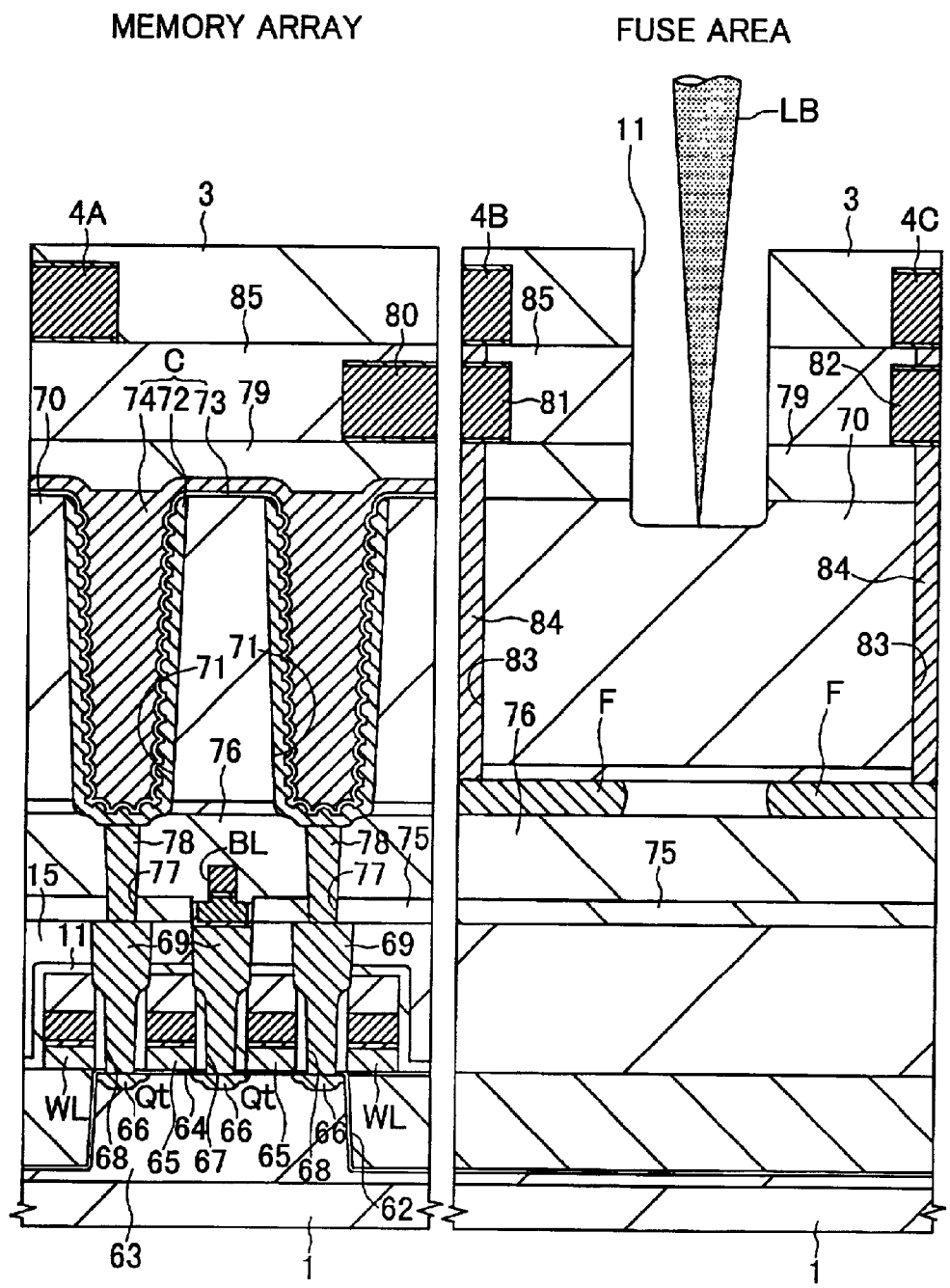
FIG. 14 is a cross-sectional view showing the principal part of a semiconductor wafer in a manufacturing method of a semiconductor integrated circuit device according to an embodiment of the present invention.

Next, after removing the photo-resist layer 86, a probe (not shown) is touched to the bonding pad BP and the test (wafer test and probe test) for checking each chip area 1A is conducted. Then, when the probe test detects the defect memory cell, the defect repairing is performed in which the address corresponding to the defect cell is allocated to a redundant cell. As shown in FIG. 14, this defect repairing is performed by irradiating laser beam BL to a predetermined fuse F through the fuse opening 11 to cut the fuse F by fusion.

If the wafer 1 subjected to the defect repairing is exposed to a high temperature atmosphere for a long time in the subsequent process, the characteristic of the memory cell is changed and the problem as that refresh times in each of the memory cells vary from each other occurs. As a result, even the chip determined to be good in the probe test may become defective. For its prevention, the upper limit of the process temperature of the wafer 1 is set in the steps after the defect repairing, and the heat treatment at the temperature higher than this upper limit is prohibited. Since this upper temperature limit depends on the structure of a memory cell and the design rule thereof, it can not be defined uniformly. However, in the case of the DRAM in this embodiment, the upper temperature limit is set at 260° C., for example.

Figure 15:
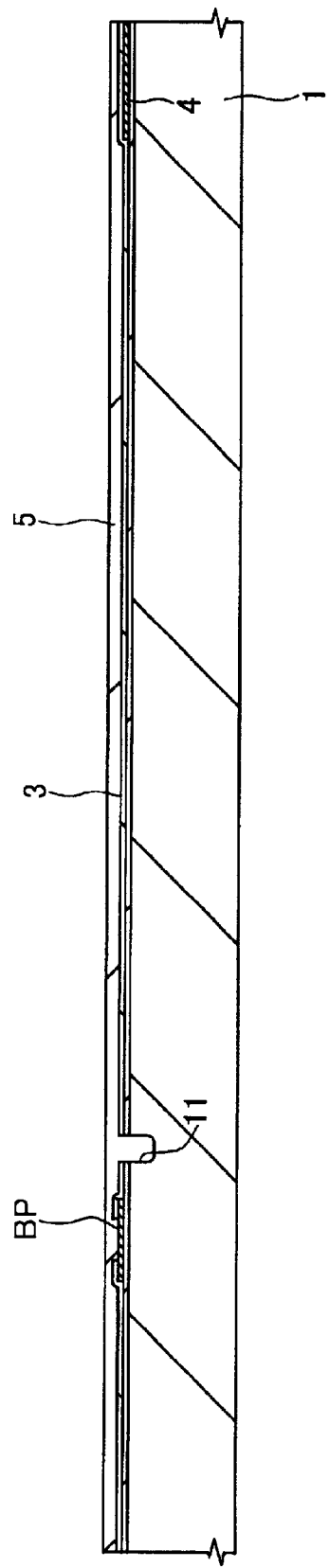
FIG. 15 is a cross-sectional view showing the principal part of a semiconductor wafer in a manufacturing method of a semiconductor integrated circuit device according to an embodiment of the present invention.
Figure 16:
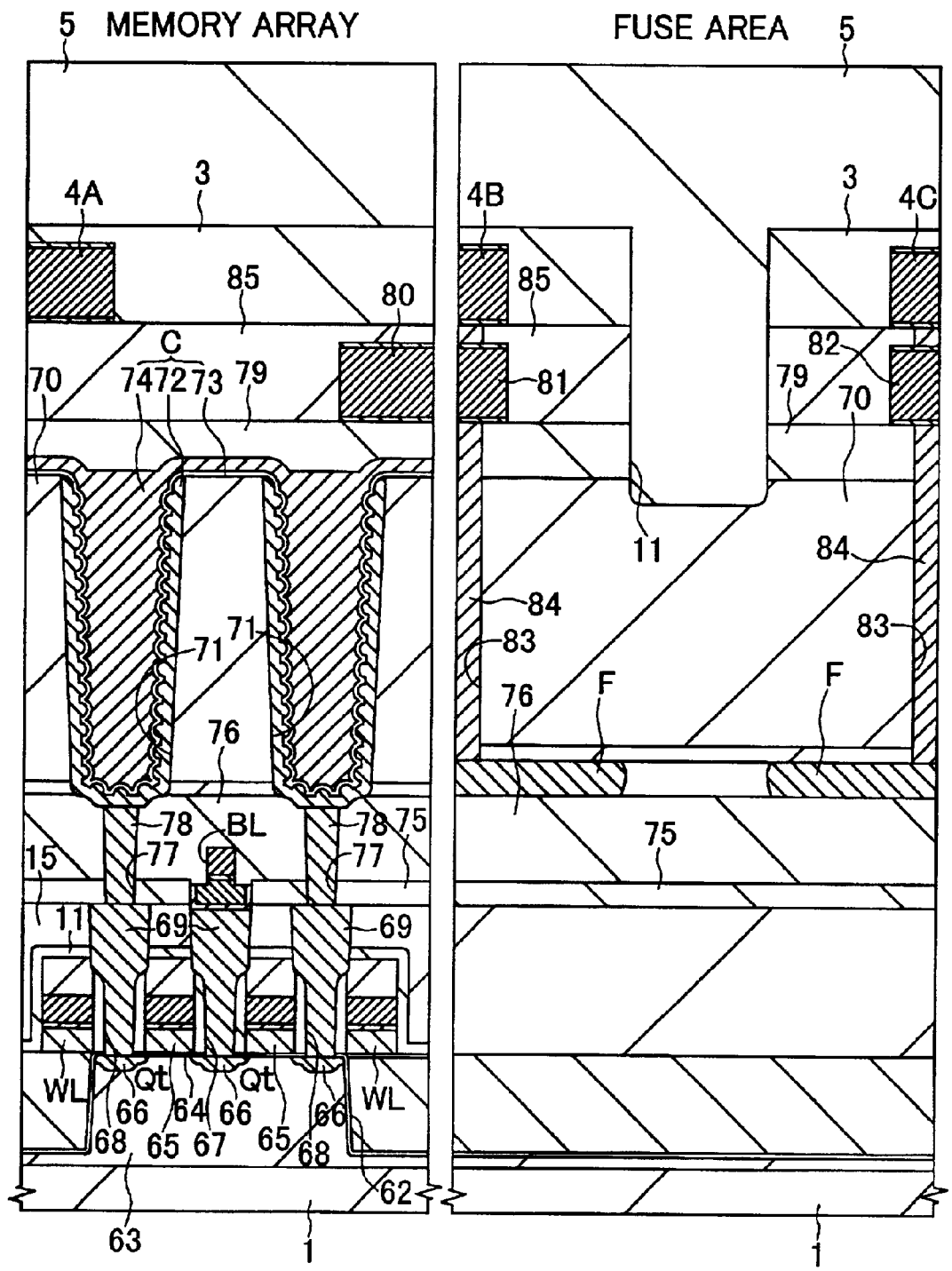
FIG. 16 is a cross-sectional view showing the principal part of a semiconductor wafer in a manufacturing method of a semiconductor integrated circuit device according to an embodiment of the present invention.

Next, as shown in FIGS. 15 and 16, the photo-sensitive polyimide layer 5 having a thickness of about 35 $\mu$M is formed on the surface protection layer 3 by the spin coating method, and the prebaking is performed at 92° C. for 300 seconds. By forming the photo-sensitive polyimide layer 5 on the surface protection layer 3, the photo-sensitive polyimide layer 5 fills the fuse opening 11.

Next, the photo-sensitive polyimide layer 5 except that formed on the bonding pads BP is semi-cured by the exposure and the baking (e.g., at 112° C. for 60 seconds). Thereafter, as shown in FIG. 17, the unexposed (uncured) part of the photo-sensitive polyimide layer 5 is removed by the development, thereby forming an opening 6A on the bonding pad BP.

Figure 18:
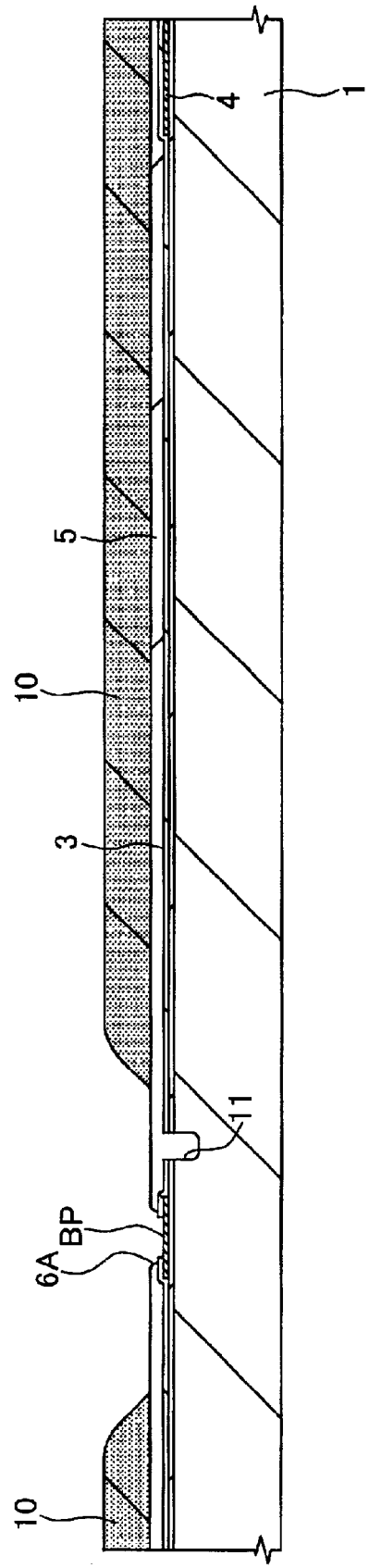
FIG. 18 is a cross-sectional view showing the principal part of a semiconductor wafer in a manufacturing method of a semiconductor integrated circuit device according to an embodiment of the present invention.
Figure 19:
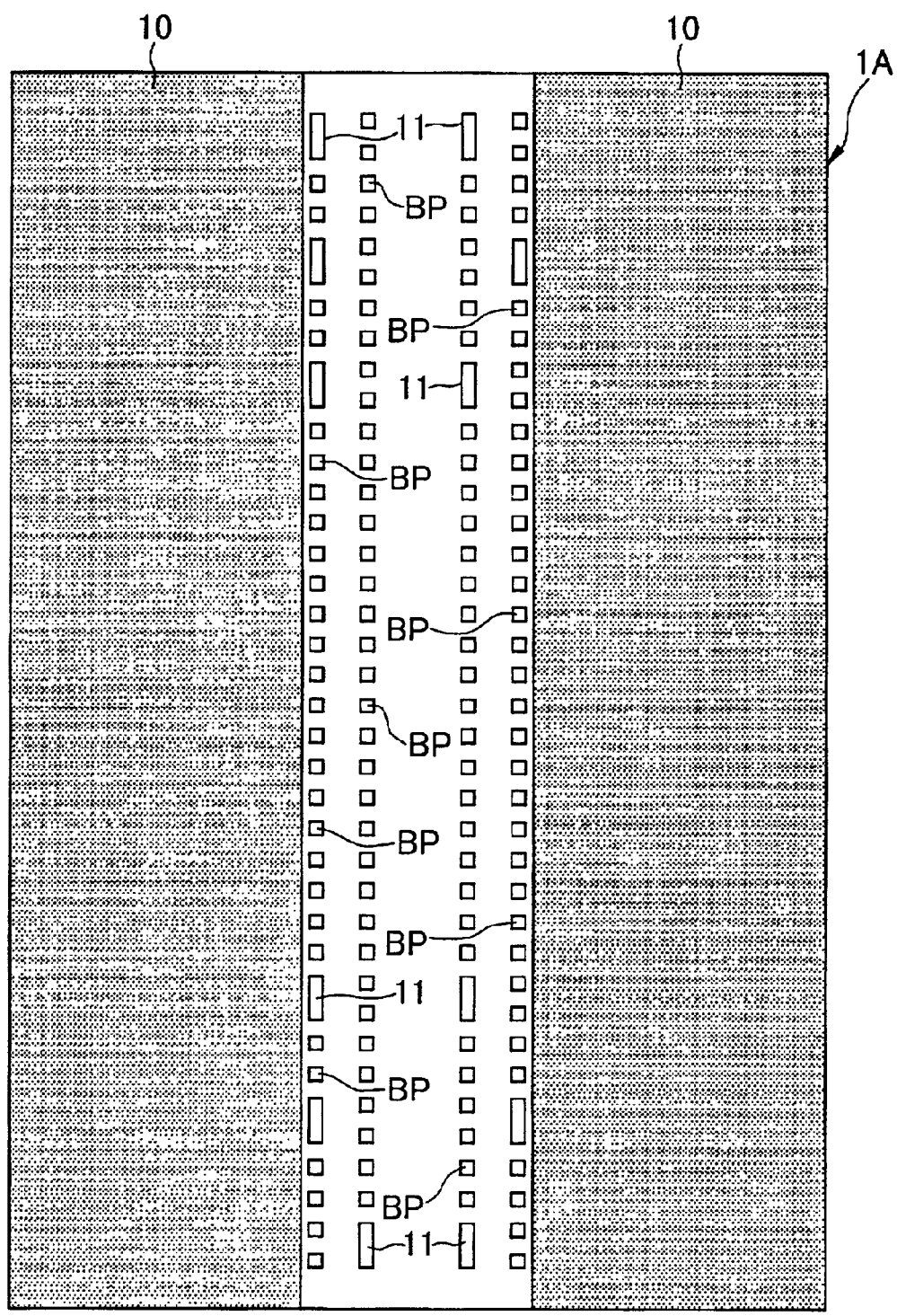
FIG. 19 is a plan view showing the principal part of a semiconductor wafer in a manufacturing method of a semiconductor integrated circuit device according to an embodiment of the present invention.

The semi-cured photo-sensitive polyimide layer 5 is subjected to the baking at 250° C. for about 2 to 3 hours to cure it completely, and the photo-sensitive polyimide layer 5 having a thickness of about 15 $\mu$m is obtained. Thereafter, as shown in FIGS. 18 and 19, the elastomer layer 10 formed of low-elasticity polyamideimide resin is deposited on the photo-sensitive polyimide layer 5. As shown in FIG. 19, the elastomer layer 10 is deposited on the area except the central portion of the chip area 1A, in other words, on an area having no bonding pads BP arranged therein.

A printing method is used to apply the elastomer layer 10. Thereafter, the baking at 250° C. is performed, and thus the elastomer layer 10 having a thickness of about 75 $\mu$m is obtained. As described above, it is necessary to avoid the heat treatment at a high temperature over 260° C. in order to prevent such problems as that refresh times in each of the memory cells vary from each other. Therefore, both of the baking processes for curing the photo-sensitive polyimide layer 5 and curing the elastomer layer 10 are performed at a temperature below 260° C.

Figure 20:
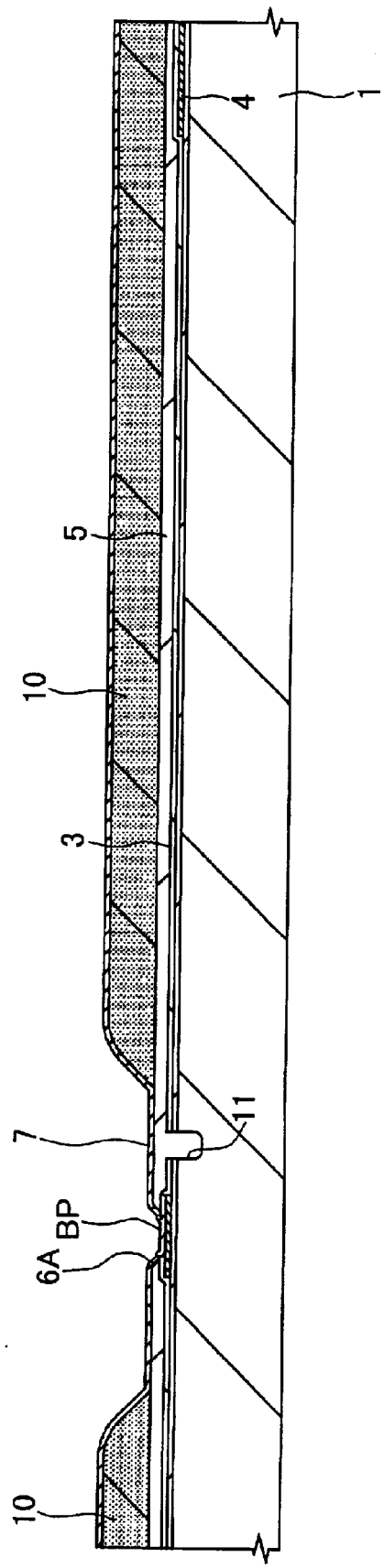
FIG. 20 is a cross-sectional view showing the principal part of a semiconductor wafer in a manufacturing method of a semiconductor integrated circuit device according to an embodiment of the present invention.

Next, as shown in FIG. 20, a plating seed layer 7 is formed on the elastomer layer 10 and on the surfaces of the bonding pads BP. The plating seed layer 7 is formed of, for example, a Cr (chromium) layer having a thickness of about 50 nm to 150 nm and a Cu (copper) layer having a thickness of about 0.1 $\mu$m to 0.7 $\mu$m deposited by the sputtering method.

Figure 21:
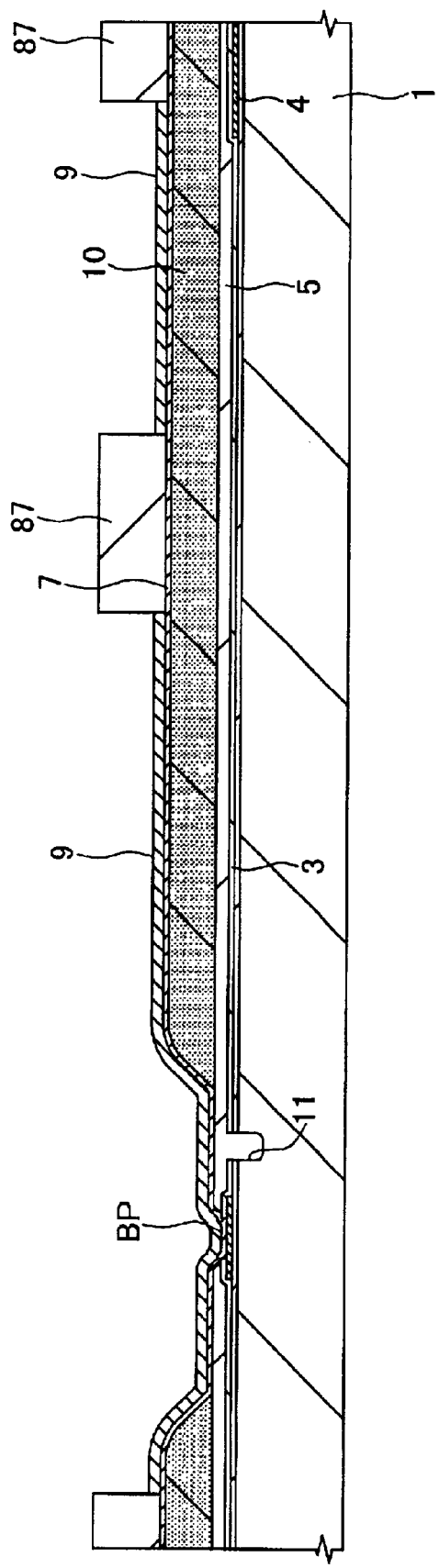
FIG. 21 is a cross-sectional view showing the principal part of a semiconductor wafer in a manufacturing method of a semiconductor integrated circuit device according to an embodiment of the present invention.

Next as shown in FIG. 21, after covering the plating seed layer 7 in an area except a rerouting layer forming area by a photo-resist layer 87, a metal layer 9 is grown on the surface of the plating seed layer 7 by the use of the electroplating method. The metal layer 9 is formed of, for example, a Cu layer having a thickness of about 3 $\mu$m to 15 $\mu$m and an Ni (nickel) layer having a thickness of about 2 $\mu$m to 5 $\mu$m.

Figure 22:
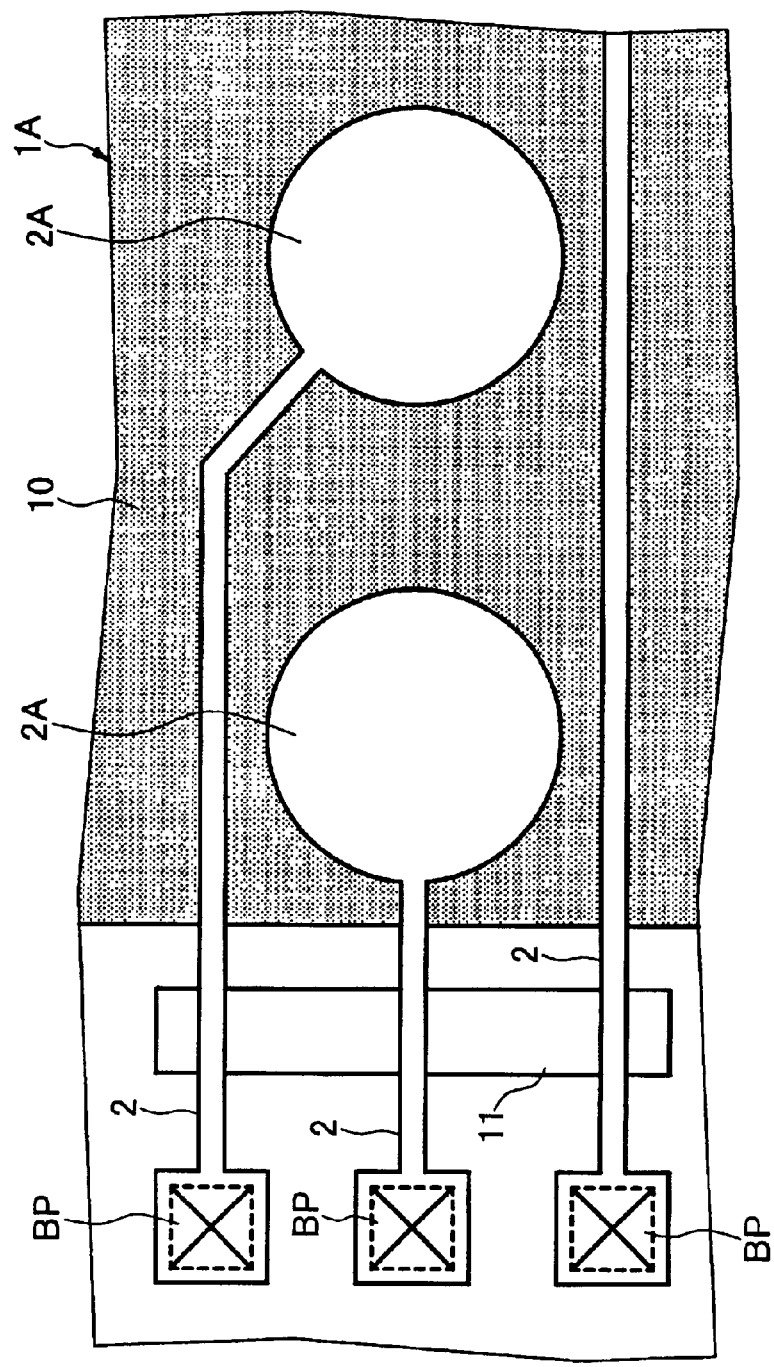
FIG. 22 is a plan view showing the principal part of a semiconductor wafer in a manufacturing method of a semiconductor integrated circuit device according to an embodiment of the present invention.
Figure 23:
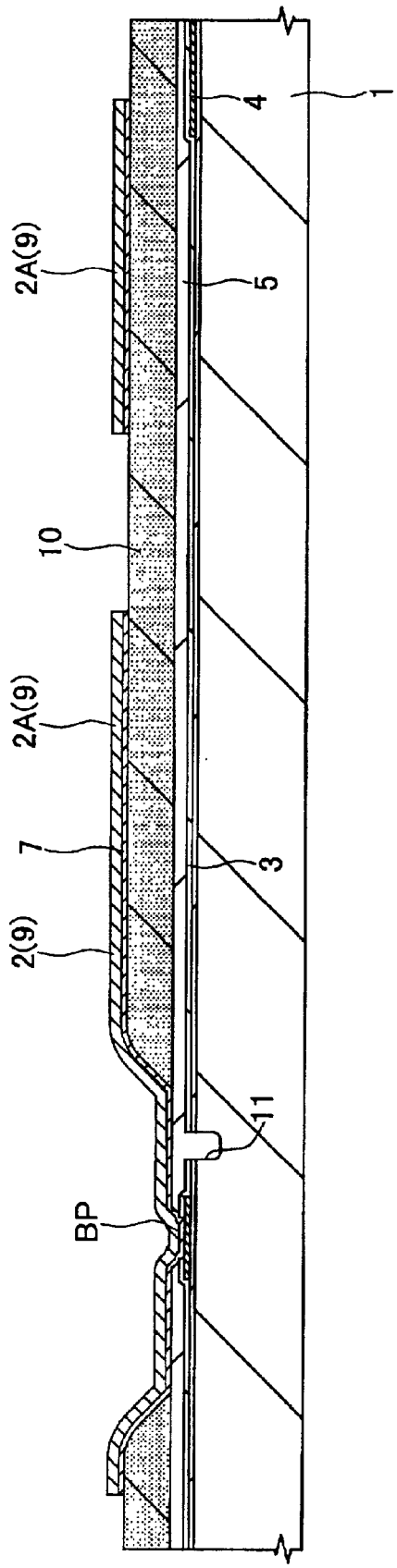
FIG. 23 is a cross-sectional view showing the principal part of a semiconductor wafer in a manufacturing method of a semiconductor integrated circuit device according to an embodiment of the present invention.
Figure 24:
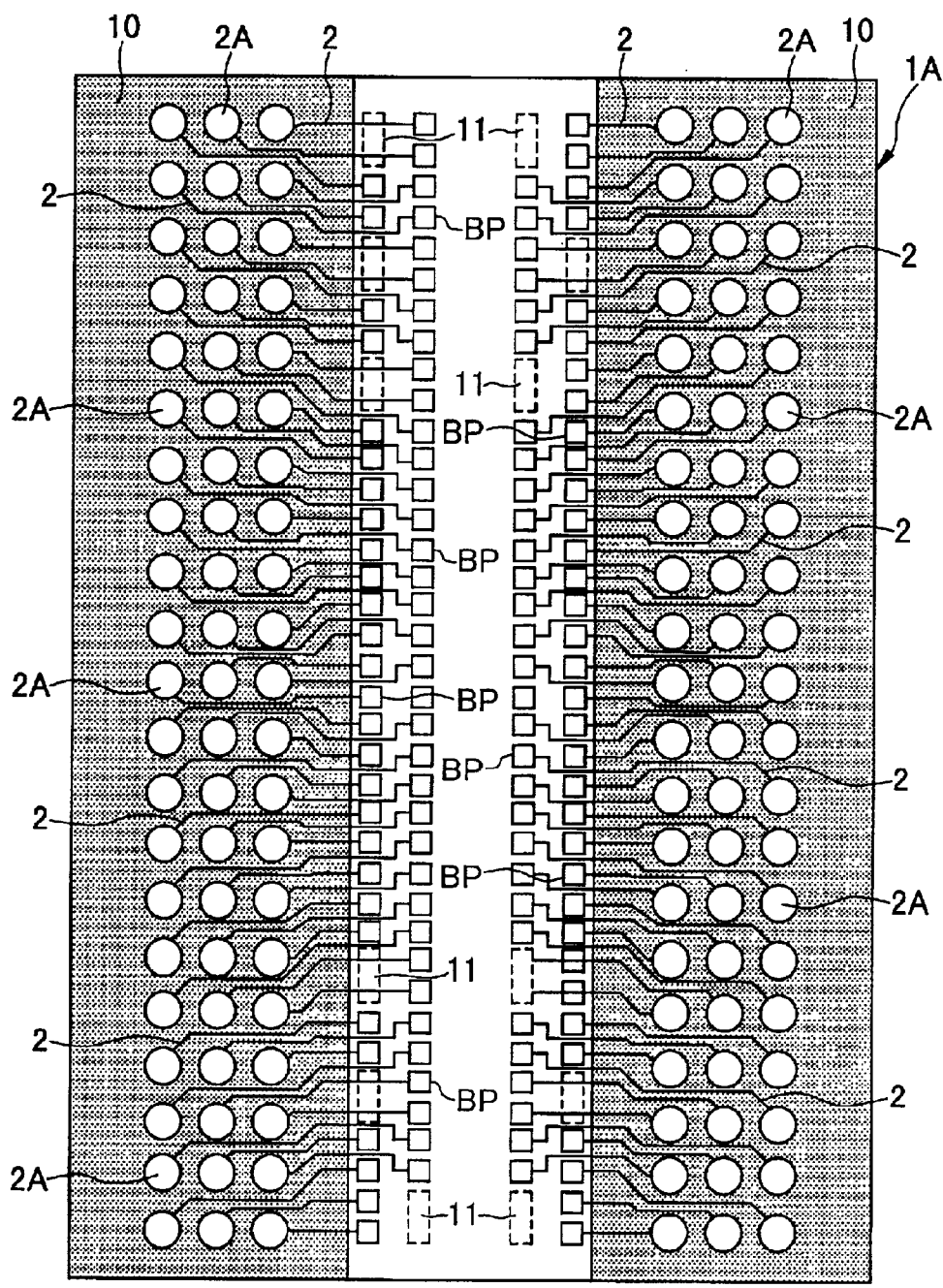
FIG. 24 is a plan view showing the principal part of a semiconductor wafer in a manufacturing method of a semiconductor integrated circuit device according to an embodiment of the present invention.

Next, after removing the photo-resist layer 87, the plating seed layer 7 covered with the photo-resist layer 87 is removed by the wet etching, thereby forming the rerouting layer 2 and the bump land 2A constituted of the metal layer 9 as shown in FIGS. 22 to 24. Note that when removing the plating seed layer 7 by the wet etching, the surface of the metal layer 9 is simultaneously etched. However, since the metal layer 9 is far thicker than the plating seed layer 7, it does not cause any trouble. The rerouting layer 2 and the bump land 2A can be formed also by patterning a metal layer, which is deposited on the elastomer layer 10 by the sputtering method. However, in the case of using the electroplating method as in the first embodiment, the thick film formation and the microfabrication of the rerouting layer 2 can be achieved more easily in comparison to the case of using the sputtering method.

In this embodiment as described above, after the defect repairing by irradiating the laser beam LB on the fuse F, the photo-sensitive polyimide layer 5 is filled in the fuse opening 11. Thereafter, the rerouting layer 2 and the bump land 2A are formed on the elastomer layer 10. Therefore, according to the process, the rerouting layer 2 and the bump land 2A can be arranged also over the fuse opening 11.

Figure 25:
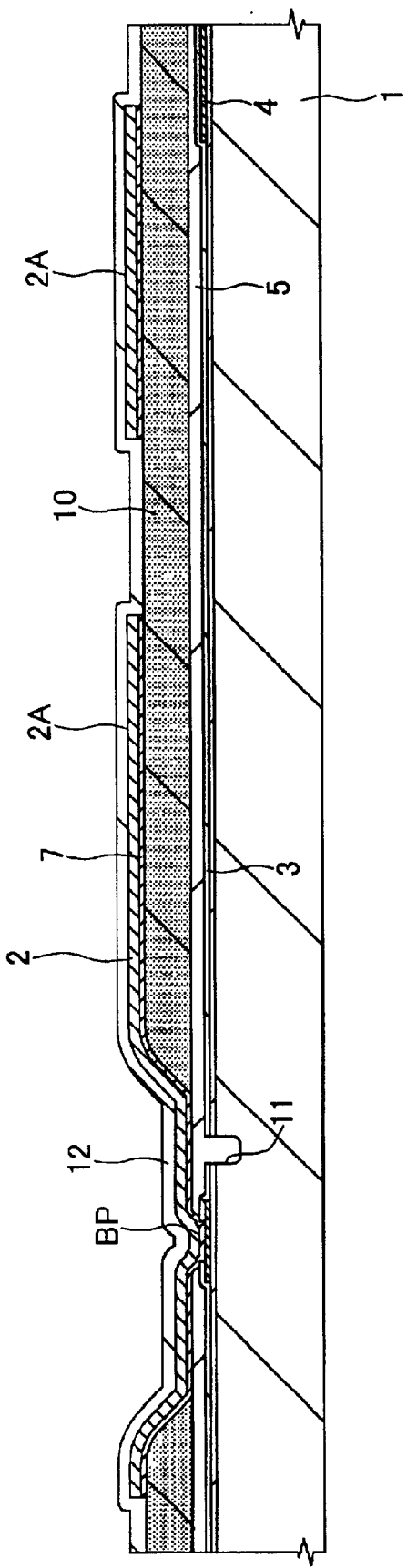
FIG. 25 is a cross-sectional view showing the principal part of a semiconductor wafer in a manufacturing method of a semiconductor integrated circuit device according to an embodiment of the present invention.

Next, as shown in FIG. 25, the uppermost protection layer 12 formed of a photo-sensitive polyimide layer is deposited on the rerouting layer 2. The photo-sensitive polyimide layer is formed by the spin coating method so as to have a thickness of about 5 μm to 25 μm when being cured completely. Thereafter, the prebaking is performed thereto at 92° C. for 300 seconds. It is also possible to form the uppermost protection layer 12 by using a solder resist in addition to the photo-resist polyimide layer.

Figure 26:
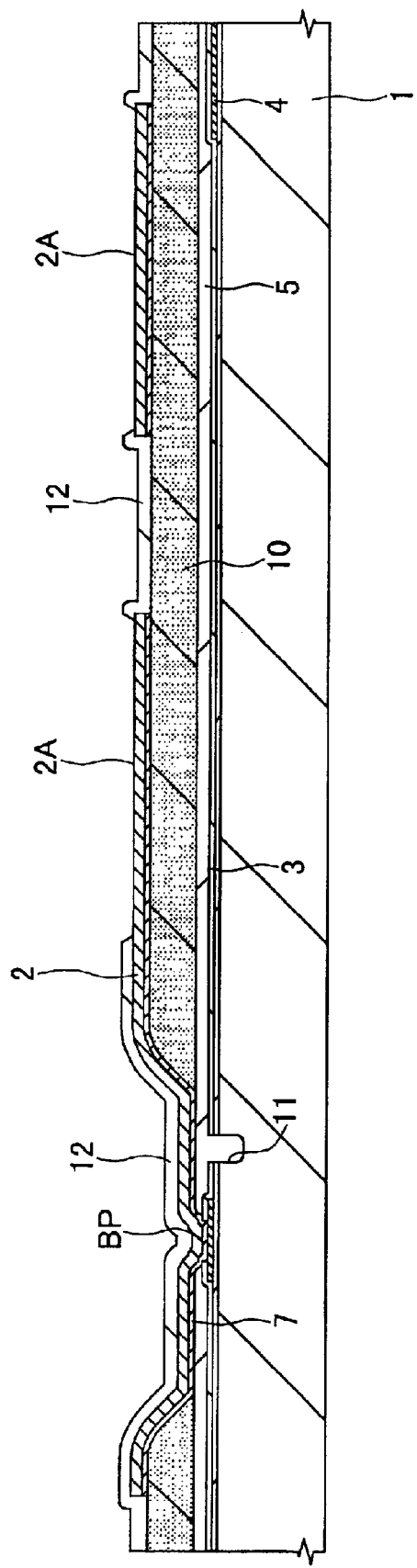
FIG. 26 is a cross-sectional view showing the principal part of a semiconductor wafer in a manufacturing method of a semiconductor integrated circuit device according to an embodiment of the present invention.
Figure 27:
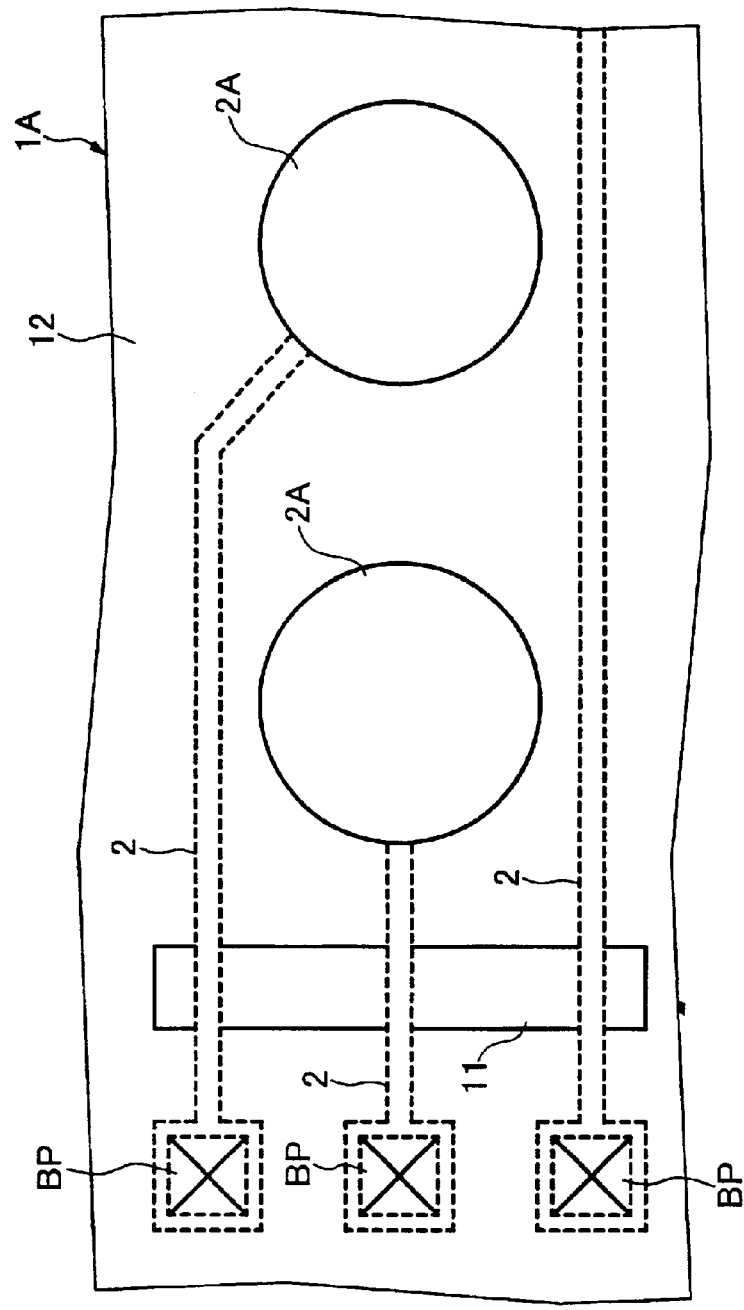
FIG. 27 is a plan view showing the principal part of a semiconductor wafer in a manufacturing method of a semiconductor integrated circuit device according to an embodiment of the present invention.

Next, as shown in FIGS. 26 and 27, the uppermost protection layer 12 covering the bump land 2A is removed to expose the surface of the bump land 2A. The removal of the uppermost protection layer 12 on the bump land 2A is carried out in the following manner. That is, the uppermost protection layer 12 except the area on the bump land 2A is exposed and is semi-cured by the baking process at 112° C. for about 60 seconds. Thereafter, the unexposed part (part on the bump land 2A) of the uppermost protection layer 12 is developed.

Next, the baking process is performed at 250° C. for about 2 to 3 hours to cure the uppermost protection layer 12 completely. As described above, in the following process after the defect repairing, it is necessary to avoid the heat treatment at a high temperature over 260° C. in order to prevent such problems as that refresh times in each of the memory cells vary from each other. Therefore, the baking processes for curing the uppermost protection layer 12 is performed at a temperature below 260° C.

Figure 28:
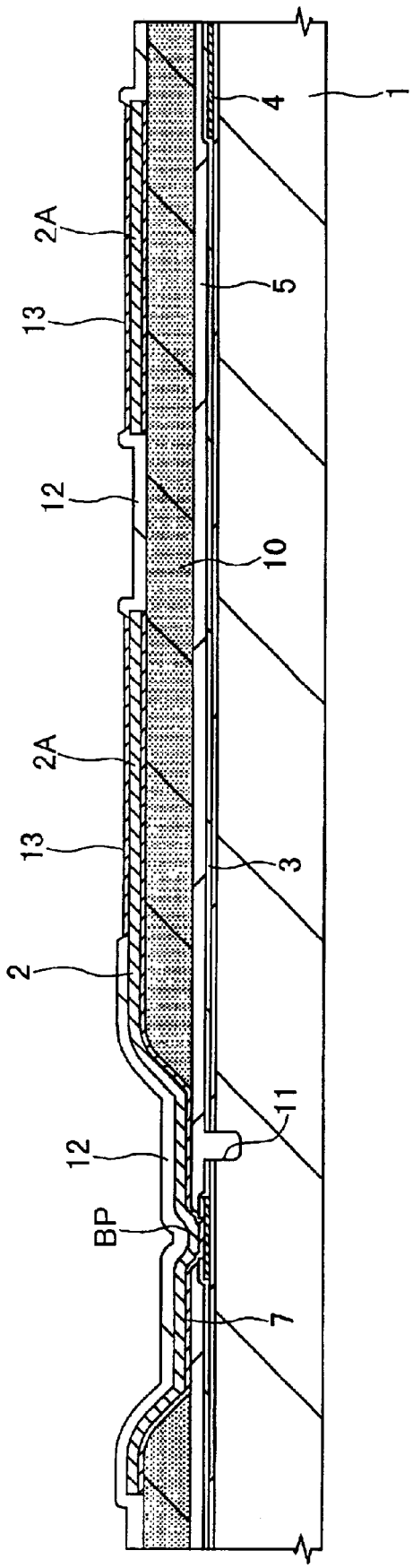
FIG. 28 is a cross-sectional view showing the principal part of a semiconductor wafer in a manufacturing method of a semiconductor integrated circuit device according to an embodiment of the present invention.
Figure 29:
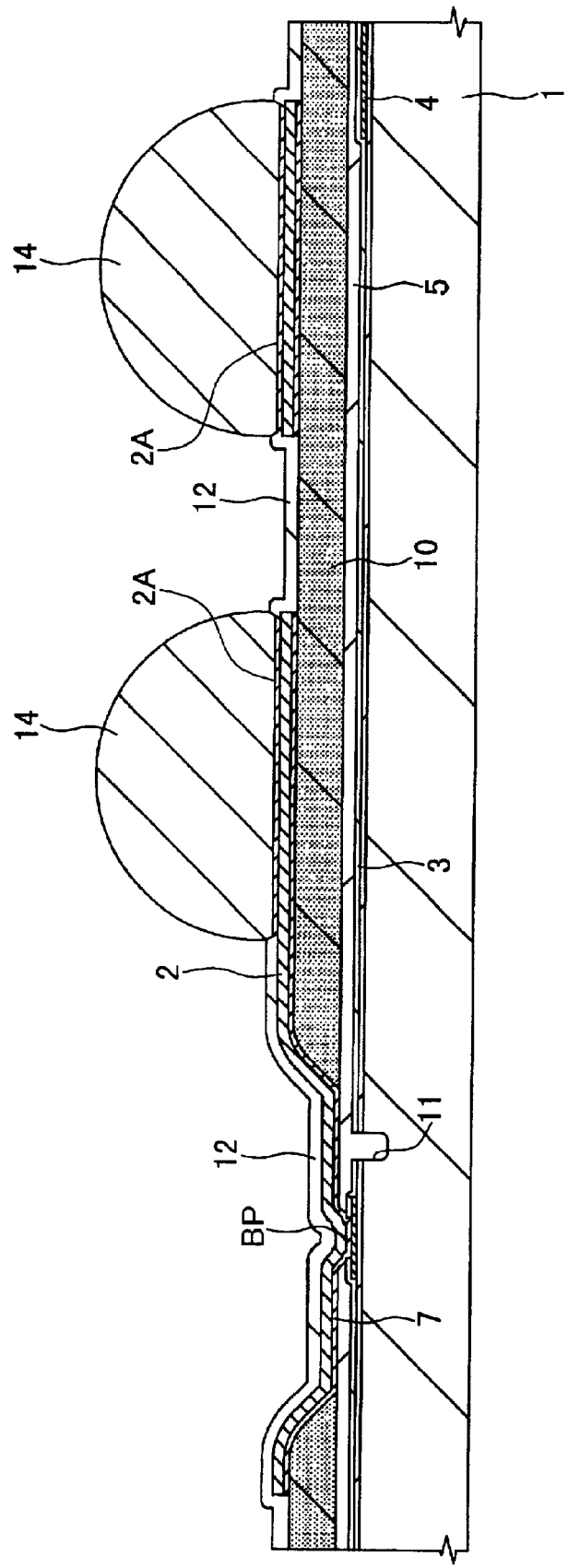
FIG. 29 is a cross-sectional view showing the principal part of a semiconductor wafer in a manufacturing method of a semiconductor integrated circuit device according to an embodiment of the present invention.

Next, as shown in FIG. 28, after forming a gold plating layer 13 having a thickness of about 20 nm to 100 nm on the surface of the bump land 2A by using the electroless plating method, the solder bump 14 is connected to the bump land 2A as shown in FIG. 29. Note that it is also possible to reduce the thickness of the wafer 1 by shaving the rear surface thereof in advance of the step of forming the solder bump 14 on the bump land 2A.

Figure 30:
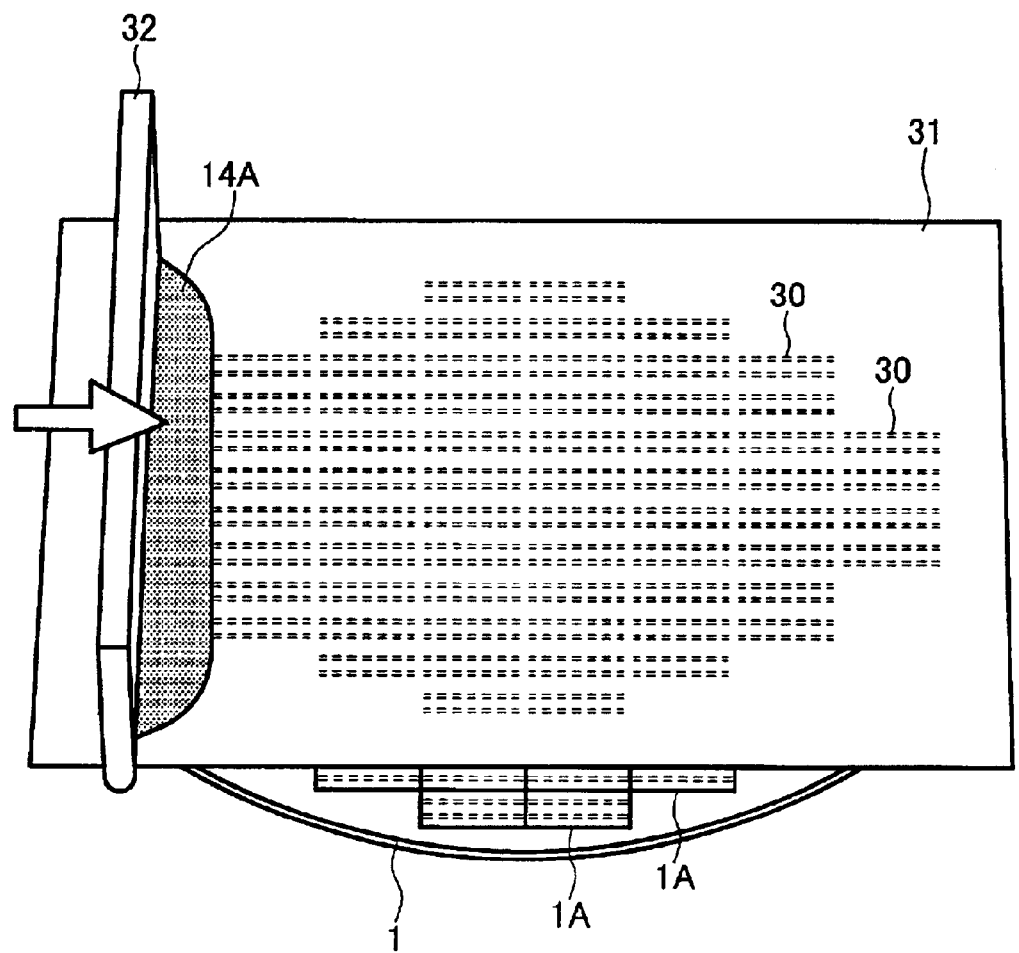
FIG. 30 is a perspective view showing a manufacturing method of a semiconductor integrated circuit device according to an embodiment of the present invention.

As shown in FIG. 30, the solder bump 14 is formed in such a manner that a stencil mask for solder printing 31 having openings 30 corresponding to the arrangement of the bump lands 2A formed thereon is aligned and laid on the wafer 1, and then solder paste 14A is printed on the surface of the bump lands 2A by a squeeze 32.

Figure 31:
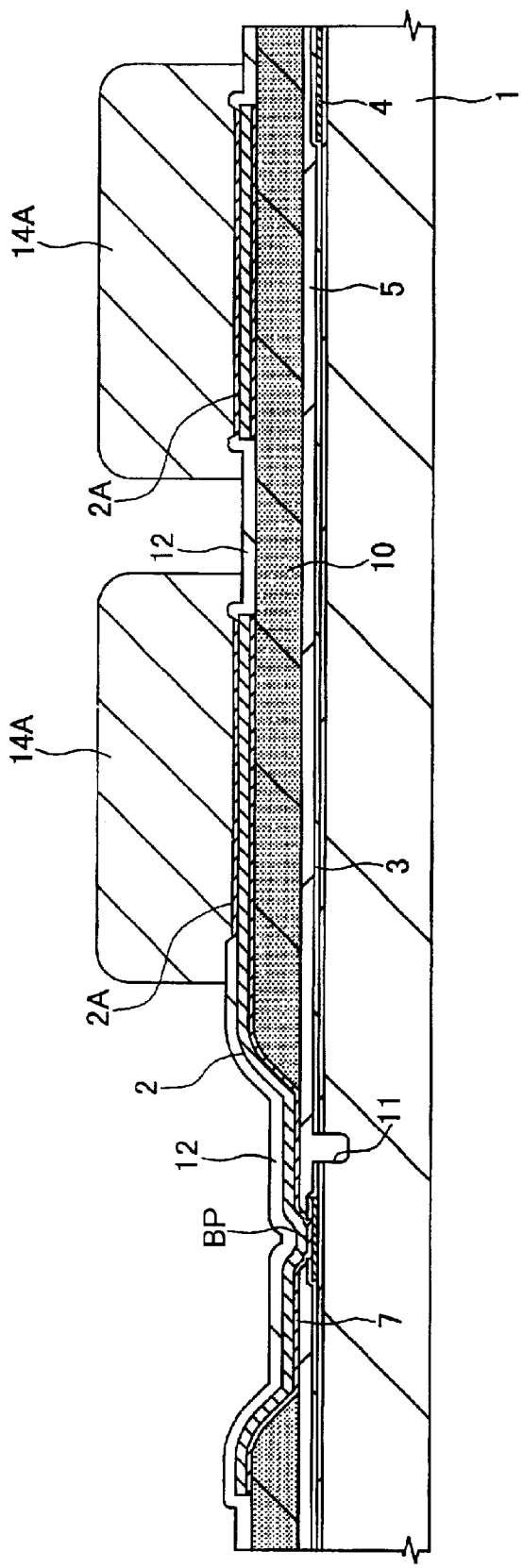
FIG. 31 is a cross-sectional view showing the principal part of a semiconductor wafer in a manufacturing method of a semiconductor integrated circuit device according to an embodiment of the present invention.

The solder paste 14A immediately after being printed is printed almost flatly in an area wider than the bump lands 2A as shown in FIG. 31. Note that since the photo-sensitive polyimide layer 5 is filled in the fuse opening 11, there is no possibility that the solder paste 14A enters the fuse opening 11 and short-circuits the fuse F even in the case where the solder paste 14A is printed over the fuse opening 11.

Next, the wafer 1 is heated at about 240° C. to reflow the solder paste 14A, thereby forming the solder bump 14 in a spherical shape on the bump land 2A as shown in FIG. 31. The solder bump 14 is constituted of, for example, 98.5% of Sn (tin), 1% of Ag (silver), and 0.5% of Pb-free (lead-free) solder (melting temperature of 220° C. to 230° C.) made of Cu. The diameter of the solder bump 14 is about 125 μm to 450 μm. It is also possible to form the solder bump 14 by the plating method instead of the above-mentioned printing method. Also, the solder bump 14 can be formed also by supplying the already-molded solder balls to the bump lands 2A and then heating the wafer 1 to reflow the solder balls.

Figure 32:
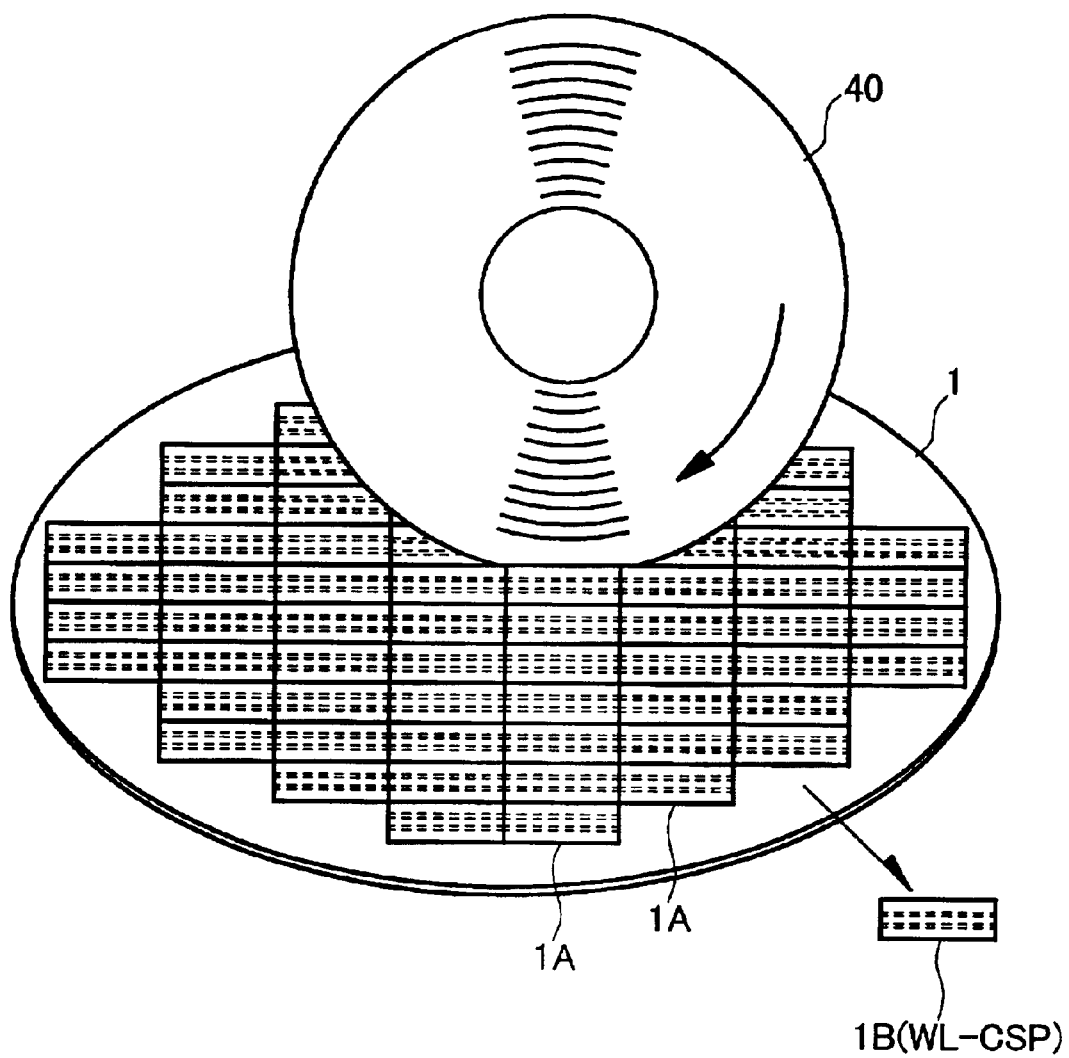
FIG. 32 is a perspective view showing a manufacturing method of a semiconductor integrated circuit device according to an embodiment of the present invention.

Then, after the burn-in test of the wafer 1 as the final test of each chip area 1A, the chip area 1A is cut out from the wafer 1 into chips 1B by a dicing blade 40 as shown in FIG. 32. Then, the WL-CSP shown in FIGS. 1 to 4 is completed.

The WL-CSP thus obtained is subjected to various final tests in terms of performance, outer appearance, and the like if necessary. Thereafter, the WL-CSP is packed into a tray and shipped.

Figure 33:
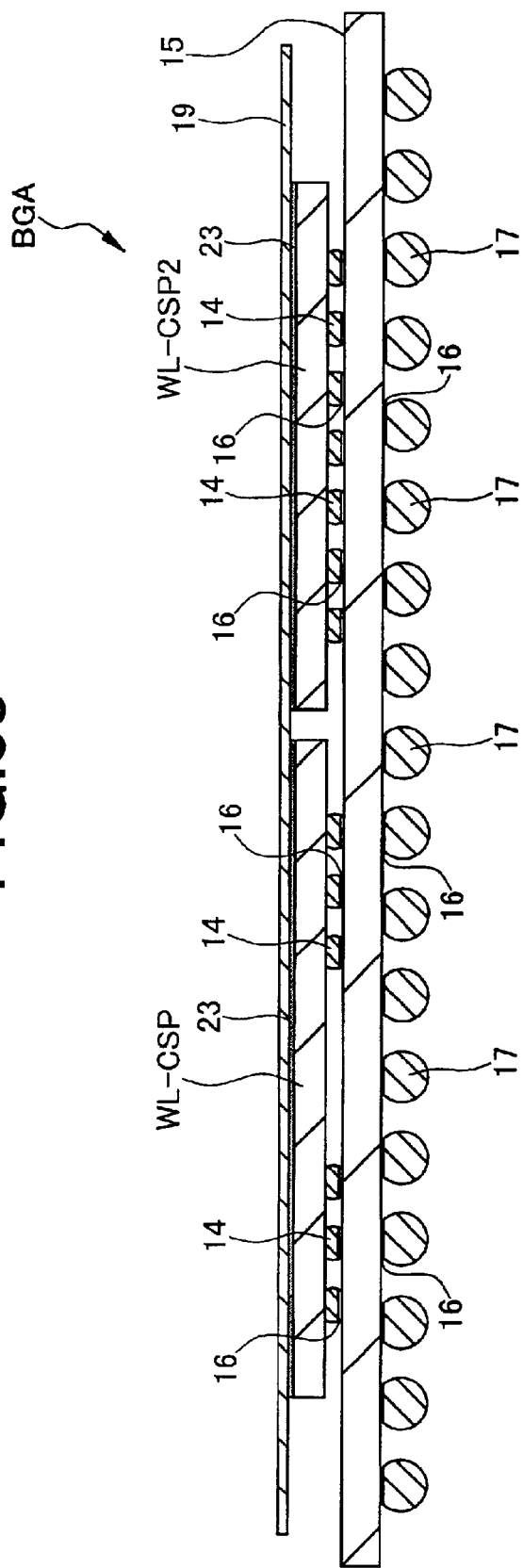
FIG. 33 is a cross-sectional view showing a BGA using a semiconductor integrated circuit device according to an embodiment of the present invention.

FIG. 33 shows a BGA (Ball Grid Array) in which the WL-CSP of the first embodiment having a DRAM formed thereon and another chip (WL-CSP2) having a microcomputer formed thereon are face-down bonded on a main surface of a package substrate 15. The two chips (WL-CSP and WL-CSP2) are mounted by the flip chip method in which a plurality of solder bumps 14 formed on the main surfaces of them are connected to the corresponding electrode pads 16 on the main surface of the package substrate 15. A protection plate 19 made of metal is attached to the rear surfaces (upper surface) of the chips (WL-CSP and WL-CSP2) by adhesive 23. The package substrate 15 is constituted of a general-purpose printed circuit board in which Cu wiring is formed on a substrate made of glass epoxy resin or BT (Bis-maleimide Triazine) resin. A plurality of solder bumps 17 constituting the external connection terminals of the BGA are connected to the electrode pads 16 on the rear surface (lower surface) of the package substrate 15. The solder bump 17 is made of a solder material having a lower melting temperature than that of the solder bump 14 connected to the main surface of the chips (WL-CSP and WL-CSP2), for example, Sn—Pb eutectic alloy (melting temperature: 183° C.).

Since the WL-CSP of the first embodiment has the elastomer layer 10 made of low elasticity resin formed between the uppermost wiring 4 and the rerouting layer 2, it is possible to effectively relax the thermal stress generated when mounting the WL-CSP on the package substrate 15 and the thermal stress generated in actual use after the mounting. Therefore, the stress applied to the connection part (solder bump 14) between the WL-CSP and the package substrate 15 is relaxed, resulting that connection lifetime of the solder bump 14 is increased.

Also, in the case of the WL-CSP having no stress relaxation layer like the elastomer layer 10, a step of filling sealing resin (underfill material) functioning to relax the stress between the WL-CSP and the package substrate 15 is required. However, the WL-CSP of the first embodiment can omit the step of filling the sealing resin. Therefore, the process to mount the WL-CSP on the package substrate 15 can be simplified and also, the WL-CSP mounted on the substrate 15 can be repaired easily.

According to the WL-CSP of the first embodiment, it is possible to arrange the rerouting layer 2 also over the fuse opening 11. Therefore, the degree of freedom in the layout of the rerouting layer 2 is enhanced.

Also, since the heat treatment at a temperature higher than 260° C. is not carried out in the process after the defect repairing, it is possible to prevent the variance of the refresh times of each memory cell. Therefore, the WL-CSP with high reliability can be realized.

In addition, since the photo-sensitive polyimide layer 5 is filled in the fuse opening 11 in the step after the defect repairing, the penetration of moisture and the like through the opening 11 into the chip 1B can be prevented. Therefore, it is possible to prevent the corrosion of wiring and thus the WL-CSP with high reliability can be realized.

(Second Embodiment)

Figure 34:
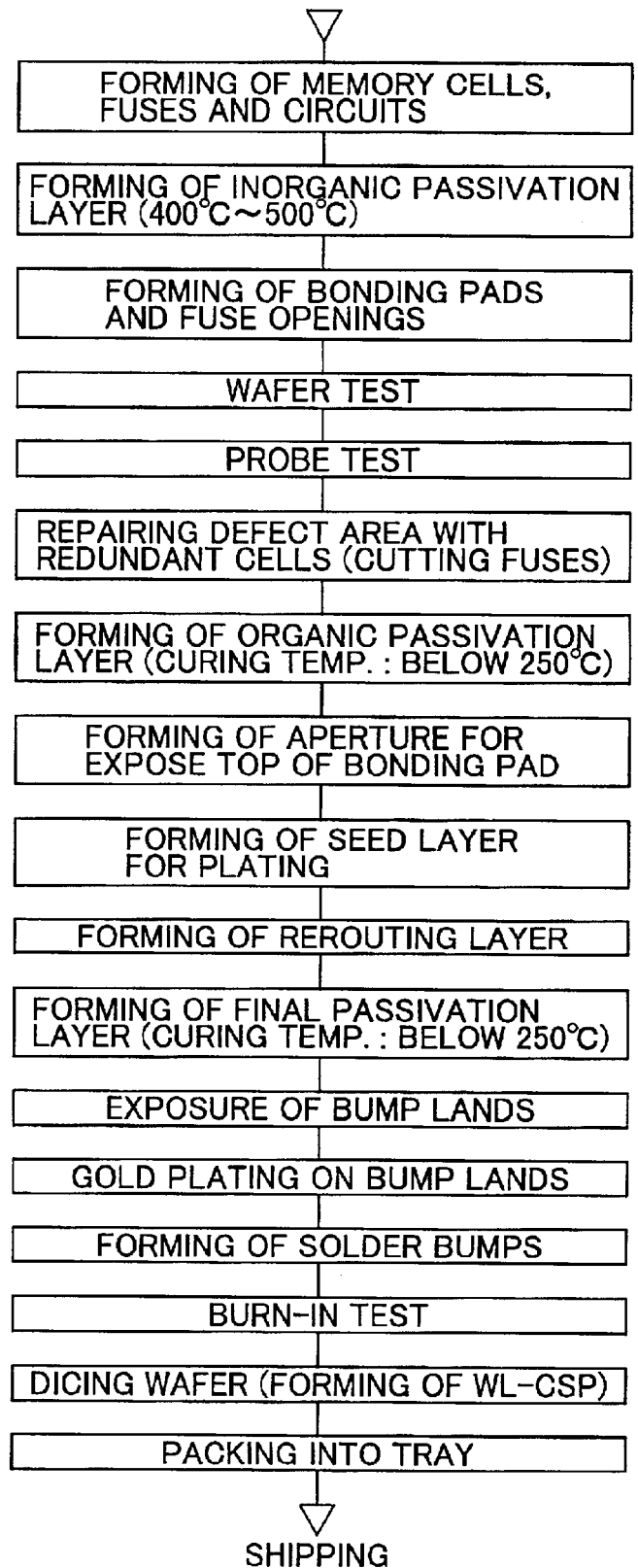
FIG. 34 is a flow chart showing the process flow of manufacturing a semiconductor integrated circuit device according to another embodiment of the present invention.

Next, the manufacturing method of the WL-CSP according to the second embodiment will be described along the process flow with using FIGS. 34 to 43. FIG. 34 is a flow chart of this manufacturing method.

Figure 35:
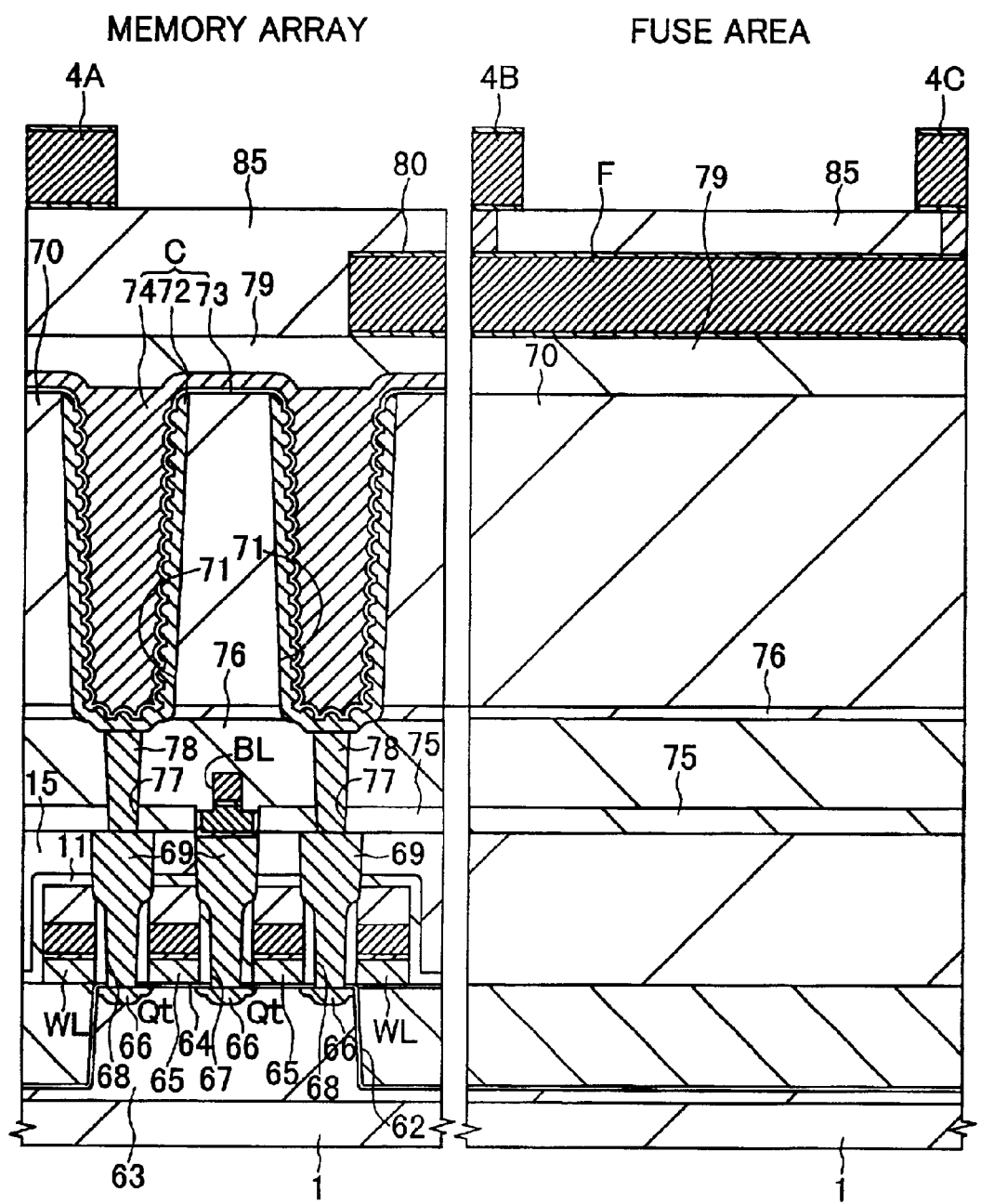
FIG. 35 is a cross-sectional view showing the principal part of a semiconductor wafer in a manufacturing method of a semiconductor integrated circuit device according to another embodiment of the present invention.

First, as shown in FIG. 35, the memory cell, the fuse F, the first aluminum wiring 80, and the uppermost wirings 4A, 4B, and 4C are formed on each chip area 1A of the wafer 1. In the above-mentioned first embodiment, the fuse F is formed of a polycrystalline silicon layer. In this second embodiment, however, the fuse F is formed of an Al alloy layer in the same step of forming the first aluminum wiring 80. Other constitution of the second embodiment is the same as that of the first embodiment.

Figure 36:
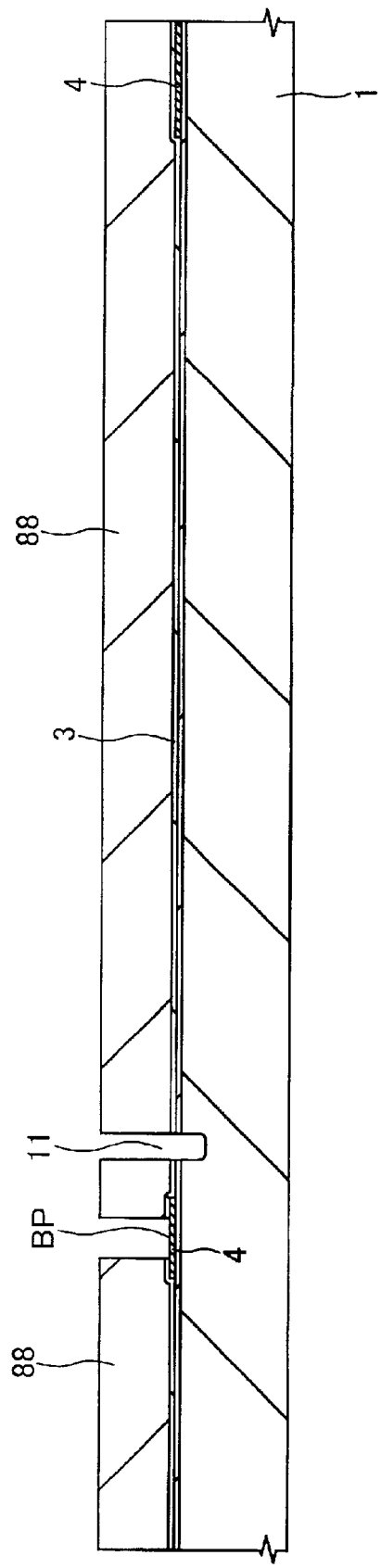
FIG. 36 is a cross-sectional view showing the principal part of a semiconductor wafer in a manufacturing method of a semiconductor integrated circuit device according to another embodiment of the present invention.
Figure 37:
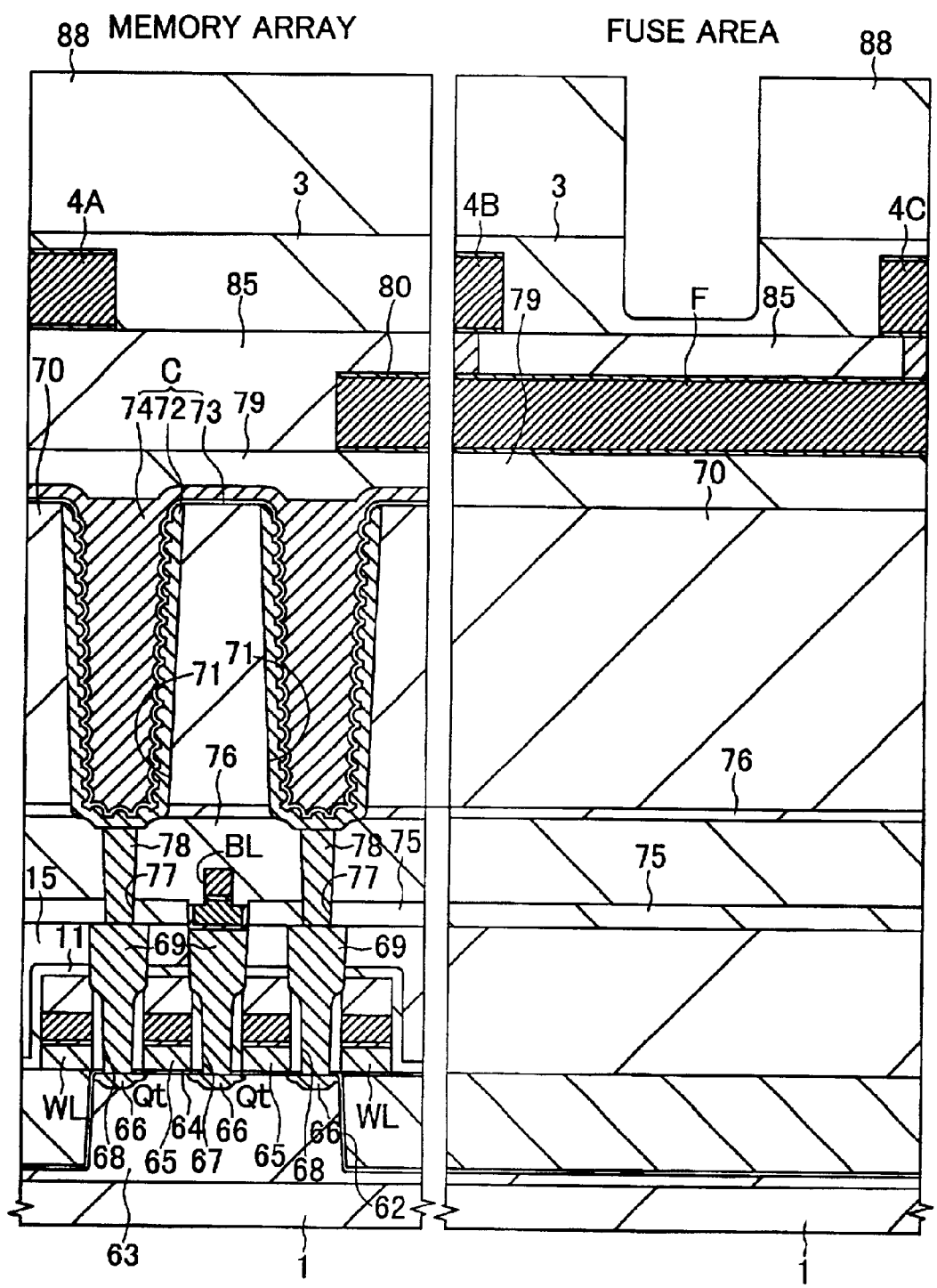
FIG. 37 is a cross-sectional view showing the principal part of a semiconductor wafer in a manufacturing method of a semiconductor integrated circuit device according to another embodiment of the present invention.

Next, as shown in FIGS. 36 and 37, after depositing the surface protection layer (inorganic passivation layer) 3 made of a silicon nitride layer on the uppermost wirings 4 (4A to 4C) by the use of the plasma CVD method, the surface protection layer 3 on the uppermost wiring 4 is dry-etched with using a photo-resist layer 88 as a mask, thereby forming the bonding pads BP. In this case, the surface protection layer 3 on the fuse F is also dry-etched to form the fuse opening 11.

Figure 38:
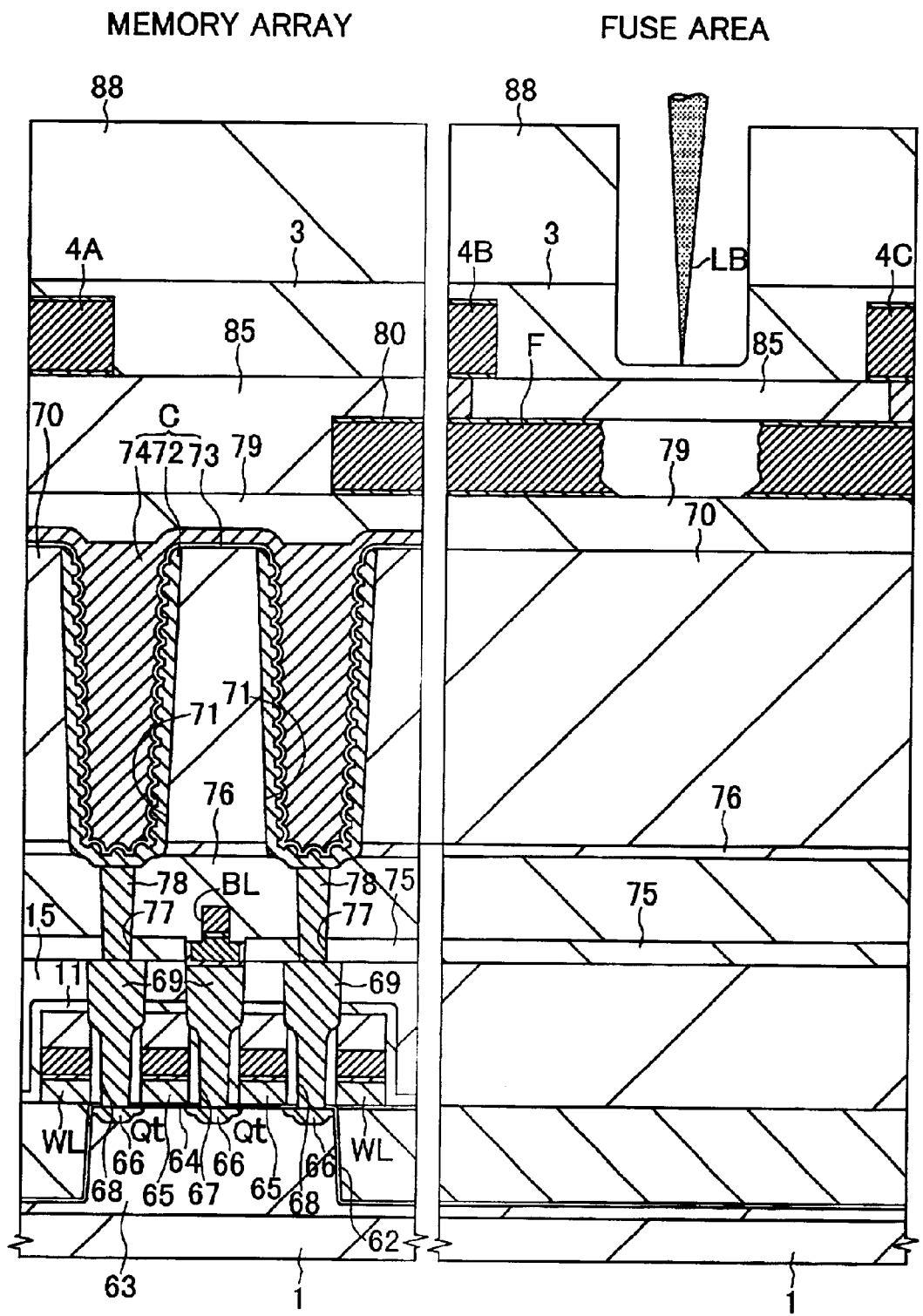
FIG. 38 is a cross-sectional view showing the principal part of a semiconductor wafer in a manufacturing method of a semiconductor integrated circuit device according to another embodiment of the present invention.

Next, after removing the photo-resist layer 88, a probe (not shown) is touched to the bonding pad BP and the test (wafer test and probe test) for checking each chip area 1A is conducted. Then, when the probe test detects the defect memory cell, the defect repairing is performed by irradiating laser beam BL to a predetermined fuse F through the fuse opening 11 to cut the fuse F by fusion as shown in FIG. 38.

Next, as shown in FIG. 39, the photo-sensitive polyimide layer 5 is formed on the surface protection layer 3 in the same manner as that of the first embodiment. Sequentially, the opening 6A is formed on the bonding pad BP. Thereafter, baking process at 250° C. for about 2 to 3 hours is performed to cure the photo-sensitive polyimide layer 5 completely. Similarly to the first embodiment, the baking process to completely cure the photo-sensitive polyimide layer 5 is performed at a temperature below 260° C. in the steps after the defect repairing so as to prevent the variance of the refresh times of each memory cell.

Figure 40:
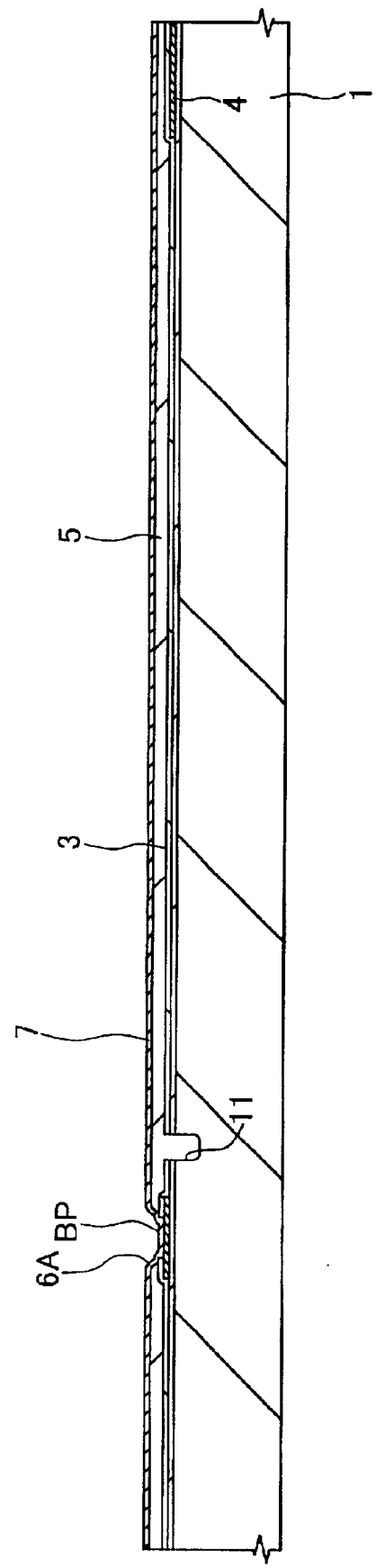
FIG. 40 is a cross-sectional view showing the principal part of a semiconductor wafer in a manufacturing method of a semiconductor integrated circuit device according to another embodiment of the present invention.
Figure 41:
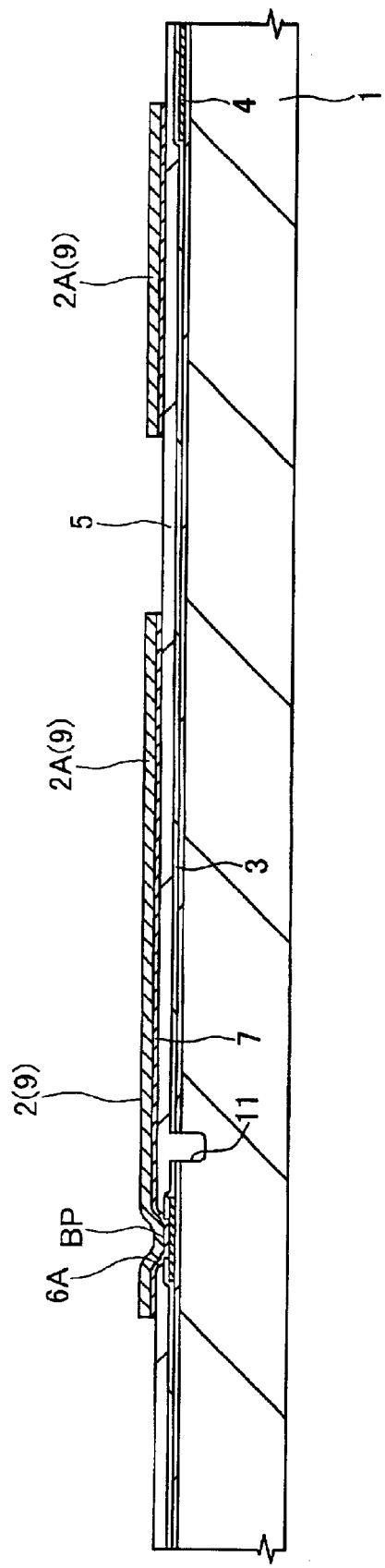
FIG. 41 is a cross-sectional view showing the principal part of a semiconductor wafer in a manufacturing method of a semiconductor integrated circuit device according to another embodiment of the present invention.

Next, as shown in FIG. 40, the plating seed layer 7 is formed on the photo-sensitive polyimide layer 5 and on the surface of the bonding pad BP exposed at a bottom of the opening 6A. Thereafter, as shown in FIG. 41, the metal layer 9 is grown on the surface of the plating seed layer 7, and subsequently, the unnecessary plating seed layer 7 is removed by the wet etching, thereby forming the rerouting layer 2 and the bump land 2A formed of the metal layer 9. The plating seed layer 7 and the metal layer 9 are formed in the same manner as that in the first embodiment.

Figure 42:
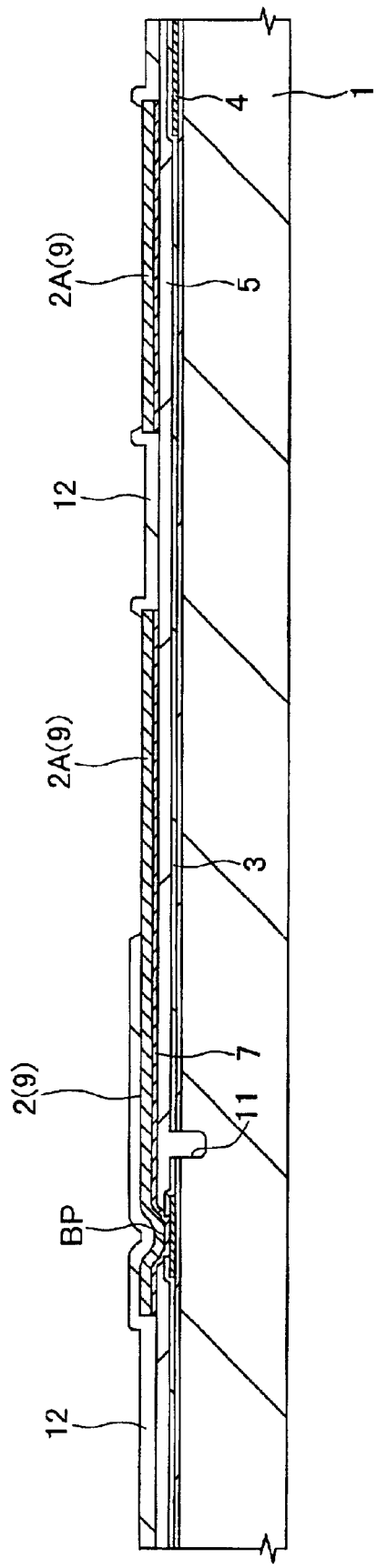
FIG. 42 is a cross-sectional view showing the principal part of a semiconductor wafer in a manufacturing method of a semiconductor integrated circuit device according to another embodiment of the present invention.

Next, as shown in FIG. 42, the uppermost protection layer 12 made of the photo-sensitive polyimide layer is deposited on the rerouting layer 2. Thereafter, the uppermost protection layer 12 covering the bump land 2A is removed, thereby exposing the surface of the bump land 2A. The removal of the uppermost protection layer 12 is performed in the same manner as that of the first embodiment. Next, the baking process at 250° C. for about 2 to 3 hours is performed to cure the uppermost protection layer 12 completely. As mentioned above, the baking process is performed at a temperature below 260° C.

Figure 43:
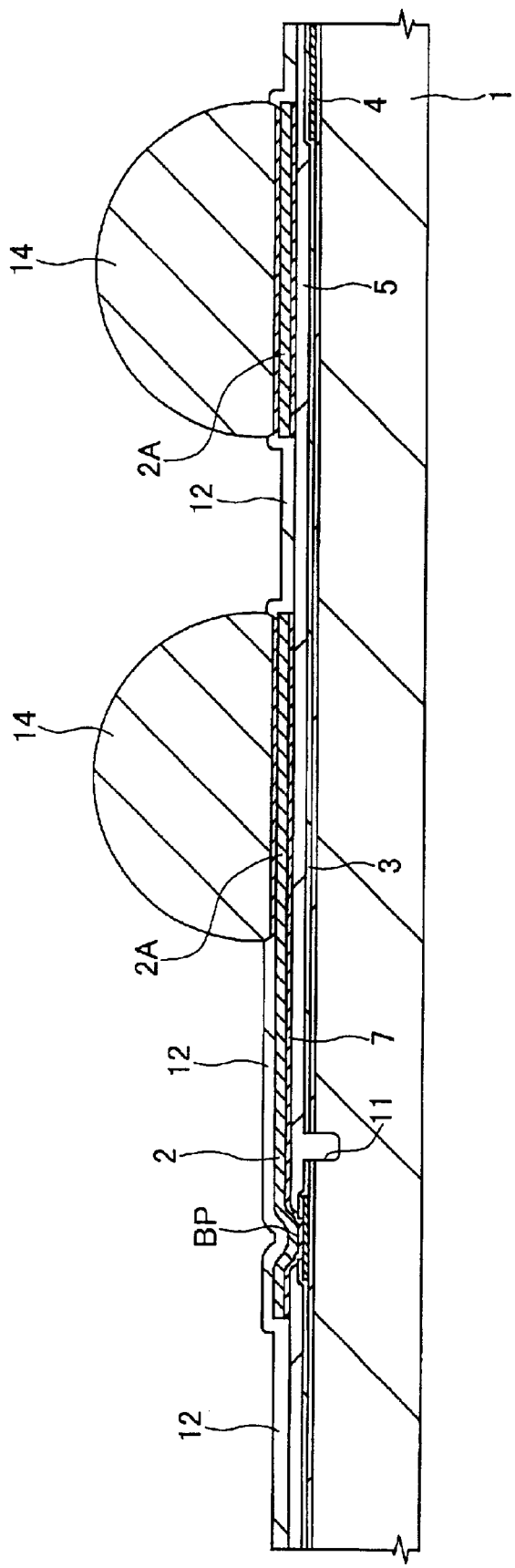
FIG. 43 is a cross-sectional view showing the principal part of a semiconductor wafer in a manufacturing method of a semiconductor integrated circuit device according to another embodiment of the present invention.

Next, as shown in FIG. 43, the gold plating layer 13 is formed on the surface of the bump land 2A. Thereafter, the solder bump 14 is connected to the bump land 2A. The gold plating layer 13 and the solder bump layer 14 are formed in the same manner as that of the first embodiment. Then, after the burn-in test of the wafer 1 as the final test of each chip area 1A, the chip area 1A is cut out from the wafer 1 into chips 1B. Thus, the WL-CSP is completed. The WL-CSP thus obtained is subjected to various final tests in terms of performance, outer appearance, and the like if necessary. Thereafter, the WL-CSP is packed into a tray and shipped.

Figure 44:
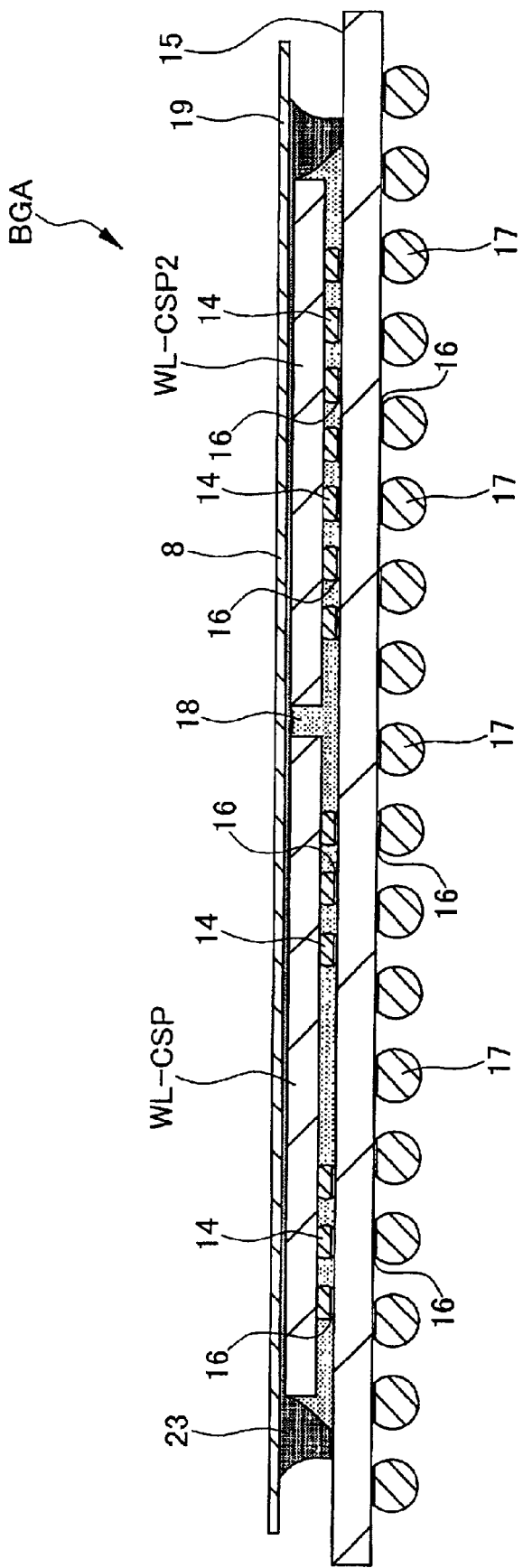
FIG. 44 is a cross-sectional view showing a BGA using a semiconductor integrated circuit device according to another embodiment of the present invention.

FIG. 44 shows a BGA in which the WL-CSP of the second embodiment having a DRAM formed thereon and another chip (WL-CSP2) having a microcomputer formed thereon are face-down bonded on the main surface of the package substrate 15. The BGA in the second embodiment differs from that in the first embodiment (refer to FIG. 33) in that the underfill material 18 is filled in the space between the chips (WL-CSP and WL-CSP2) and the package substrate 15. The underfill material 18 has a function to relax the stress applied to the solder bump 14 serving as the connection portion of the chips (WL-CSP and WL-CSP2) and the package substrate 15 based on the difference of the thermal expansion coefficients thereof. Also, the underfill material 18 has a function to prevent the penetration of moisture into the main surfaces of the chips (WL-CSP and WL-CSP2). The underfill material 18 is made of, for example, epoxy resin added with silicon filler.

According to the WL-CSP of the second embodiment, it is possible to arrange the rerouting layer 2 also over the fuse opening 11. Therefore, the degree of freedom in the layout of the rerouting layer 2 is enhanced.

Also, since the heat treatment at a temperature higher than 260° C. is not carried out in the process after the defect repairing, it is possible to prevent the variance of the refresh times of each memory cell. Therefore, the WL-CSP with high reliability can be realized.

In addition, since the photo-sensitive polyimide layer 5 is filled in the fuse opening 11 in the step after the defect repairing, the penetration of moisture and the like through the fuse opening 11 into the chip 1B can be prevented. Therefore, it is possible to prevent the corrosion of wiring and thus the WL-CSP with high reliability can be realized.

(Third Embodiment)

Figure 45:
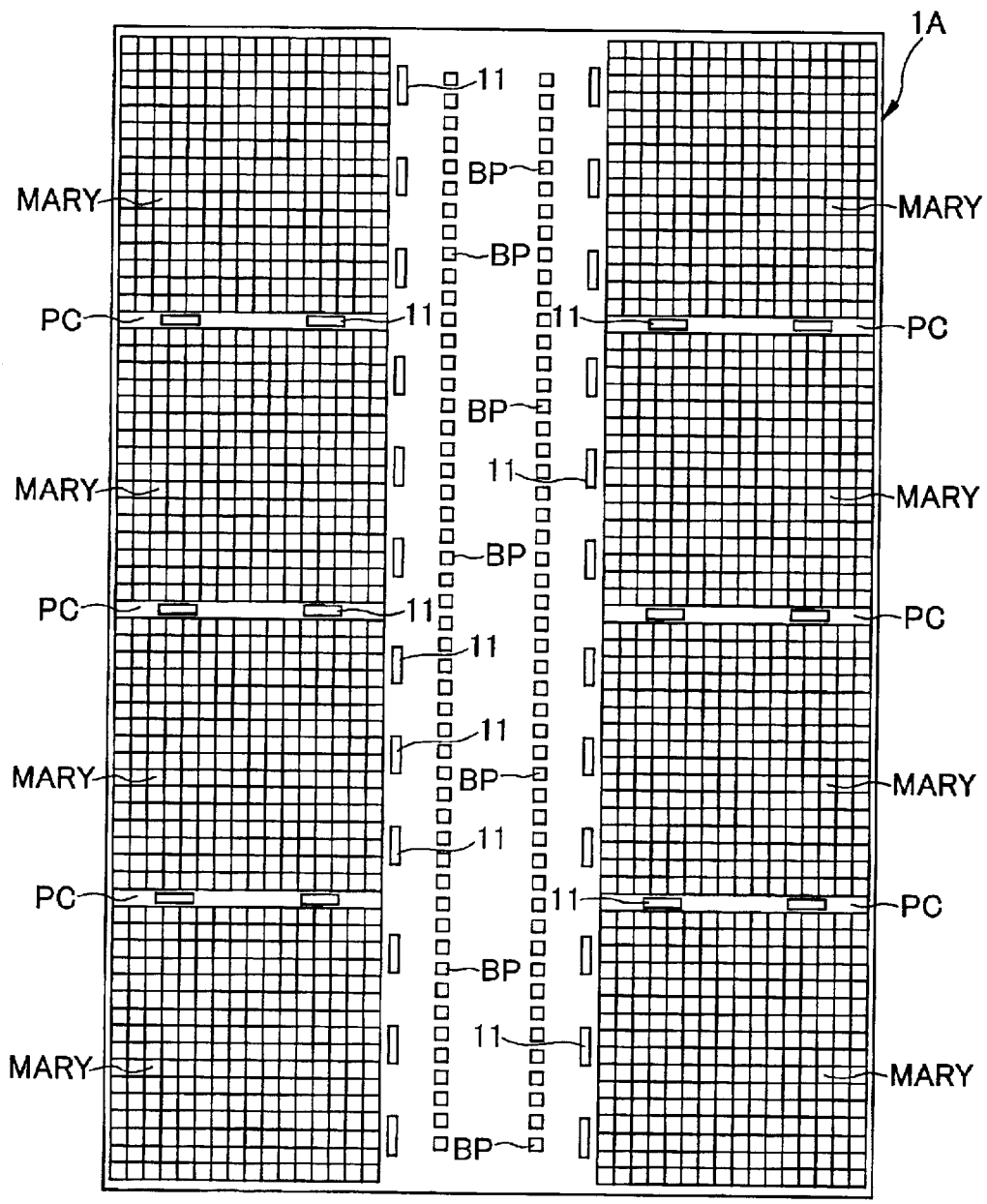
FIG. 45 is a plan view showing the principal part of a semiconductor wafer in a manufacturing method of a semiconductor integrated circuit device according to another embodiment of the present invention.
Figure 46:
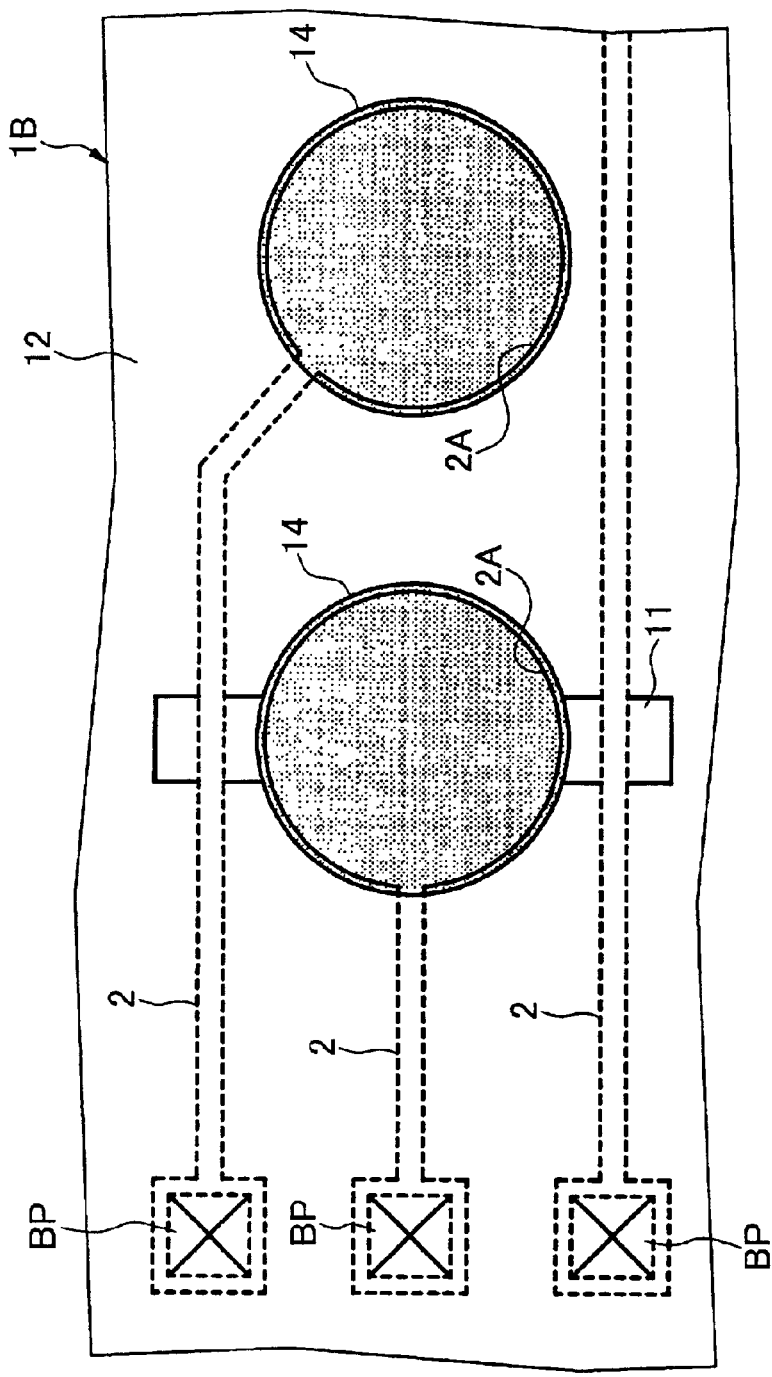
FIG. 46 is a plan view showing the principal part of a semiconductor wafer in a manufacturing method of a semiconductor integrated circuit device according to another embodiment of the present invention.
Figure 47:
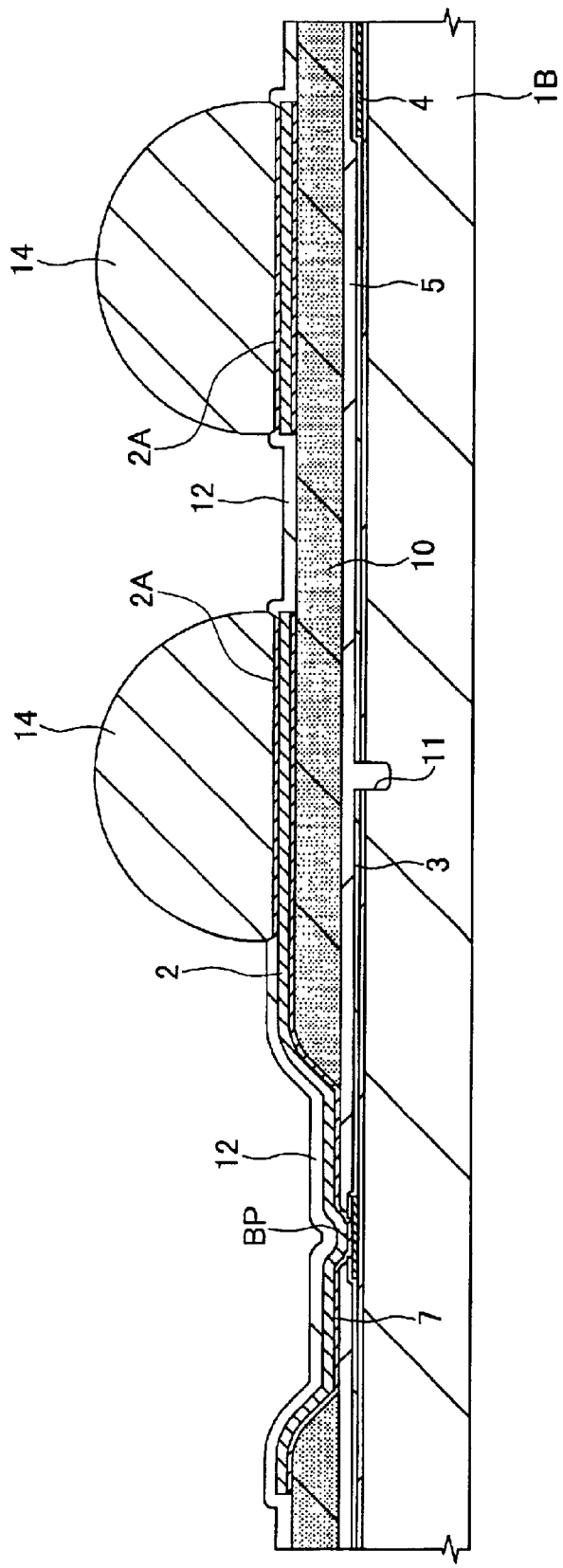
FIG. 47 is a cross-sectional view showing the principal part of a semiconductor wafer in a manufacturing method of a semiconductor integrated circuit device according to another embodiment of the present invention.

FIG. 45 shows the layout of the bonding pad BP and the fuse opening 11 formed in the WL-CSP of the third embodiment. FIG. 46 is an enlarged plan view showing the principal part of the WL-CSP (chip 1B) and FIG. 47 is a cross-sectional view of the same.

Two rows of a plurality of bonding pads BP are arranged in a central portion of the main surface of the chip 1B along the longitudinal direction thereof. Some fuse openings 11 are arranged in two rows in parallel to those of the bonding pads BP and other fuse openings 11 are arranged in the peripheral circuit portion PC between the memory arrays (MARY). Although not shown, the fuse F is arranged below the fuse opening 11 and is formed of an Al alloy layer similarly to that in the second embodiment. Also, the fuse F is formed in the same step of forming the first aluminum wiring 80.

According to the WL-CSP of the third embodiment, it is possible to arrange the rerouting layer 2 also over the fuse opening 11. Therefore, the degree of freedom in the layout of the rerouting layer 2 and the bump load 2A is enhanced.

(Fourth Embodiment)

Figure 48:
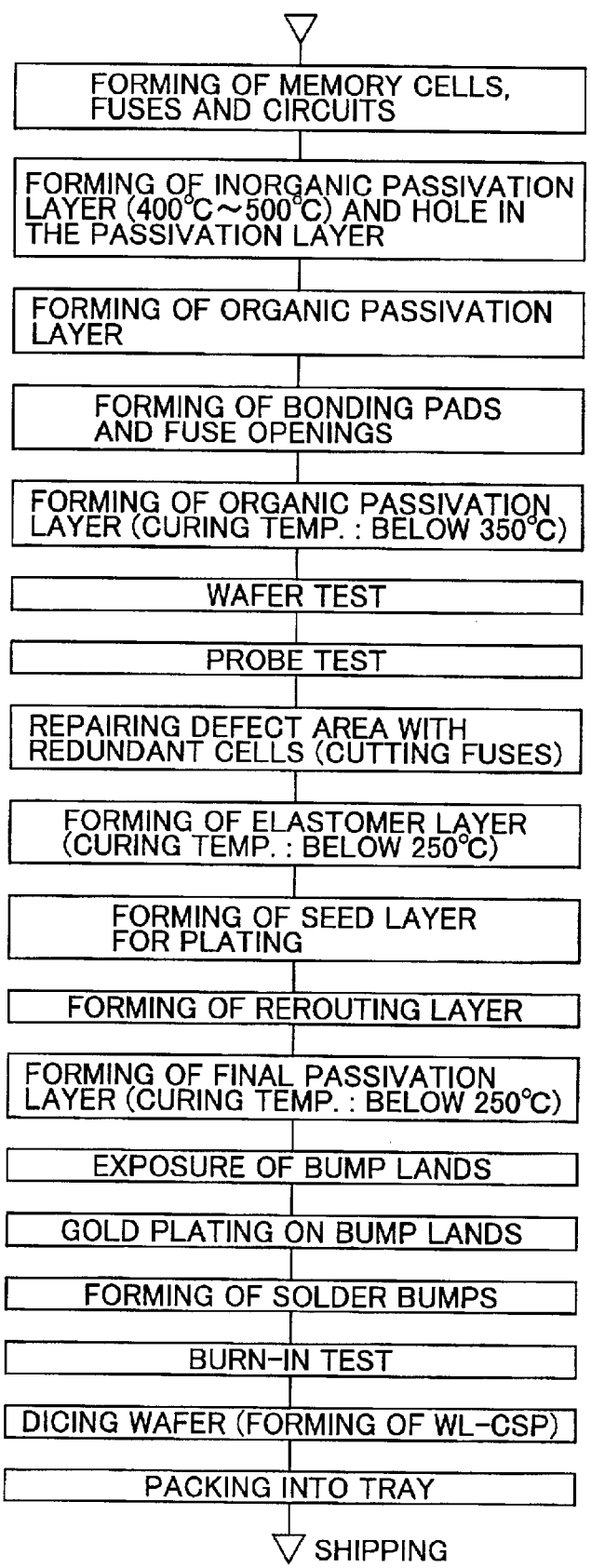
FIG. 48 is a flow chart showing the process flow of manufacturing a semiconductor integrated circuit device according to another embodiment of the present invention.

The manufacturing method of the WL-CSP according to the fourth embodiment will be described along the process flow with using FIGS. 48 to 56. FIG. 48 is a flow chart of this manufacturing method.

Figure 49:
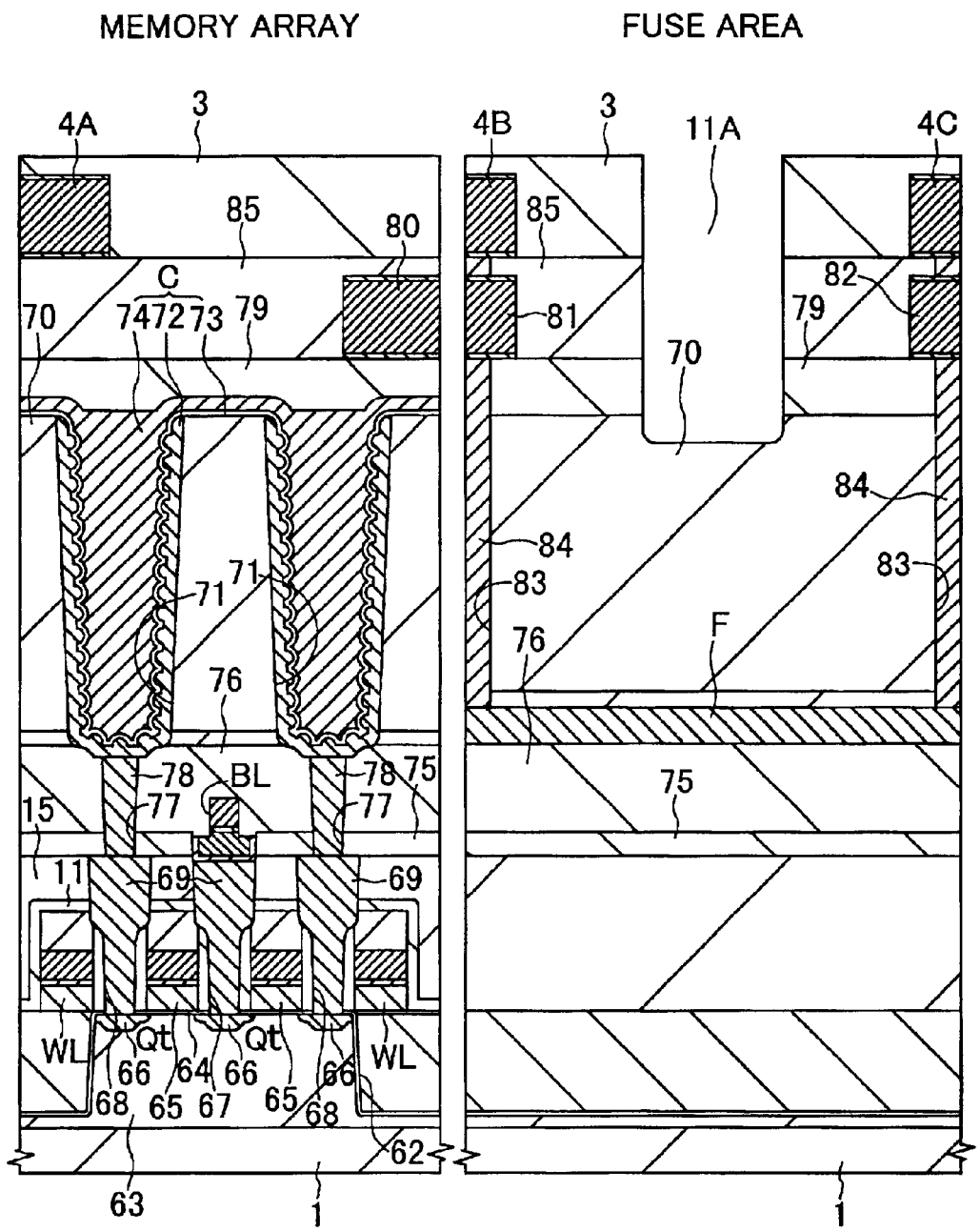
FIG. 49 is a cross-sectional view showing the principal part of a semiconductor wafer in a manufacturing method of a semiconductor integrated circuit device according to another embodiment of the present invention.

First, as shown in FIG. 49, the surface protection layer (inorganic passivation layer) 3 made of a silicon nitride layer is deposited on the uppermost wirings 4A to 4C by the use of the plasma CVD method. Thereafter, the opening 11A is formed in the surface protection layer 3 and the silicon oxide layers 85 and 79 below it.

Figure 50:
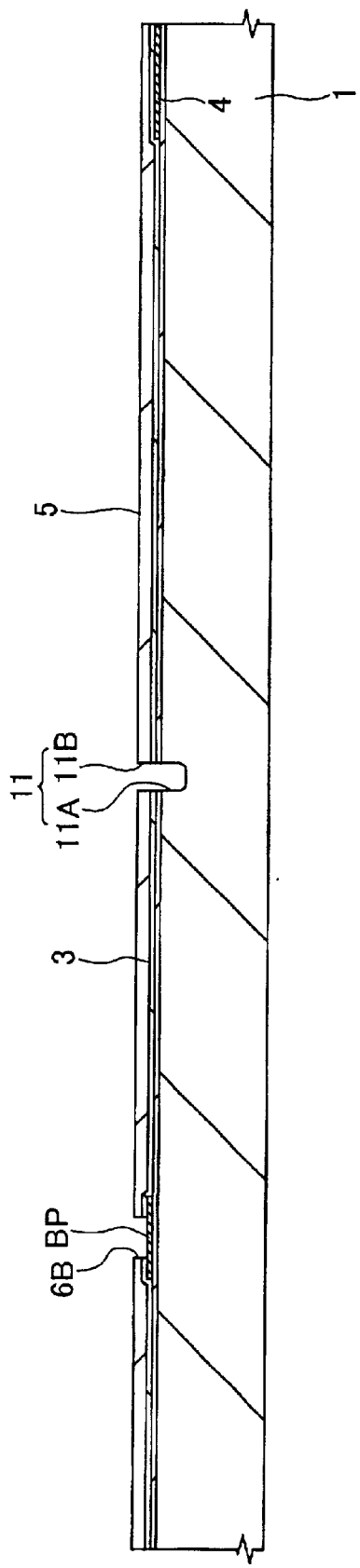
FIG. 50 is a cross-sectional view showing the principal part of a semiconductor wafer in a manufacturing method of a semiconductor integrated circuit device according to another embodiment of the present invention.
Figure 51:
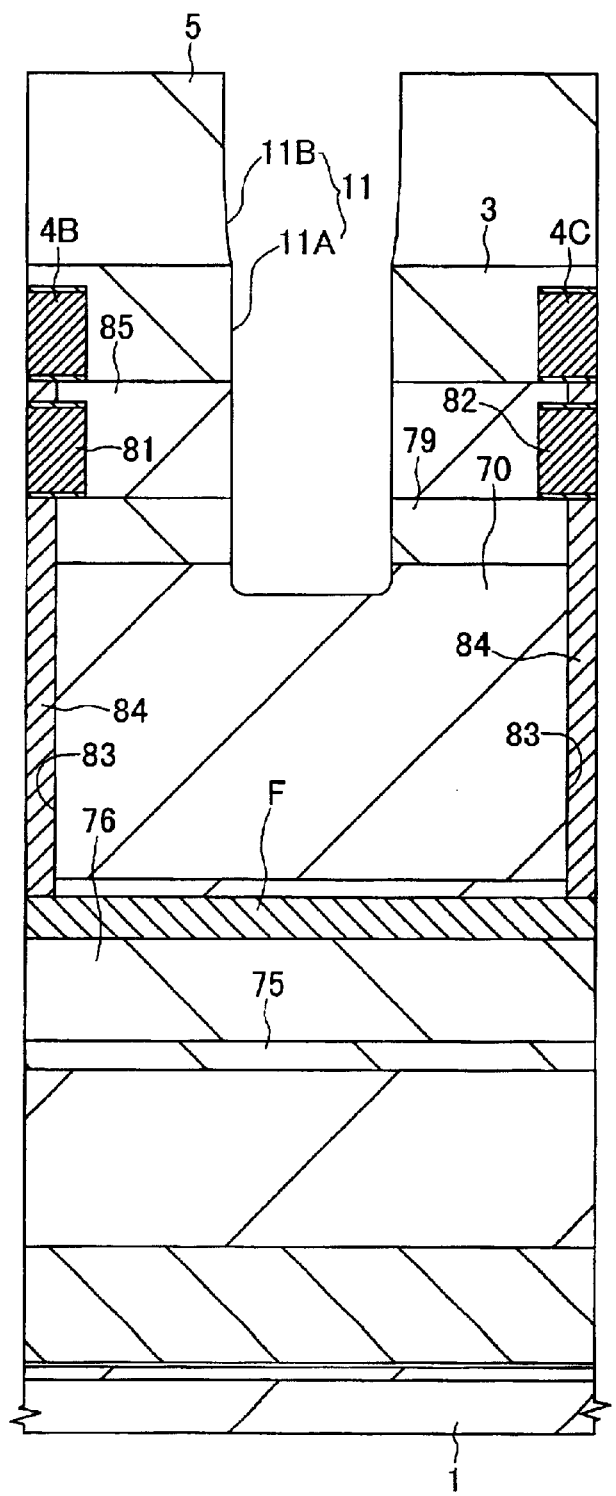
FIG. 51 is a cross-sectional view showing the principal part of a semiconductor wafer in a manufacturing method of a semiconductor integrated circuit device according to another embodiment of the present invention.

Next, as shown in FIGS. 50 and 51, the photo-sensitive polyimide layer 5 is deposited on the surface protection layer 3 by the spin coating method and the prebaking at 92° C. for about 300 seconds is performed thereto. Thereafter, the photo-sensitive polyimide layer 5 is exposed and baked (e.g., 112° C. for about 60 seconds) to semi-cure the photo-sensitive polyimide layer 5 and the unexposed (uncured) part thereof is removed by the development, thereby forming the opening 6B in the bonding pad forming area and forming the opening 11B in the fuse area. This opening 11B is formed over the already-formed opening 11A so as to be joined with it. Thus, the fuse opening 11 is formed over the fuse F.

Next, the baking process at 350° C. for about 1 hour is performed to cure the semi-cured photo-sensitive polyimide layer 5 completely. Since this baking process is performed before the defect repairing, the baking temperature thereof can be set high (350° C.). Therefore, it is possible to cure the layer completely in a short time.

Figure 52:
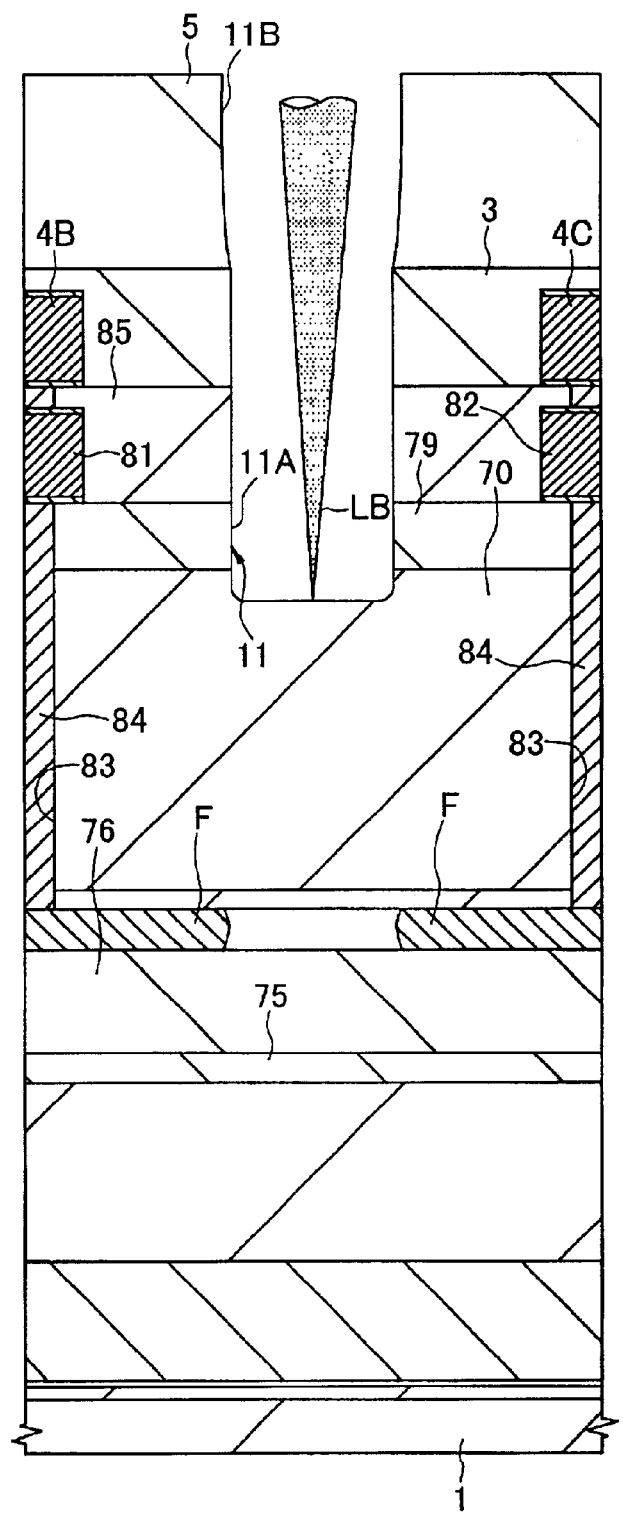
FIG. 52 is a cross-sectional view showing the principal part of a semiconductor wafer in a manufacturing method of a semiconductor integrated circuit device according to another embodiment of the present invention.

Next, a probe (not shown) is touched to the bonding pad BP and the test (wafer test and probe test) for checking each chip area 1A is conducted. Then, when the probe test detects the defect memory cell, the defect repairing is performed by irradiating laser beam BL to a predetermined fuse F through the fuse opening 11 to cut the fuse F by fusion as shown in FIG. 52.

Figure 53:
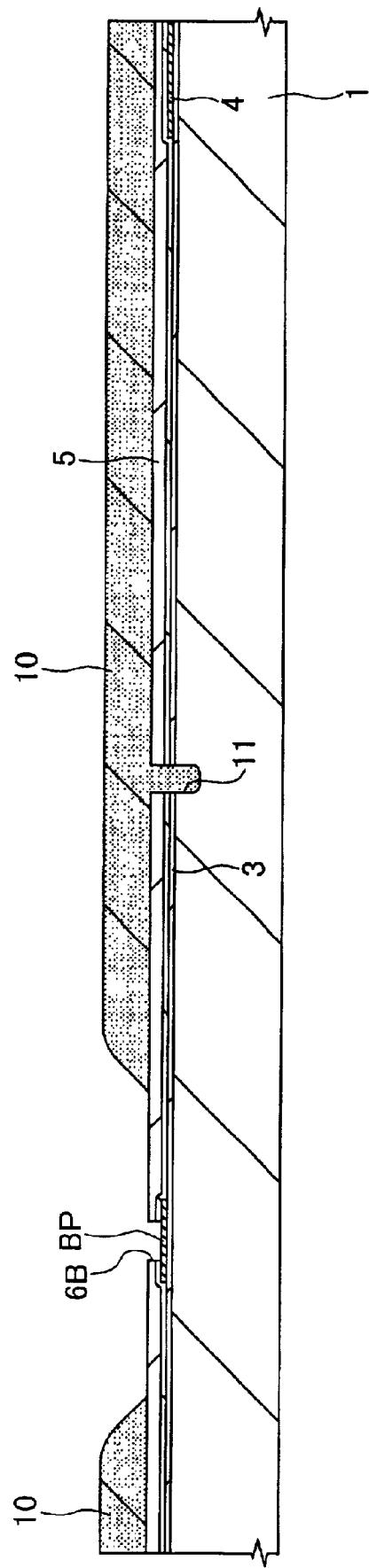
FIG. 53 is a cross-sectional view showing the principal part of a semiconductor wafer in a manufacturing method of a semiconductor integrated circuit device according to another embodiment of the present invention.

Next, as shown in FIG. 53, the elastomer layer 10 made of a low-elasticity polyamideimide resin is coated on the photo-sensitive polyimide layer 5 by the use of the printing method. Thereafter, the baking process is performed at a temperature below 260° C. to cure the layer. By forming the elastomer layer 10 on the photo-sensitive polyimide layer 5, the fuse opening 11 is filled with the elastomer layer 10.

Figure 54:
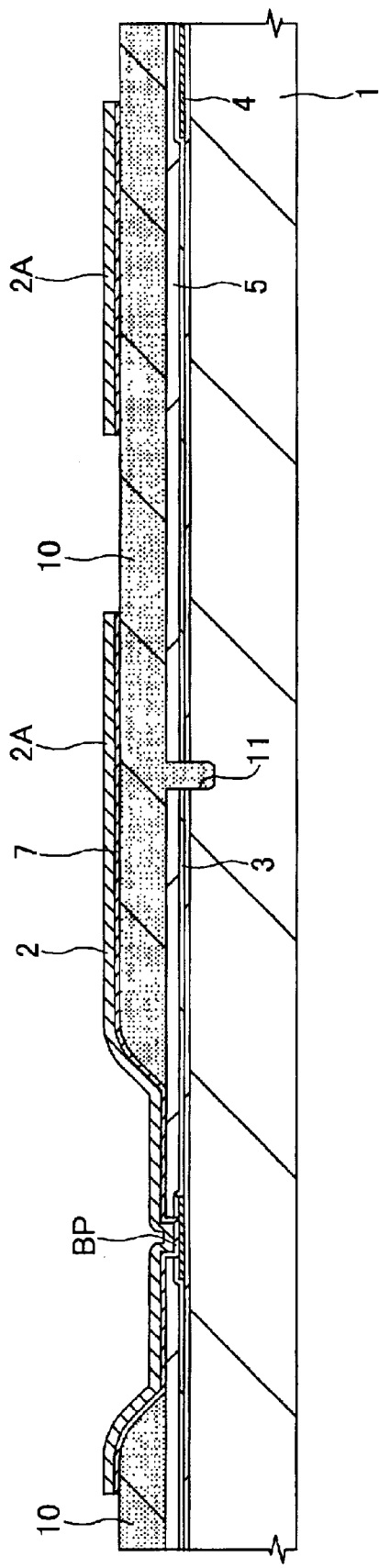
FIG. 54 is a cross-sectional view showing the principal part of a semiconductor wafer in a manufacturing method of a semiconductor integrated circuit device according to another embodiment of the present invention.

Next, as shown in FIG. 54, the plating seed layer 7, the rerouting layer 2, and the bump land 2A are formed on the elastomer layer 10 in the same manner as that of the first embodiment. It is also possible to form the rerouting layer 2 and the bump land 2A by depositing a Cu layer and an Ni layer on the elastomer layer 10 and then patterning these layers with using a photo-resist layer as a mask.

Next, as shown in FIG. 55, the uppermost protection layer 12 made of the photo-sensitive polyimide layer is deposited on the rerouting layer 2 in the same manner as that of the first embodiment. Subsequently, the uppermost protection layer 12 covering the bump land 2A is removed, thereby exposing the surface of the bump land 2A.

Next, the baking process at 250° C. for about 2 to 3 hours is performed to cure the uppermost protection layer 12 completely. As described above, the baking process for completely curing the uppermost protection layer 12 is performed at a temperature below 260° C.

Next, as shown in FIG. 56, the gold plating layer 13 is formed on the surface of the bump land 2A. Thereafter, the solder bump 14 is connected to the bump land 2A. Then, after the burn-in test of the wafer 1 as the final test of each chip area 1A, the chip area 1A is cut out from the wafer 1 into chips 1B. Thus, the WL-CSP according to the fourth embodiment is completed.

Since the photo-sensitive polyimide layer 5 in the WL-CSP of the fourth embodiment is cured completely before the defect repairing, the baking temperature can be set high (350° C.). Therefore, it is possible to cure the layer completely in a short time. Also, since the number of steps for the baking process after the defect repairing is reduced, the variance of the refresh times of each memory cell can be prevented more correctly and thus the WL-CSP having high reliability can be realized.

In the foregoing, the inventions made by the inventors thereof have been described based on the embodiments. However, it goes without saying that the present invention is not limited to the embodiments and various changes and modifications can be made therein without departing from the spirit and scope of the invention.

For example, the rerouting layer can be formed by the sputtering method or the CVD method in addition to the plating method. Also, metal other than Cu and Ni can be used as the material of the rerouting layer.

In addition, the present invention can be widely applied to the WL-CSP mounting an SRAM and flash memory other than that mounting the DRAM. For example, in the manufacturing process of the flash memory, a test (retention bake) is conducted in which data is written in a memory cell, the memory cell is left in an atmosphere higher than 200° C. for several hours, and then the data in the memory cell is read out in order to detect the disappearance of written data called retention error. Thus, in the case of the WL-CSP mounting both of the DRAM (or SRAM) and the flash memory, the retention bake of the flash memory is performed simultaneously with the baking process of the photo-sensitive polyimide layer at 250° C. in the step after the defect repairing, whereby it is possible to shorten the process.

The advantages achieved by the typical ones of the inventions disclosed in this application will be briefly described as follows.

By filling the fuse opening with the dielectric layer in the step after the defect repairing, it becomes possible to arrange the rerouting layer and the bump land also over the fuse opening. Therefore, the WL-CSP having the high degree of freedom in the layout of the rerouting layer and the bump land can be realized. Also, since the metal layer for the rerouting layer does not enter the fuse opening, the corrosion of the fuse due to etching solution can be surely prevented.

Also, since the high temperature heat treatment is not performed after the defect repairing, the variance of the refresh times of each memory cell can be prevented. Therefore, the WL-CSP having high reliability can be realized.

What is claimed is:

1. A semiconductor integrated circuit device comprising:

a plurality of memory cells formed on a main surface of a semiconductor chip;

a plurality of fuses formed on the main surface of said semiconductor chip;

a plurality of multi-layered first wirings formed in an upper layer of said plurality of memory cells;

a plurality of internal connection terminals formed of a wiring in the same layer as the uppermost wiring of said plurality of first wirings;

a passivation layer formed so as to cover said plurality of first wirings and said plurality of fuses and selectively exposing said plurality of internal connection terminals;

a plurality of second wirings formed over said passivation layer, each having one end electrically connected to said internal connection terminal;

an uppermost protection layer formed so as to cover said plurality of second wirings and selectively exposing the other ends of said plurality of second wirings; and a plurality of external connection terminals formed on the other ends of said plurality of second wirings, wherein at least a part of said plurality of second wirings are arranged over at least a part of said plurality of fuses, and wherein said passivation layer is formed of an inorganic passivation layer and an organic passivation layer formed on said inorganic passivation layer.

2. The semiconductor integrated circuit device according to claim 1,
wherein said organic passivation layer and said uppermost protection layer are thicker than said inorganic passivation layer, respectively.

3. The semiconductor integrated circuit device according to claim 1,
wherein each of said fuses is formed of a part of one of said first wirings.

4. The semiconductor integrated circuit device according to claim 1,
wherein each of said fuses is formed of a part of a conductive layer included in said memory cells.

5. The semiconductor integrated circuit device according to claim 1,
wherein said plurality of memory cells are included in a DRAM.

6. The semiconductor integrated circuit device according to claim 1,
wherein said inorganic passivation layer is formed of a laminated layer of silicon nitride layers or a silicon nitride layer and a silicon oxide layer.

7. The semiconductor integrated circuit device according to claim 6,
wherein said organic passivation layer and said uppermost protection layer are thicker than said inorganic passivation layer, respectively.

8. The semiconductor integrated circuit device according to claim 1,
wherein said organic passivation layer and said uppermost protection layer are made of a dielectric layer mainly formed of polyimide resin, respectively.

9. The semiconductor integrated circuit device according to claim 8,
wherein said polyimide resin is a photo-sensitive polyimide resin.

10. The semiconductor integrated circuit device according to claim 8,
wherein said organic passivation layer and said uppermost protection layer are thicker than said inorganic passivation layer, respectively.

11. The semiconductor integrated circuit device according to claim 1,
wherein an elastomer layer is formed on said organic passivation layer and said plurality of second wirings are formed over said elastomer layer.

12. The semiconductor integrated circuit device according to claim 11,
wherein said organic passivation layer and said uppermost protection layer are made of a dielectric layer mainly formed of polyimide resin, respectively.

13. The semiconductor integrated circuit device according to claim 12,
wherein said polyimide resin is a photo-sensitive polyimide resin.

14. The semiconductor integrated circuit device according to claim 12,
wherein said inorganic passivation layer is formed of a laminated layer of silicon nitride layers or a silicon nitride layer and a silicon oxide layer.

15. The semiconductor integrated circuit device according to claim 11,
wherein said organic passivation layer and said uppermost protection layer are thicker than said inorganic passivation layer, respectively.

16. The semiconductor integrated circuit device according to claim 15,
wherein each of said fuses is formed of a part of a conductive layer included in said memory cells.

17. The semiconductor integrated circuit device according to claim 15,
wherein each of said fuses is formed of a part of one of said first wirings.

18. A semiconductor integrated circuit device comprising:
a plurality of memory cells formed on a main surface of a semiconductor chip;
a plurality of fuses formed on the main surface of said semiconductor chip;
a plurality of multi-layered first wirings formed in an upper layer of said plurality of memory cells;
a plurality of internal connection terminals formed of a wiring in the same layer as the uppermost wiring of said plurality of first wirings;
a passivation layer formed so as to cover said plurality of first wirings and said plurality of fuses and selectively exposing said plurality of internal connection terminals;
a plurality of second wirings formed over said passivation layer, each having one end electrically connected to said internal connection terminal;
an uppermost protection layer formed so as to cover said plurality of second wirings and selectively exposing the other ends of said plurality of second wirings; and
a plurality of external connection terminals formed on the other ends of said plurality of second wirings,
wherein at least a part of said plurality of second wirings are arranged over at least a part of said plurality of fuses, and
wherein said first wirings are formed of a conductive layer mainly composed of aluminum or copper and said second wirings are formed of a conductive layer mainly composed of copper, respectively.

19. A semiconductor integrated circuit device comprising:
a plurality of memory cells formed on a main surface of a semiconductor chip;
a plurality of fuses formed on the main surface of said semiconductor chip;
a plurality of multi-layered first wirings formed in an upper layer of said plurality of memory cells;
a plurality of internal connection terminals formed of a wiring in the same layer as the uppermost wiring of said plurality of first wirings;
a passivation layer formed so as to cover said plurality of first wirings and said plurality of fuses and selectively exposing said plurality of internal connection terminals;
a plurality of second wirings formed over said passivation layer, each having one end electrically connected to said internal connection terminal;
an uppermost protection layer formed so as to cover said plurality of second wirings and selectively exposing the other ends of said plurality of second wirings; and
a plurality of external connection terminals formed on the other ends of said plurality of second wirings,
wherein at least a part of said plurality of second wirings are arranged over at least a part of said plurality of fuses, and
wherein each of said external connection terminals is formed of a bump electrode.

* * * * *